United States Patent
Yamaguchi

(10) Patent No.: US 8,617,785 B2
(45) Date of Patent: Dec. 31, 2013

(54) ACTINIC RAY-SENSITIVE OR RADIATION-SENSITIVE RESIN COMPOSITION AND PATTERN FORMING METHOD USING THE SAME

(75) Inventor: Shuhei Yamaguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 124 days.

(21) Appl. No.: 12/688,183

(22) Filed: Jan. 15, 2010

(65) Prior Publication Data

US 2010/0183980 A1    Jul. 22, 2010

(30) Foreign Application Priority Data

Jan. 16, 2009 (JP) .................... 2009-008261

(51) Int. Cl.
- *G03F 7/004* (2006.01)
- *G03F 7/028* (2006.01)
- *G03F 7/039* (2006.01)
- *G03F 7/26* (2006.01)

(52) U.S. Cl.
USPC ......... 430/270.1; 430/326; 430/910; 430/921

(58) Field of Classification Search
USPC .............. 430/270.1, 326, 919, 920, 921, 922, 430/925
See application file for complete search history.

(56) References Cited

U.S. PATENT DOCUMENTS

| | | | |
|---|---|---|---|
| 6,753,124 B2 * | 6/2004 | Nishimura et al. | 430/270.1 |
| 2002/0009667 A1 | 1/2002 | Nishimura et al. | |
| 2004/0161710 A1 * | 8/2004 | Endo et al. | 430/322 |
| 2005/0014090 A1 | 1/2005 | Hirayama et al. | |
| 2007/0105045 A1 | 5/2007 | Iwato et al. | |
| 2007/0178394 A1 | 8/2007 | Hirayama et al. | |
| 2007/0190436 A1 * | 8/2007 | Hirayama et al. | 430/30 |
| 2007/0218401 A1 * | 9/2007 | Ando et al. | 430/270.1 |
| 2008/0227024 A1 * | 9/2008 | Sato et al. | 430/270.1 |
| 2008/0248421 A1 | 10/2008 | Fukuhara et al. | |
| 2008/0268370 A1 * | 10/2008 | Tanaka et al. | 430/270.1 |
| 2008/0292989 A1 * | 11/2008 | Nishikawa | 430/287.1 |
| 2009/0130605 A1 | 5/2009 | Hirayama et al. | |
| 2009/0246695 A1 * | 10/2009 | Yamaguchi et al. | 430/286.1 |
| 2009/0305161 A1 * | 12/2009 | Nakamura et al. | 430/270.1 |
| 2009/0325102 A1 * | 12/2009 | Shibuya et al. | 430/270.1 |
| 2009/0325103 A1 * | 12/2009 | Sato et al. | 430/270.1 |

FOREIGN PATENT DOCUMENTS

| | | |
|---|---|---|
| JP | 2001-188346 A | 7/2001 |
| JP | 2002-62657 A | 2/2002 |
| JP | 2005-326609 A | 11/2005 |
| JP | 2007-057604 A | 3/2007 |
| JP | 2007-155925 A | 6/2007 |
| JP | 2007-156450 A | 6/2007 |
| JP | 2007-298569 A | 11/2007 |
| JP | 2008-268932 A | 11/2008 |
| JP | 2010-126581 A | 6/2010 |
| JP | 2010-126696 A | 6/2010 |
| WO | 2004-068242 A1 | 8/2004 |
| WO | WO 2007/058345 | * 5/2007 |

OTHER PUBLICATIONS

Office Action dated Nov. 12, 2013 in Japanese Application No. 2010-07527.

* cited by examiner

*Primary Examiner* — Anca Eoff

(74) *Attorney, Agent, or Firm* — Sughrue Mion, PLLC

(57) ABSTRACT

An actinic ray-sensitive or radiation-sensitive resin composition includes: (A) a compound capable of generating an acid upon irradiation with an actinic ray or radiation; (B) a resin capable of increasing a dissolution rate of the resin (B) in an alkali developer by an action of an acid, the resin (B) containing a specific repeating unit having a lactone structure; and (D) a low molecular compound having a group capable of leaving by an action of an acid, and a pattern forming method uses the composition.

20 Claims, No Drawings

ACTINIC RAY-SENSITIVE OR RADIATION-SENSITIVE RESIN COMPOSITION AND PATTERN FORMING METHOD USING THE SAME

BACKGROUND OF THE INVENTION

1. Field of the Invention

The present invention relates to an actinic ray-sensitive or radiation-sensitive resin composition and a pattern forming method using the same, in particular, an actinic ray-sensitive or radiation-sensitive resin composition for use in the process of producing a semiconductor such as IC, in the production of a circuit board for liquid crystal, thermal head and the like or in other photo-fabrication processes, and a pattern forming method using the same. More specifically, the present invention relates to a positive chemical-amplification resist composition suitable for exposure using a light source that emits a far ultraviolet ray at a wavelength of 250 nm or less, preferably 220 nm or less, or an electron beam, and a pattern forming method using the same.

2. Description of the Related Art

As for the photosensitive composition such as chemical amplification resist composition used in the photolithography process of a semiconductor or the like, particularly, in the case of using an ArF excimer laser (wavelength: 193 nm) as a light source, a resin having an alicyclic hydrocarbon group is used from the standpoint of transparency and dry etching resistance.

The photosensitive composition containing a resin having an alicyclic hydrocarbon group requires a stronger acid, and a compound capable of generating a perfluoroalkylsulfonic acid, such as triphenylsulfonium trifluoromethanesulfonate, is used.

The perfluoroalkylsulfonic acid is, however, highly hydrophobic, and a photosensitive composition using an acid generator capable of generating this acid is reduced in the affinity for an aqueous developer, which gives rise to a problem such as reduction of sensitivity due to worsened developability or generation of development defect.

To solve this problem, JP-A-2007-155925 (the term "JP-A" as used herein means an "unexamined published Japanese patent application") describes a photosensitive composition using a compound capable of generating a specific acid containing a fluorine atom.

However, with further refinement of a pattern, more improvements of various performances particularly in terms of exposure latitude and line edge roughness are demanded.

Also, it is pointed out that when the chemical amplification resist is applied to immersion exposure, the resist layer comes into contact with the immersion liquid at the exposure, as a result, the resist layer deteriorates or a component adversely affecting the immersion liquid bleeds out from the resist layer. International Publication No. 04/068242, pamphlet describes a case where when a resist for ArF exposure is dipped in water before and after exposure, the resist performance is changed, and this is indicated as a problem in the immersion exposure.

JP-A-2007-298569 describes a case using an amine derivative having a specific structure in the immersion exposure, and Patent JP-A-2001-188346 discloses a radiation-sensitive resin composition excellent in the basic properties as a resist and containing a resin having a specific lactone structure so as to suppress a development defect at the microfabrication.

SUMMARY OF THE INVENTION

An object of the present invention is to solve the technical task of enhancing the performance inherent in the microphotofabrication using far ultraviolet light, EUV, electron beam or the like, particularly ArF excimer laser light, and provide an excellent actinic ray-sensitive or radiation-sensitive resin composition ensuring wide exposure latitude and suppressed line edge roughness in patterning by normal exposure or even by immersion exposure, and a pattern forming method using the composition.

The present inventors have found that the above-described object can be attained by an actinic ray-sensitive or radiation-sensitive resin composition comprising a low molecular compound having a group capable of leaving by the action of an acid and an acid-decomposable resin containing a repeating unit having a lactone structure through a specific linkage group. The present invention described below has been accomplished based on this finding.

(1) An actinic ray-sensitive or radiation-sensitive resin composition, comprising:

(A) a compound capable of generating an acid upon irradiation with an actinic ray or radiation;

(B) a resin capable of increasing a dissolution rate of the resin (B) in an alkali developer by an action of an acid, the resin (B) containing a repeating unit represented by formula (3); and (D) a low molecular compound having a group capable of leaving by an action of an acid:

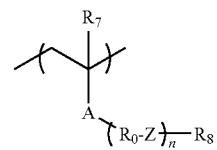

(3)

wherein A represents an ester bond or a group represented by —CONH—;

each $R_0$ independently represents an alkylene group, a cycloalkylene group or a combination thereof, and when a plurality of $R_0$'s are present, the plurality of $R_0$'s are the same or different;

each Z independently represents a single bond, an ether bond, an ester bond, an amide bond, a urethane bond or a urea bond, and when a plurality of Z's are present, the plurality of Z's are the same or different;

$R_8$ represents a monovalent organic group having a lactone structure;

n is a repetition number of the structure represented by —$R_0$—Z— in the repeating unit represented by formula (3) and represents an integer of 1 to 5; and $R_7$ represents a hydrogen atom, a halogen atom or an alkyl group.

(2) The actinic ray-sensitive or radiation-sensitive resin composition as described in (1) above, wherein (D) the low molecular compound having a group capable of decomposing by the action of an acid is an amine derivative having a group capable of leaving by an action of an acid on the nitrogen atom.

(3) The actinic ray-sensitive or radiation-sensitive resin composition as described in (1) or (2) above, wherein (D) the low molecular compound having a group capable of leaving by an action of an acid is a structure represented by formula (A):

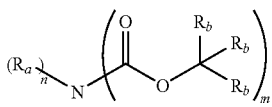

(A)

wherein each Ra independently represents a hydrogen atom, an alkyl group, a cycloalkyl group, an aryl group or an aralkyl group, and when n=2, two Ra's are the same or different and two Ra's may combine with each other to form a divalent heterocyclic hydrocarbon group or a derivative thereof;

each Rb independently represents a hydrogen atom, an alkyl group, a cycloalkyl group, an aryl group or an aralkyl group, provided that in —C(Rb)(Rb)(Rb), when one or more Rb is a hydrogen atom, at least one of the remaining Rb's is a cyclopropyl group or a 1-alkoxyalkyl group;

a plurality of Rb's may combine with each other to foam an alicyclic hydrocarbon group, an aromatic hydrocarbon group, a heterocyclic hydrocarbon group or a derivative thereof;

n represents an integer of 0 to 2;

m represents an integer of 1 to 3; and n+m=3.

(4) The actinic ray-sensitive or radiation-sensitive resin composition as described in any of (1) to (3) above, which further comprises:

(C) a hydrophobic resin.

(5) The actinic ray-sensitive or radiation-sensitive resin composition as described in (4) above, wherein an amount of the hydrophobic resin (C) is from 0.1 to 10 mass % based on the entire solid content of the actinic ray-sensitive or radiation-sensitive resin composition.

(6) The actinic ray-sensitive or radiation-sensitive resin composition as described in any of (1) to (5) above, wherein (A) the compound capable of generating an acid upon irradiation with an actinic ray or radiation is a compound capable of generating an acid represented by formula (I-A), (I-B), (I-C) or (I-D):

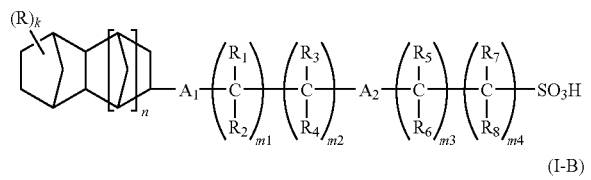

(I-A)

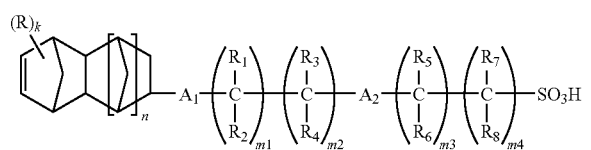

(I-B)

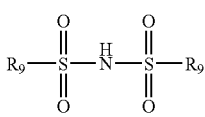

(I-C)

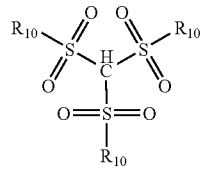

(I-D)

wherein in formulae (I-A) and (I-B), each of $R_1$ to $R_8$ independently represents a hydrogen atom, an alkyl group, a cycloalkyl group, a halogen atom or a hydroxyl group; each of $A_1$ and $A_2$ represents a divalent linking group or a single bond; R represents a substituent; k represents an integer of 0 to 5; n represents an integer of 0 to 5; each of m1 to m4 independently represents an integer of 0 to 12; and when a plurality of R's are present, two or more R's may combine with each other to form a ring;

in formula (I-C), each $R_9$ independently represents an at least partially fluorinated alkyl group or cycloalkyl group, or two $R_9$'s may combine with each other to form a fluorinated alkylene group; and in formula (I-D), each $R_{10}$ independently represents an at least partially fluorinated alkyl group or cycloalkyl group, or at least two $R_{10}$'s may combine with each other to form a fluorinated alkylene group.

(7) The actinic ray-sensitive or radiation-sensitive resin composition as described in any of (1) to (6) above, wherein the repeating unit represented by formula (3) is a repeating unit represented by formula (3-1):

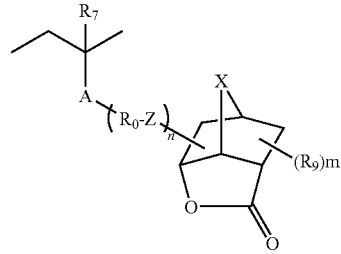

(3-1)

wherein $R_7$, A, $R_0$, Z and n have the same meanings as in formula (3);

$R_9$ represents an alkyl group, a cycloalkyl group, an alkoxycarbonyl group, a cyano group, a hydroxyl group or an alkoxy group, and when a plurality of $R_9$'s are present, the plurality of $R_9$'s are the same or different, and two members thereof may combine with each other to faun a ring;

X represents an alkylene group, an oxygen atom or a sulfur atom; and m represents an integer of 0 to 5.

(8) A pattern forming method, comprising:

forming a film by using the actinic ray-sensitive or radiation-sensitive resin composition as described in any of (1) to (7) above; and exposing and developing the film.

(9) The pattern forming method as described in (8) above, wherein the exposure is an immersion exposure through an immersion liquid.

(10) The pattern forming method as described in (9) above, wherein the film is immersion-exposed through pure water as the immersion liquid.

DETAILED DESCRIPTION OF THE INVENTION

The best mode for carrying out the present invention is described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of a mercury lamp, a far ultraviolet ray typified by an excimer laser, an extreme-ultraviolet ray (EUV light), an X-ray or an electron beam. Also, in the present invention, the "light" means an actinic ray or radiation.

Furthermore, in the present invention, unless otherwise indicated, the "exposure" includes not only exposure with a mercury lamp, a far ultraviolet ray typified by an excimer laser, an X-ray, EUV light or the like but also lithography with a particle beam such as electron beam and ion beam.

The actinic ray-sensitive or radiation-sensitive resin composition of the present invention comprises (A) a compound capable of generating an acid upon irradiation with an actinic ray or radiation, (B) a resin capable of increasing the dissolution rate in an alkali developer by the action of an acid, the resin containing a repeating unit represented by formula (3), and (D) a low molecular compound having a group capable of leaving by the action of an acid.

[1] Resin Capable of Increasing the Dissolution Rate in an Alkali Developer by the Action of an Acid (B)

The composition of the present invention contains (B) a resin capable of increasing the solubility in an alkali developer by the action of an acid, the resin containing a repeating unit represented by formula (3).

The resin (B) is a resin capable of increasing the solubility in an alkali developer by the action of an acid ("acid-decomposable resin") and has a group capable of decomposing by the action of an acid to produce an alkali-soluble group (hereinafter sometimes referred to as an "acid-decomposable group"), on either one or both of the main chain and the side chain of the resin.

The resin (B) is preferably insoluble or sparingly soluble in an alkali developer.

The acid-decomposable group preferably has a structure where an alkali-soluble group is protected by a group capable of decomposing and leaving by the action of an acid.

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred examples of the alkali-soluble group include a carboxyl group, a fluorinated alcohol group (preferably hexafluoroisopropanol) and a sulfonic acid group.

The group preferred as the acid-decomposable group is a group where a hydrogen atom of the alkali-soluble group above is substituted by a group capable of leaving by the action of an acid.

Examples of the group capable of leaving by the action of an acid include $-C(R_{36})(R_{37})(R_{38})$, $-C(R_{36})(R_{37})(OR_{39})$ and $-C(R_{01})(R_{02})(OR_{39})$ In the formulae, each of $R_{36}$ to $R_{39}$ independently represents an alkyl group, a cycloalkyl group, an aryl group, an aralkyl group or an alkenyl group, and $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The acid-decomposable group-containing repeating unit that can be contained in the resin (B) is preferably a repeating unit represented by the following formula (AI):

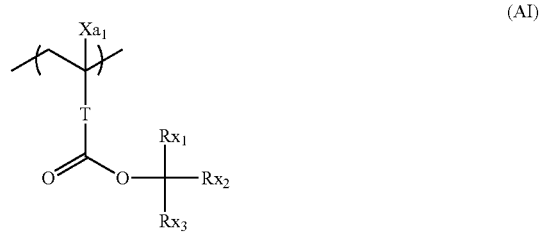

(AI)

In formula (AI), $Xa_1$ represents a hydrogen atom, a methyl group or a group represented by $-CH_2-R_9$. $R_9$ represents a monovalent organic group, and examples thereof include an alkyl group having a carbon number of 5 or less and an acyl group. Among these, an alkyl group having a carbon number of 3 or less is preferred, and a methyl group is more preferred. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

At least two members out of $Rx_1$ to $Rx_3$ may combine to form a cycloalkyl group (monocyclic or polycyclic).

Examples of the divalent linking group of T include an alkylene group, a $-COO-Rt-$ group and a $-O-Rt-$ group, wherein Rt represents an alkylene group or a cycloalkylene group.

T is preferably a single bond or a $-COO-Rt-$ group. Rt is preferably an alkylene group having a carbon number of 1 to 5, more preferably a $-CH_2-$ group or a $-(CH_2)_3-$ group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining at least two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

An embodiment where $Rx_1$ is a methyl group or an ethyl group and $Rx_2$ and $Rx_3$ are combined to form the above-described cycloalkyl group is preferred.

The groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

The content in total of the acid-decomposable group-containing repeating units is preferably from 20 to 70 mol %, more preferably from 30 to 50 mol %, based on all repeating units in the resin.

Specific preferred examples of the repeating unit having an acid-decomposable group are set forth below, but the present invention is not limited thereto.

In specific examples, each of Rx and $Xa_1$ represents a hydrogen atom, $CH_3$, $CF_3$ or $CH_2OH$.

Each of Rxa and Rxb independently represents an alkyl group having a carbon number of 1 to 4.

Z represents, when a plurality of Z's are present, each independently represents, a polar group-containing substituent. Examples of the polar group-containing substituent include an alkyl and a cycloalkyl group each having a hydroxyl group, a cyano group, an amino group, an alkylamide group or a sulfonamide group, with a hydroxyl group-containing alkyl group being preferred.

p represents 0 or a positive integer.

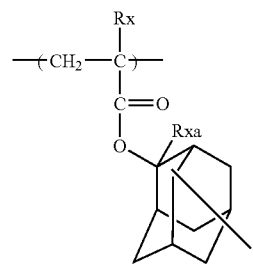

1

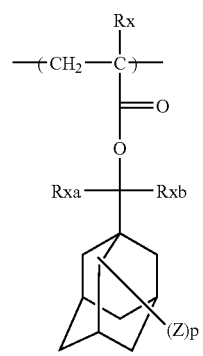

2

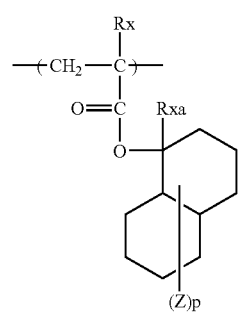

3

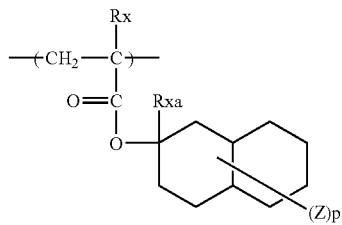

4

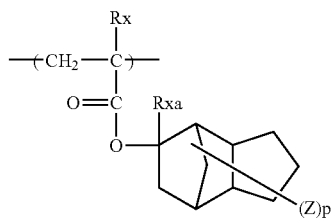

5

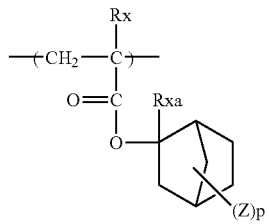

6

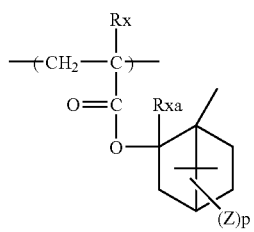

7

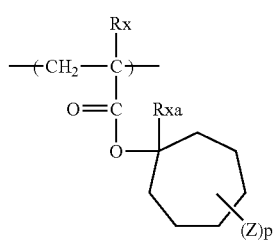

8

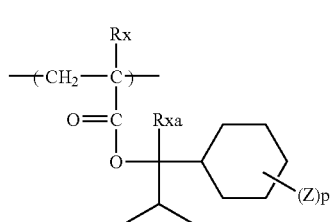

9

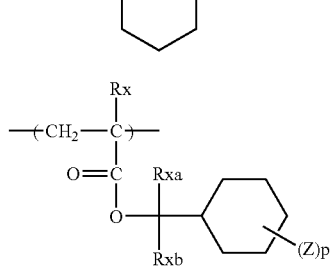

10

-continued
11 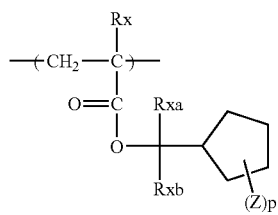
12 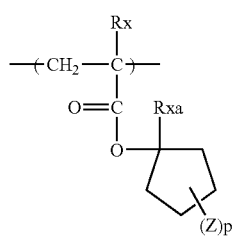
13 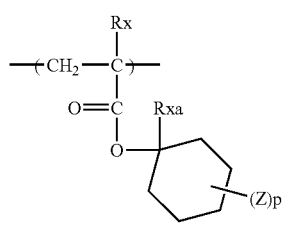
14 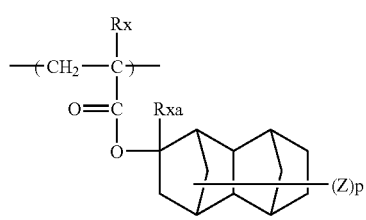
15 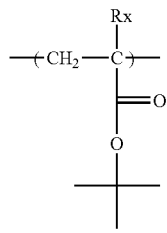
16 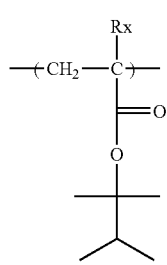
-continued
17 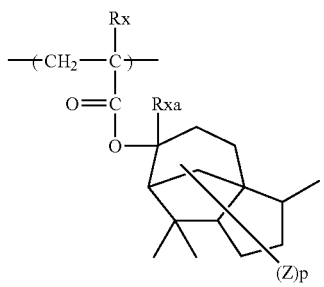
18 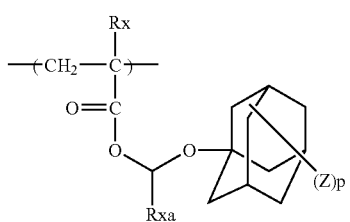
19 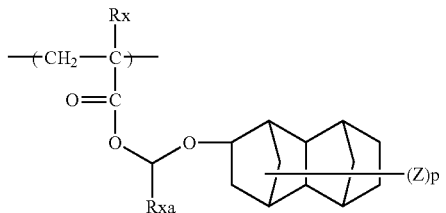
20 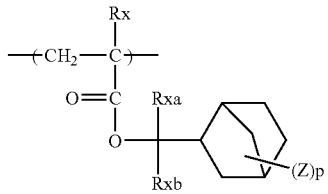
21 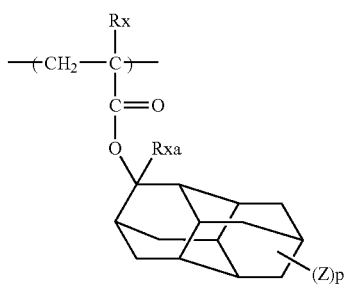
22 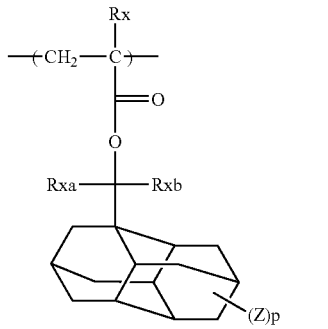

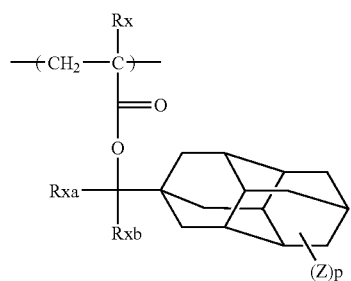
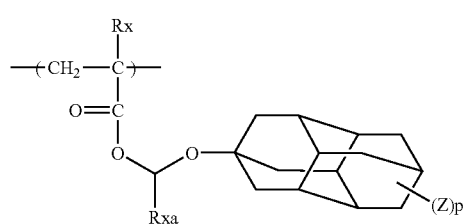
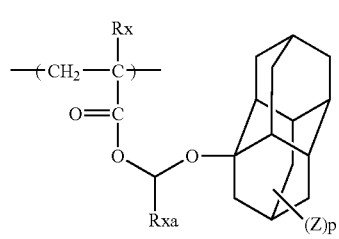
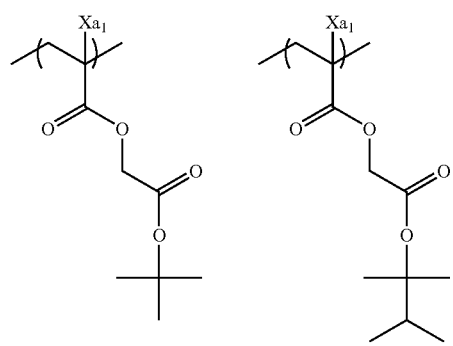
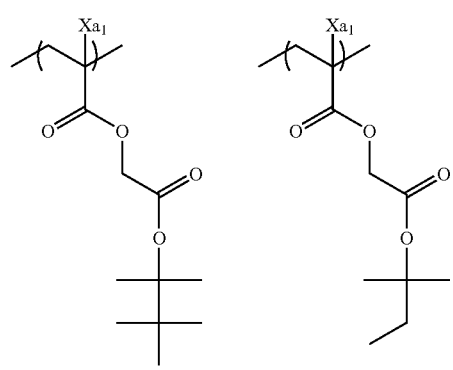
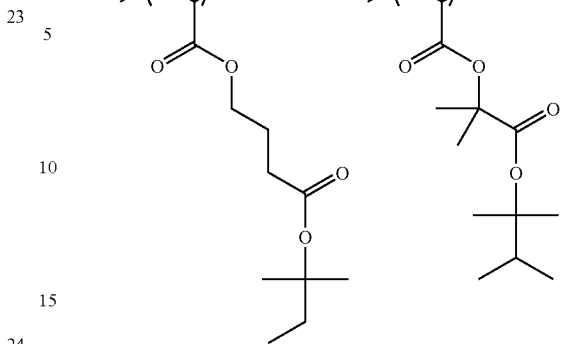
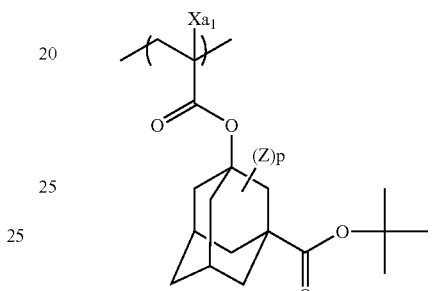
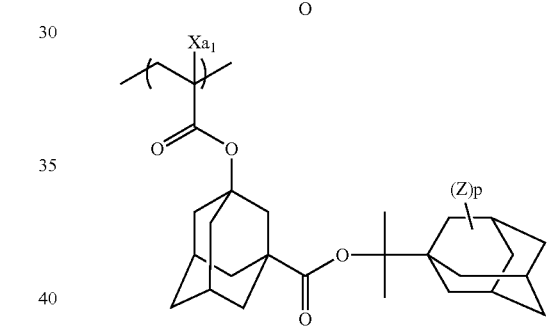
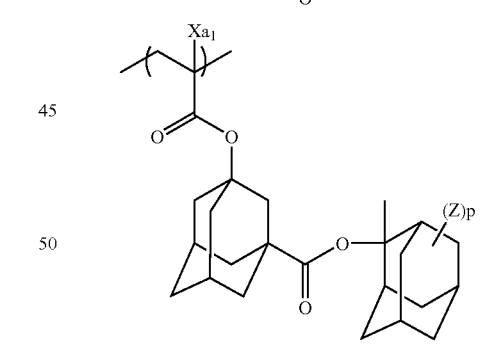
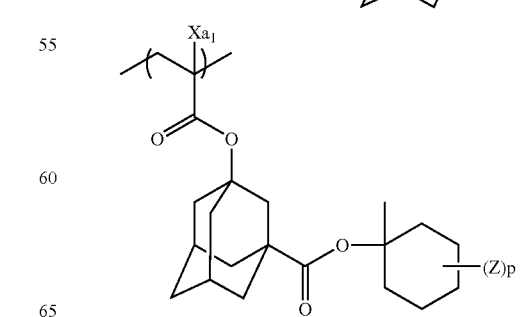

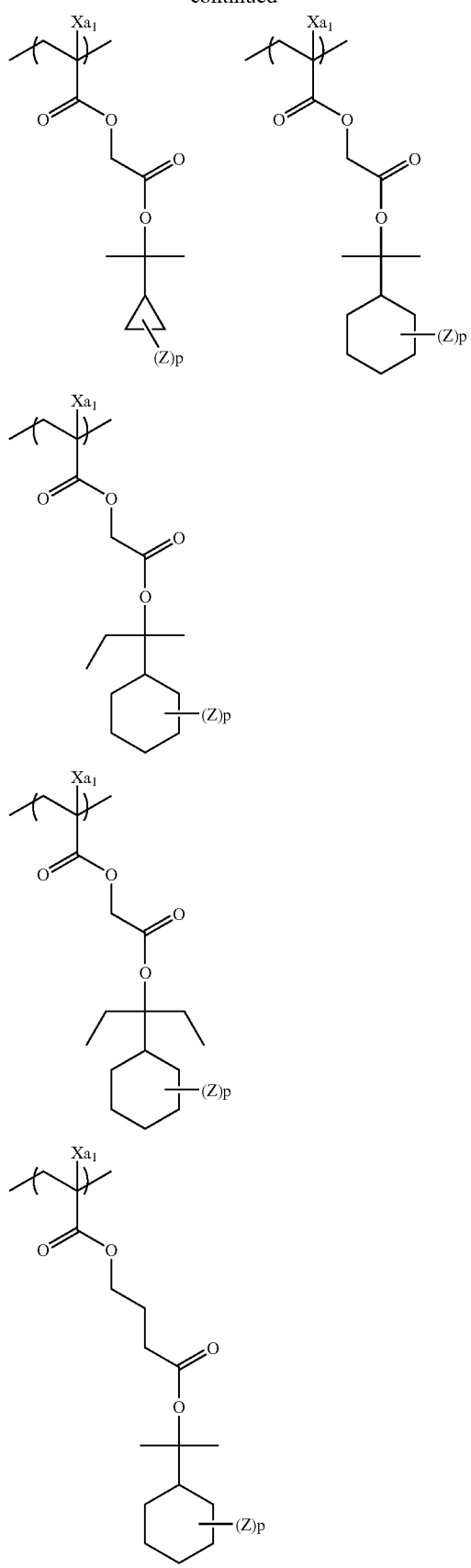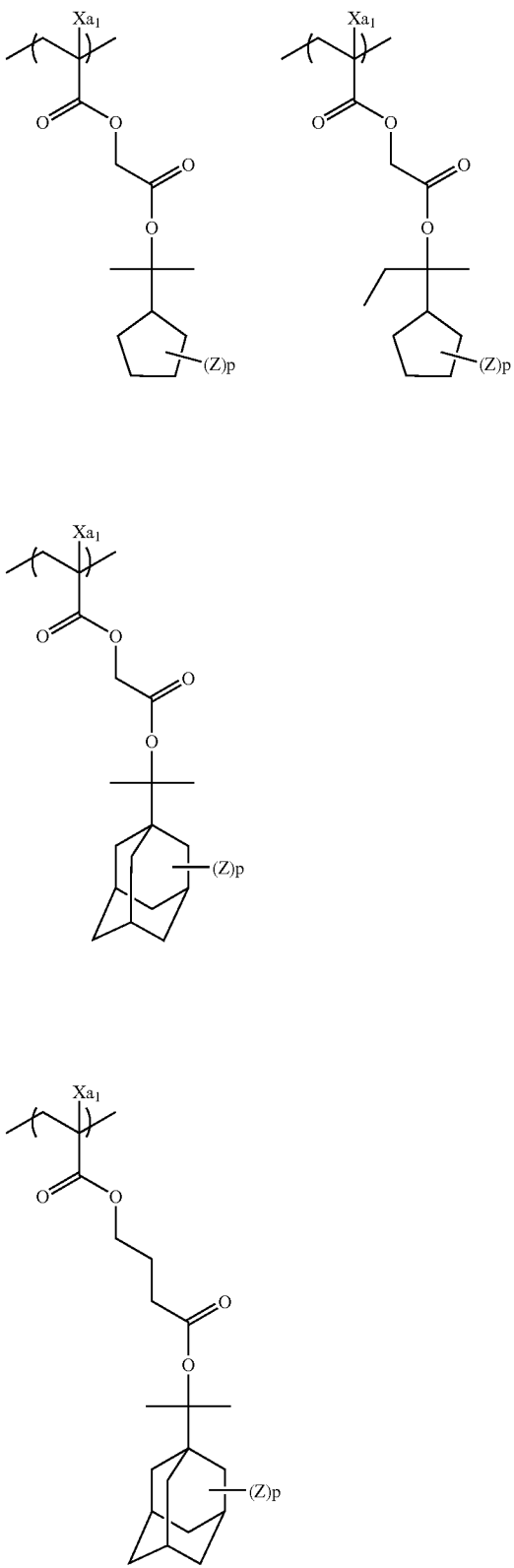

-continued
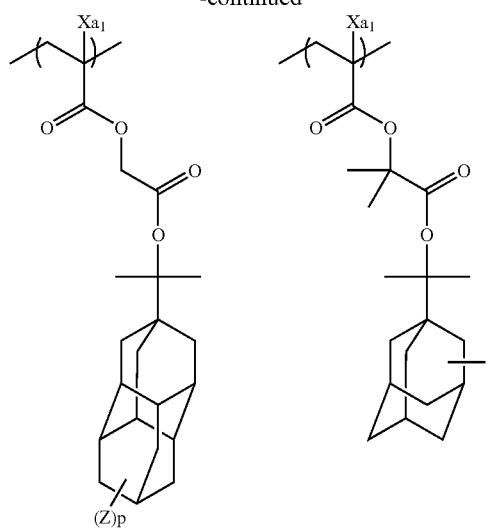
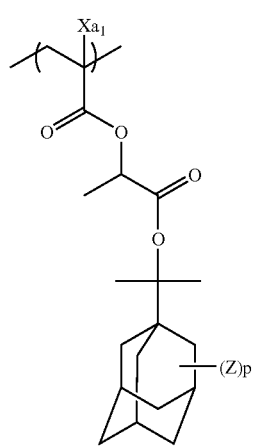
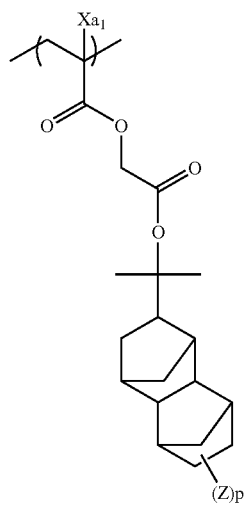
-continued
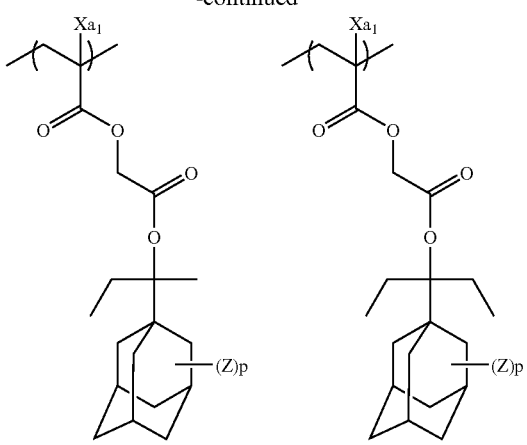
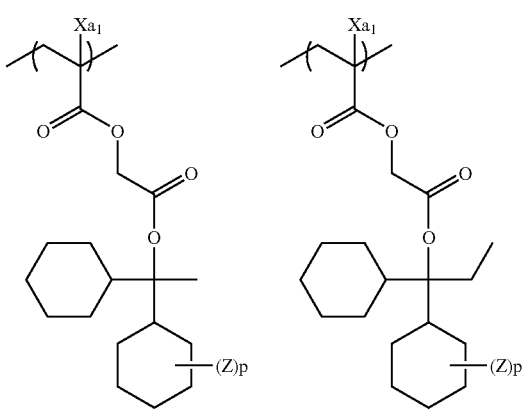
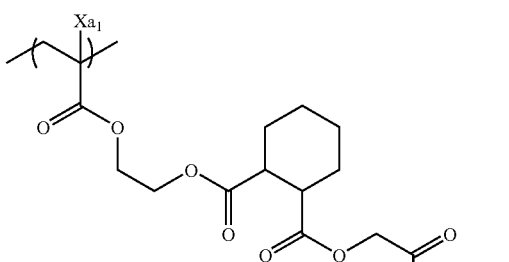
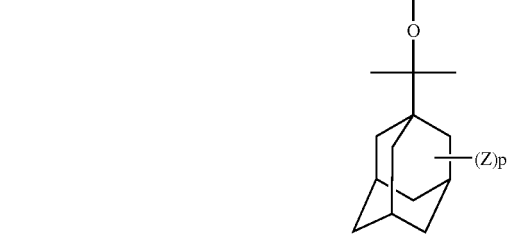
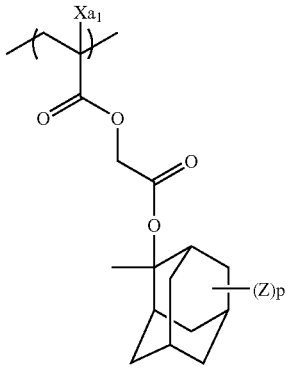

-continued
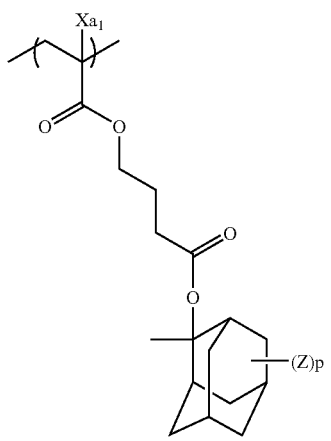
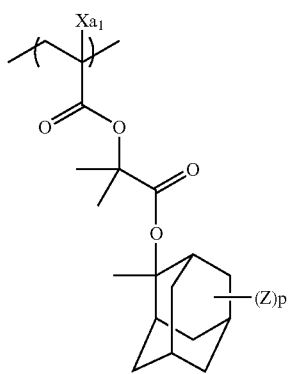
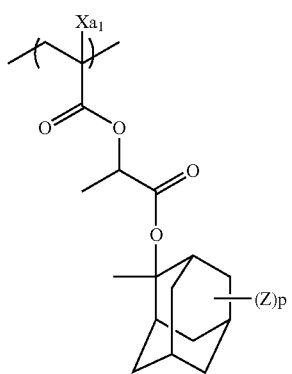
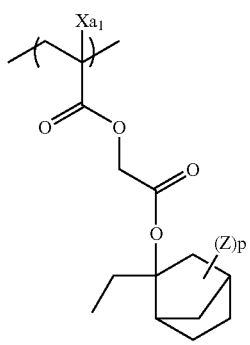
-continued
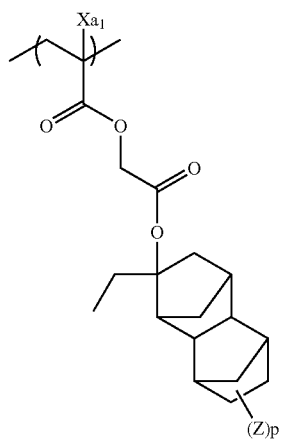
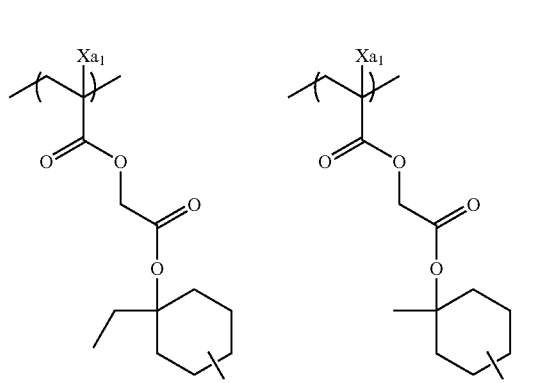
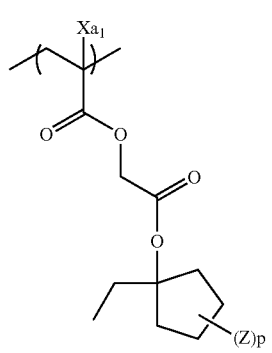
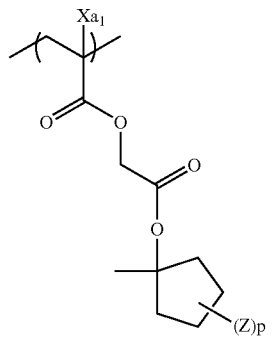

-continued

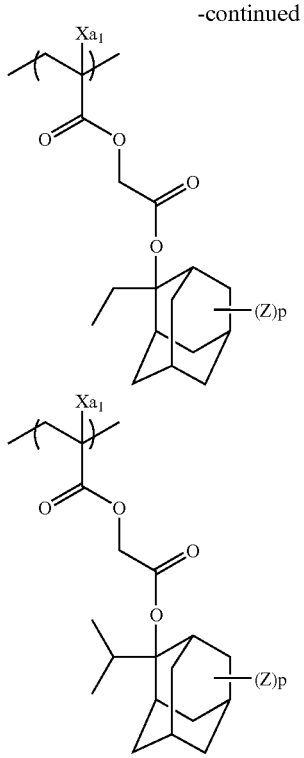

The resin (B) is more preferably a resin containing, as the repeating unit represented by formula (AI), at least either one of a repeating unit represented by formula (1) and a repeating unit represented by formula (2):

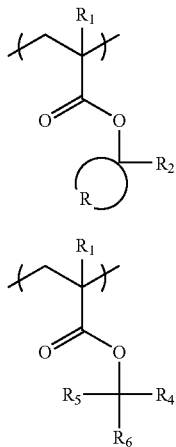

In formulae (1) and (2), each of $R_1$ and $R_3$ independently represents a hydrogen atom, a methyl group or a group represented by —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

$R_1$ is preferably a hydrogen atom, a methyl group, a trifluoromethyl group or a hydroxymethyl group.

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

Each R independently represents an atomic group necessary for forming an alicyclic structure together with the carbon atom. The alicyclic structure formed by R is preferably a monocyclic alicyclic structure, and the carbon number thereof is preferably from 3 to 7, more preferably 5 or 6.

$R_3$ is preferably a hydrogen atom or a methyl group, more preferably a methyl group.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The repeating unit represented by formula (2) is preferably a repeating unit represented by the following formula (2-1):

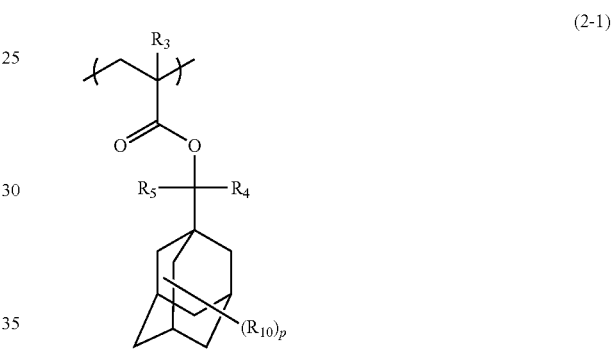

In formula (2-1), $R_3$ to $R_5$ have the same meanings as in formula (2).

$R_{10}$ represents a polar group-containing substituent. In the case where a plurality of $R_{10}$'s are present, each $R_{10}$ may be the same as or different from every other $R_{10}$. Examples of the polar group-containing substituent include polar groups themselves such as a hydroxyl group, a cyano group, an amino group, an alkylamide group and a sulfonamide group, or a linear or branched alkyl group or cycloalkyl group having these groups. An alkyl group having a hydroxyl group is preferred.

p represents an integer of 0 to 15. p is preferably an integer of 0 to 2, more preferably 0 or 1.

In the resin (B), when acid-decomposable repeating units are used in combination, preferred examples of the combination are set forth below.

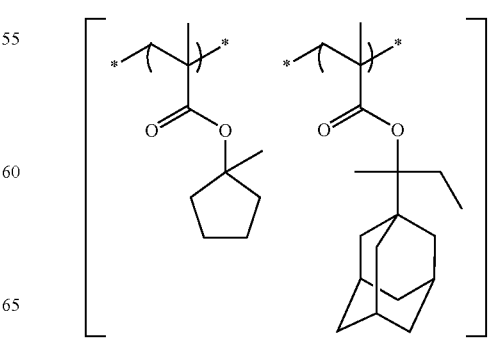

-continued
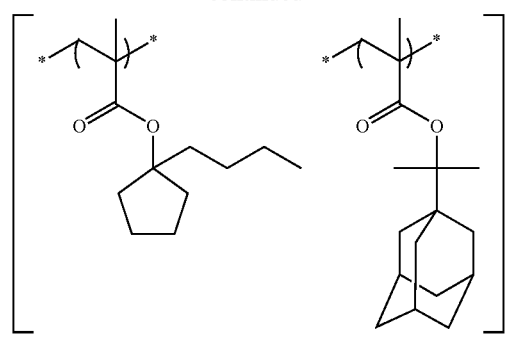
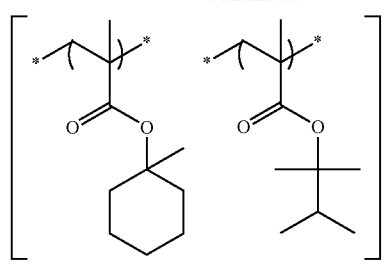
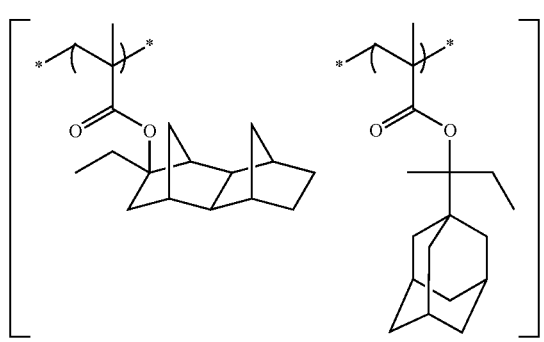
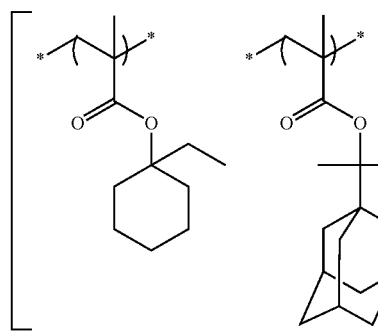
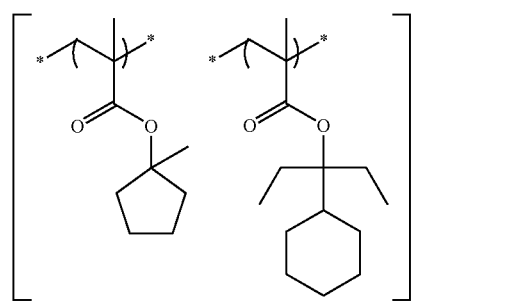
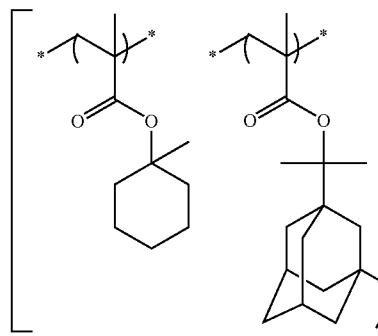
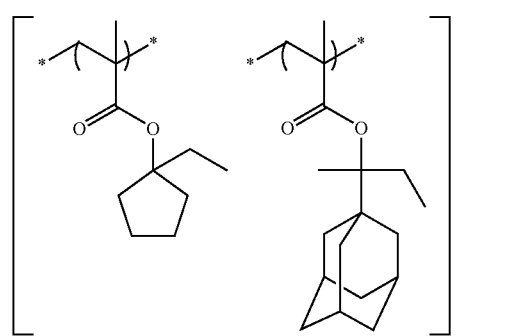
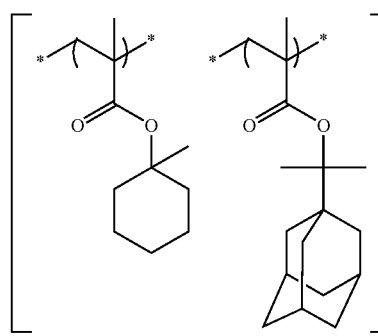
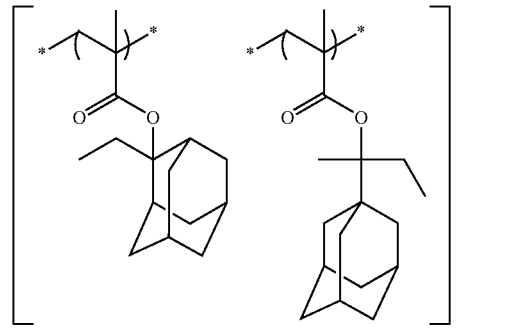
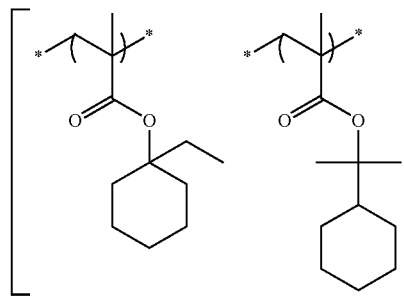

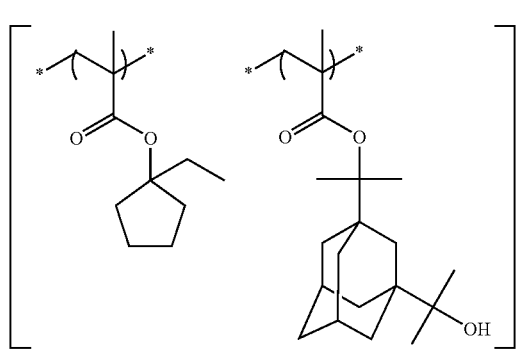
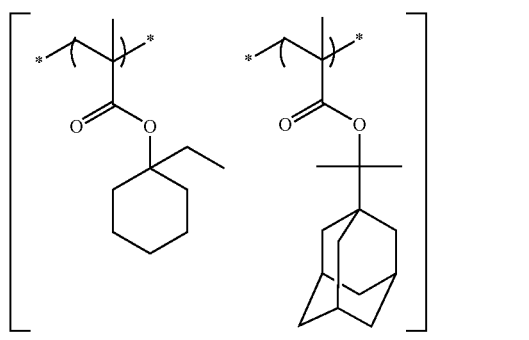
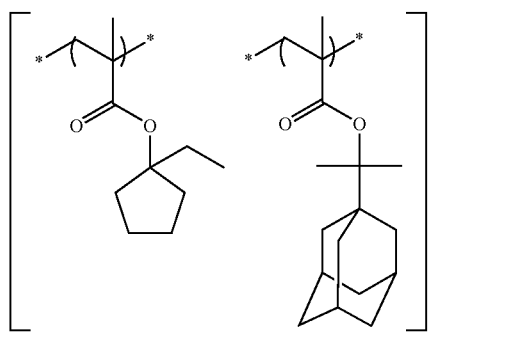
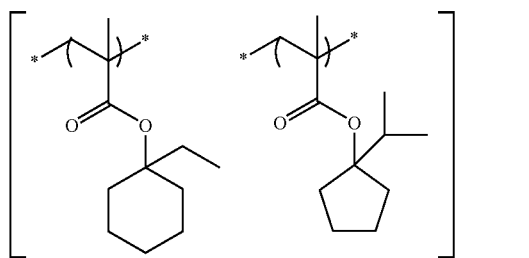
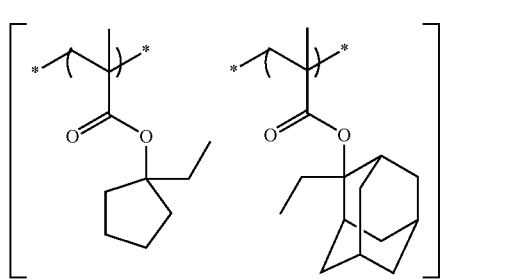
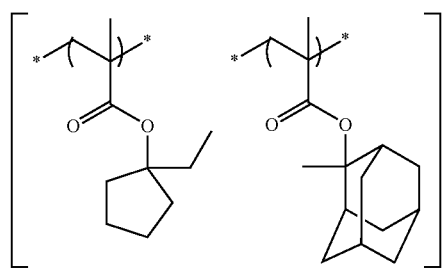
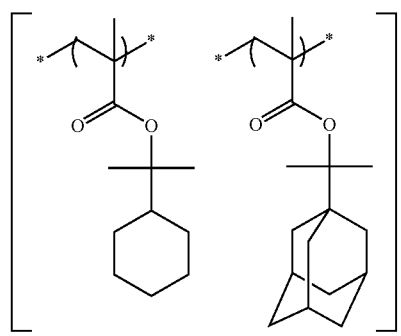
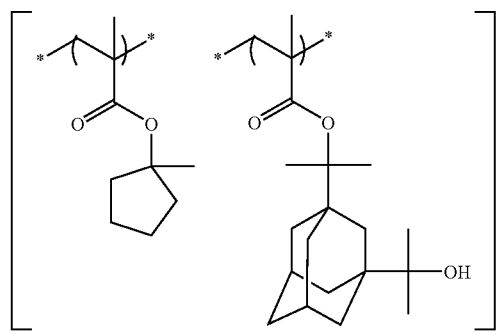
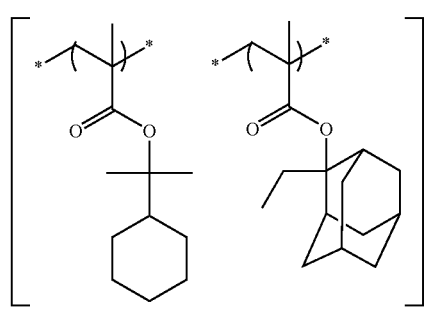
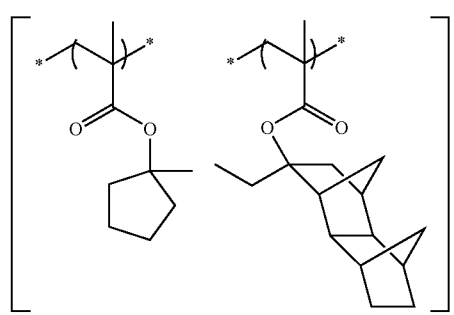

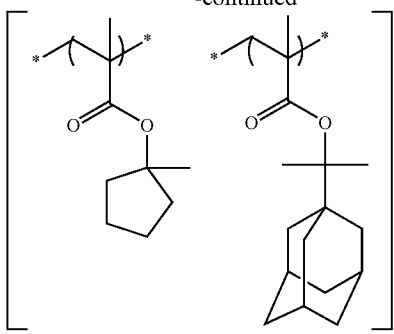

The resin (B) also contains a lactone structure-containing repeating unit represented by the following formula (3):

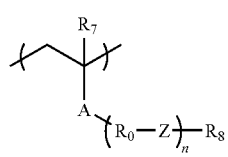

(3)

In formula (3), A represents an ester bond (a group represented by —COO—) or a group represented by —CONH—.

Each $R_0$ independently represents an alkylene group, a cycloalkylene group or a combination thereof and when a plurality of $R_0$'s are present, these may be the same or different.

Each Z each independently represents a single bond, an ether bond, an ester bond, an amide bond, a urethane bond or a urea bond and when a plurality of Z's are present, these may be the same or different.

$R_8$ represents a monovalent organic group having a lactone structure.

n is a repetition number of the structure represented by —$R_0$—Z— in the repeating unit of formula (3) and represents an integer of 1 to 5. n is preferably 1.

$R_7$ represents a hydrogen atom, a halogen atom or an alkyl group.

The alkylene group and cyclic alkylene group of $R_0$ may have a substituent.

Z is preferably an ether bond, an ester bond, an amide bond, a urethane bond or a urea bond, more preferably an ether bond or an ester bond, still more preferably an ester bond.

The alkyl group of $R_7$ is preferably an alkyl group having a carbon number of 1 to 4, more preferably a methyl group or an ethyl group, still more preferably a methyl group. The alkyl group in $R_7$ may be substituted, and examples of the substituent include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, and an acetoxy group such as acetyl group and propionyl group. $R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably from 1 to 5, and examples thereof include a methylene group, an ethylene group and a propylene group. The cyclic alkylene is preferably a cyclic alkylene having a carbon number of 1 to 20, and examples thereof include cyclohexylene, cyclopentylene, norbornylene and adamantylene. For bringing out the effects of the present invention, a chain alkylene group is more preferred, and a methylene group is still more preferred.

The lactone structure-containing substituent represented by $R_8$ is not limited as long as it has a lactone structure.

Specific examples thereof include lactone structures represented by formulae (LC1-1) to (LC1-16) described later as specific examples and of these, a structure represented by (LC1-4) is preferred. As for (LC1-1) to (LC1-16), those where $n_2$ is an integer of 2 or less are more preferred.

$R_8$ is preferably a monovalent organic group containing a lactone structure having a cyano group as the substituent (cyanolactone).

Specific examples of the repeating unit having a lactone structure-containing group represented by formula (3) are set forth below, but the present invention is not limited thereto.

In these specific examples, R represents a hydrogen atom, an alkyl group which may have a substituent, or a halogen atom and is preferably a hydrogen atom, a methyl group or an alkyl group having a substituent, that is, a hydroxymethyl group or an acetoxymethyl group.

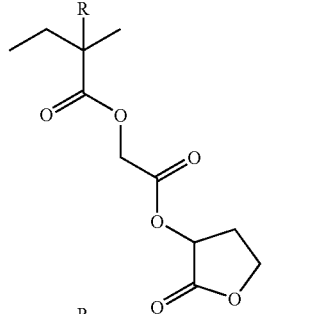

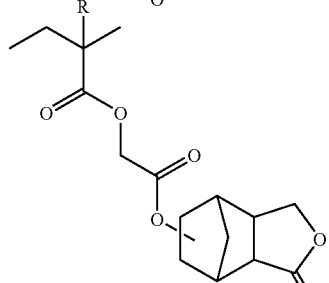

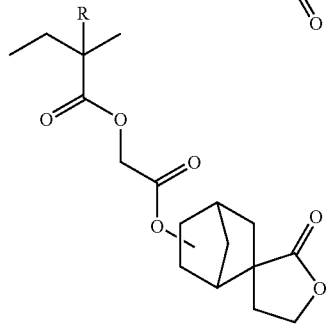

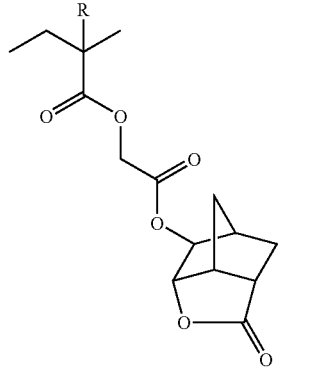

The lactone structure-containing repeating unit is preferably a repeating unit represented by the following formula (3-1):

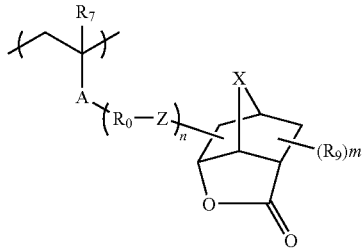

(3-1)

In formula (3-1), $R_7$, A, $R_0$, Z and n have the same meanings as in formula (3).

$R_9$ represents an alkyl group, a cycloalkyl group, an alkoxycarbonyl group, a cyano group, a hydroxyl group or an alkoxy group, and when a plurality of $R_0$'s are present, the plurality of $R_9$'s are the same or different, and two members thereof may combine with each other to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. Examples of the cycloalkyl group include a cyclopropyl group, a cyclobutyl group, a cyclopentyl group and a cyclohexyl group. Examples of the ester group include a methoxycarbonyl group, an ethoxycarbonyl group, an n-butoxycarbonyl group and a tert-butoxycarbonyl group. Examples of the substituent include a hydroxy group, an alkoxy group such as methoxy group and ethoxy group, a cyano group, and a halogen atom such as fluorine atom. $R_9$ is preferably a cyano group.

Examples of the alkylene group of X include a methylene group and an ethylene group.

Specific examples of the repeating unit having a lactone structure-containing group represented by formula (3-1) are set forth below, but the present invention is not limited thereto. R represents a hydrogen atom, an alkyl group which may have a substituent, or a halogen atom and is preferably a hydrogen atom, a methyl group, a hydroxymethyl group or an acetoxymethyl group.

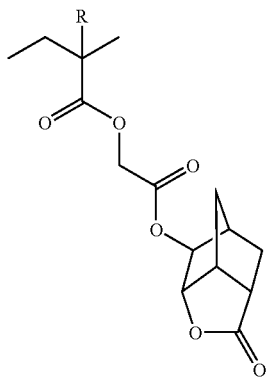

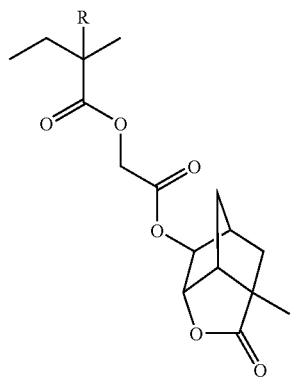

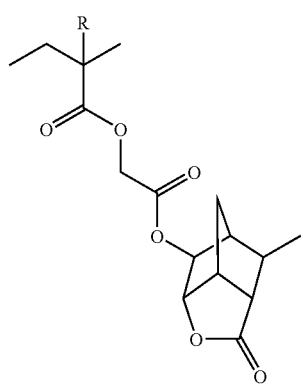

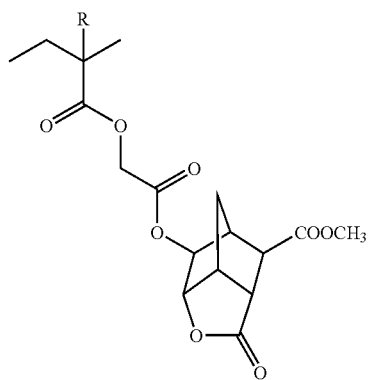

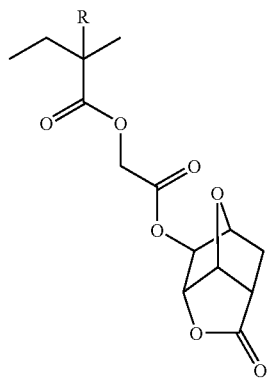

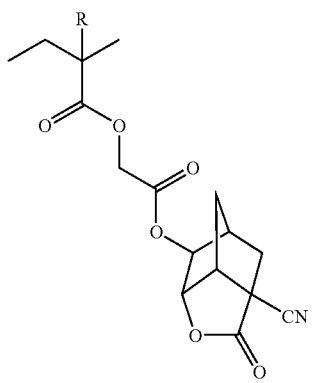
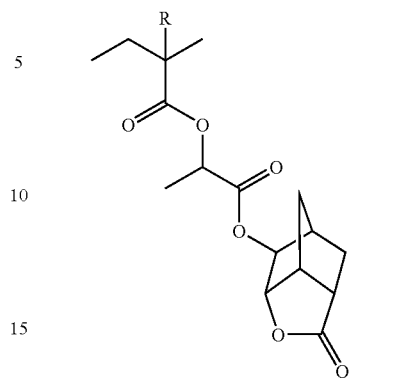
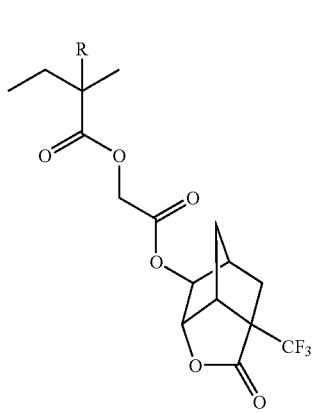
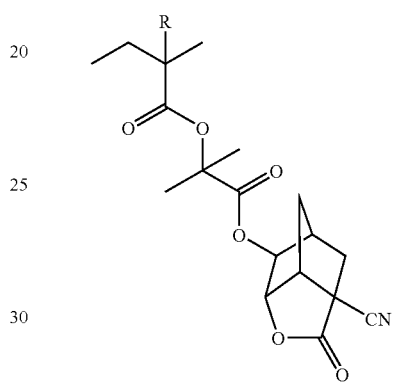
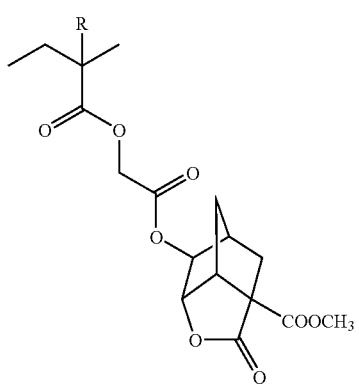
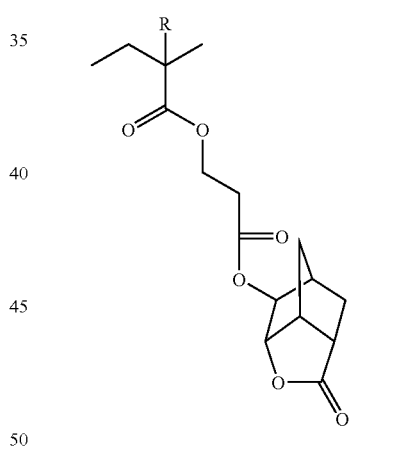
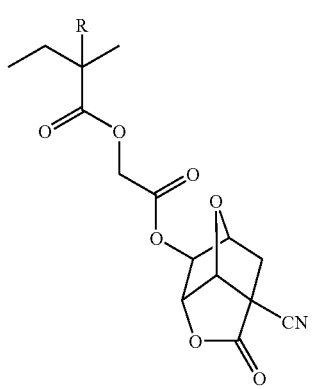
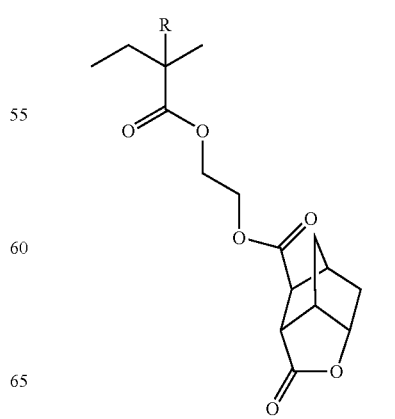

31
-continued
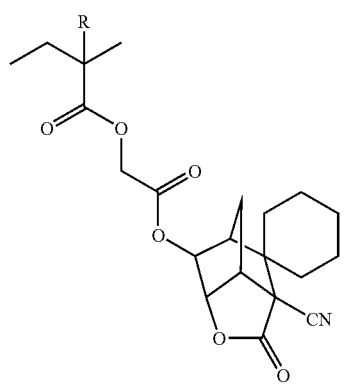
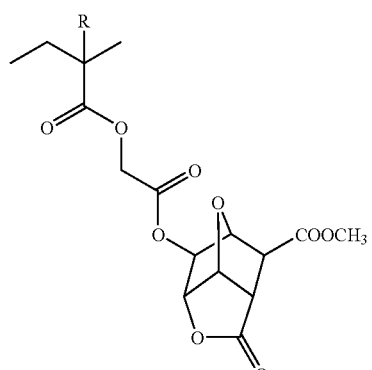
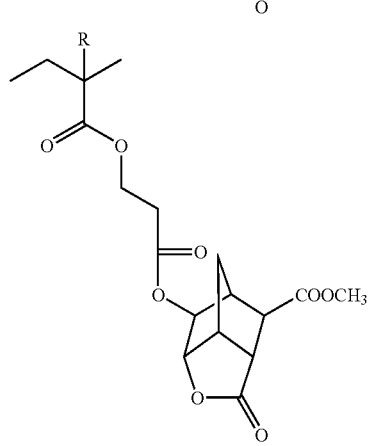
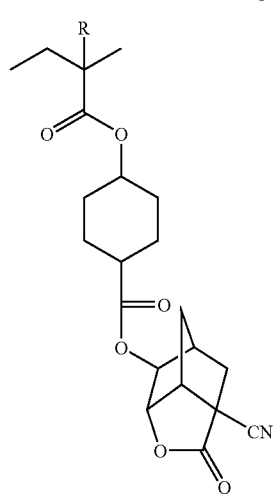
32
-continued
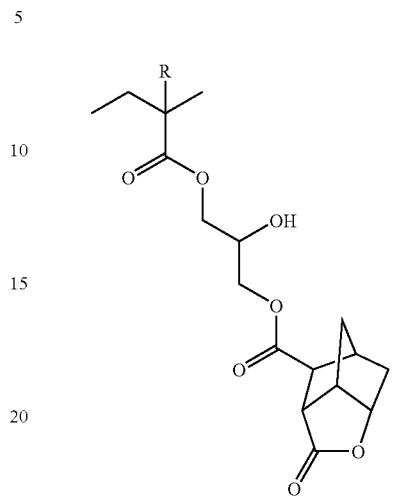
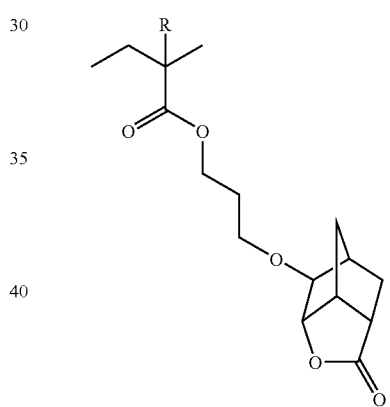
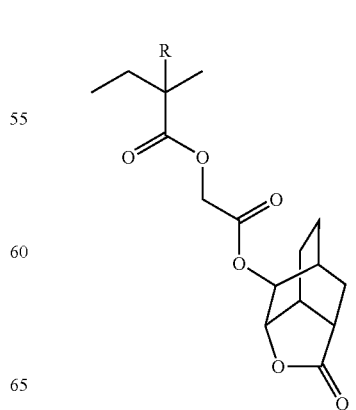

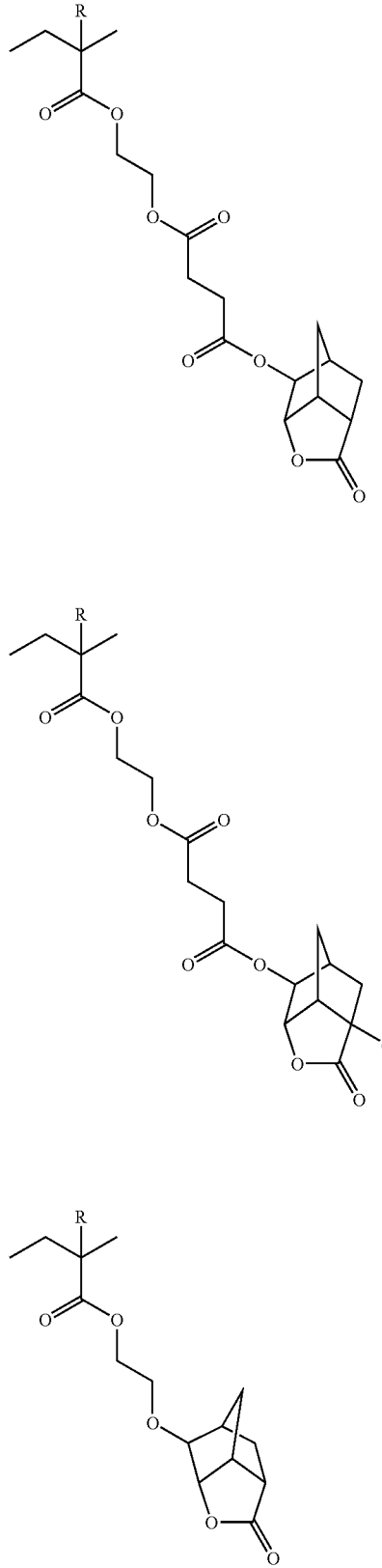
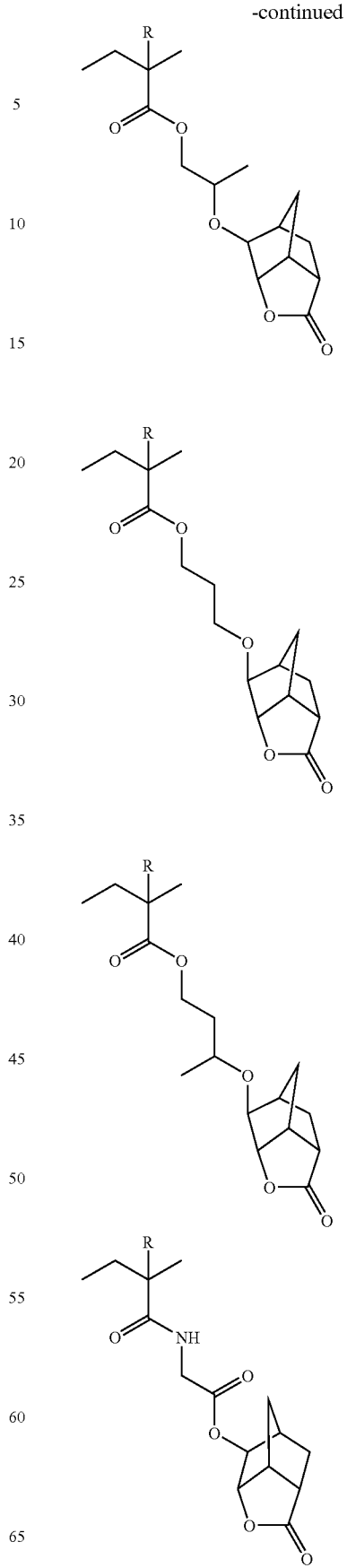

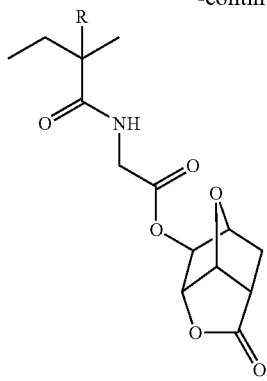

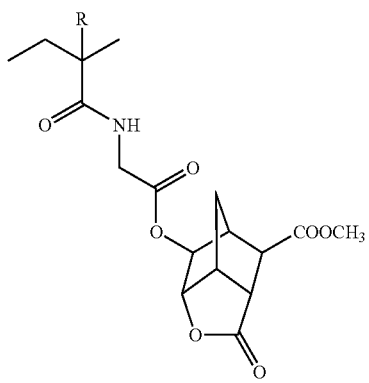

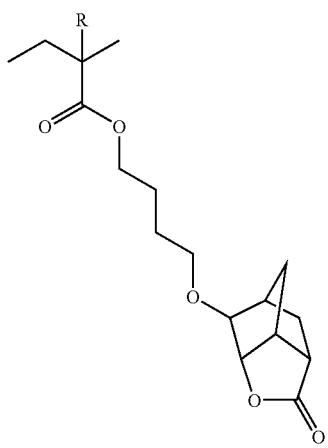

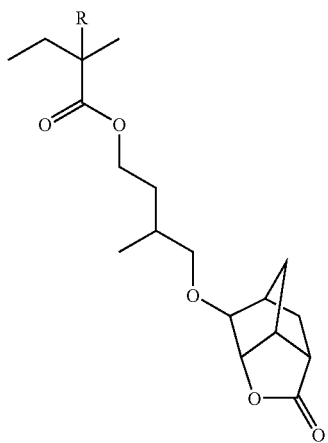

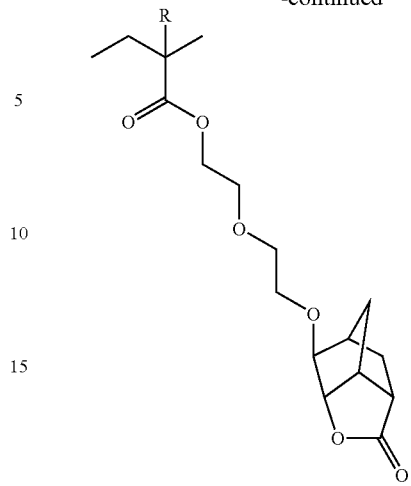

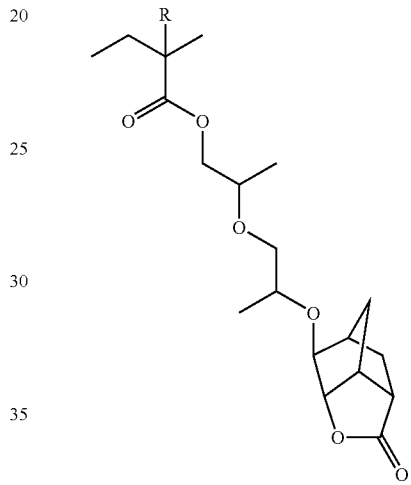

The content of the repeating unit represented by formula (3) is, when a plurality of kinds of repeating units are contained, their total content is, preferably from 15 to 60 mol %, more preferably from 20 to 60 mol %, still more preferably from 30 to 50 mol %, based on all repeating units in the resin.

The resin (B) may contain a repeating unit having a lactone group, other than the unit represented by formula (3).

As for the lactone group, any group may be used as long as it has a lactone structure, but the lactone structure is preferably a 5- to 7-membered ring lactone structure, and a structure where another ring structure is condensed with a 5- to 7-membered ring lactone structure in the form of forming a bicyclo or spiro structure is preferred. The resin more preferably contains a repeating unit having a lactone structure represented by any one of the following formulae (LC1-1) to (LC1-16). The lactone structure may be bonded directly to the main chain. Among these lactone structures, preferred are (LC1-1), (LC1-4), (LC1-5), (LC1-6), (LC1-13) and (LC1-14). By using a specific lactone structure, LWR and development defect are improved.

LC-1-1

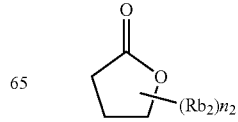

| | |
|---|---|
| LC1-2 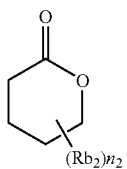 | LC1-10 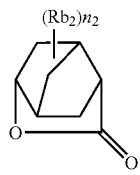 |
| LC1-3 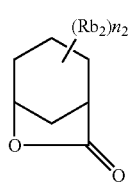 | LC1-11 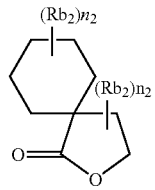 |
| LC1-4 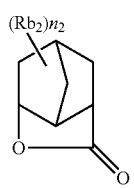 | LC1-12 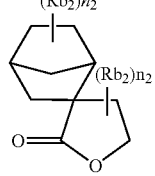 |
| LC1-5 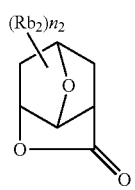 | LC1-13 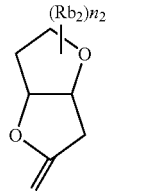 |
| LC1-6 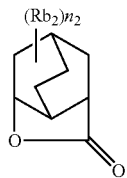 | LC1-14 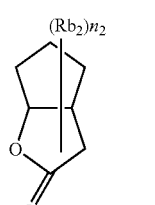 |
| LC1-7 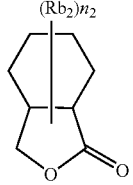 | LC1-15 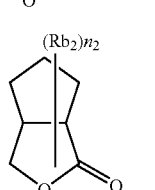 |
| LC1-8 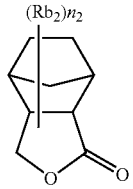 | LC1-16 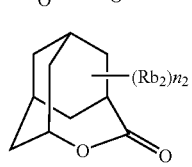 |
| LC1-9 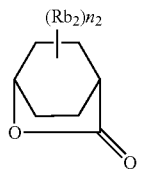 | |

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituent (Rb$_2$) and also, the plurality of substituents (Rb$_2$) may combine with each other to form a ring.

As for the lactone structure-containing repeating unit other than the unit represented by formula (3), a repeating unit represented by the following formula (AII') is also preferred.

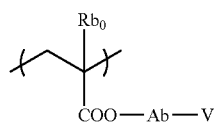

(AII')

In formula (AII'), Rb$_0$ represents a hydrogen atom, a halogen atom or an alkyl group having a carbon number of 1 to 4. Preferred examples of the substituent which the alkyl group of Rb$_0$ may have include a hydroxyl group and a halogen atom. Examples of the halogen atom of Rb$_0$ include a fluorine atom, a chlorine atom, a bromine atom and an iodine atom. Rb$_0$ is preferably a hydrogen atom, a methyl group, a hydroxymethyl group or a trifluoromethyl group, more preferably a hydrogen atom or a methyl group.

Ab represents a single bond.

V represents a group having a structure represented by any one of formulae (LC1-1) to (LC1-16).

Specific examples of the repeating unit having a lactone group, other than the unit represented by formula (3), are set forth below, but the present invention is not limited thereto. In specific examples, Rx represents H, CH$_3$, CH$_2$OH or CF$_3$. By selecting an optimal lactone group, the pattern profile and iso/dense bias are improved.

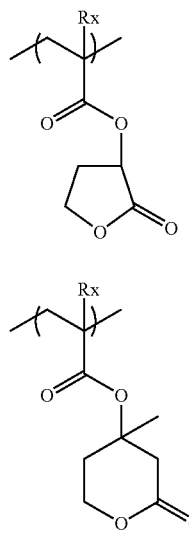
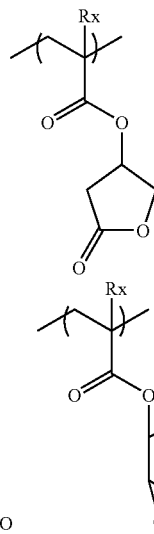
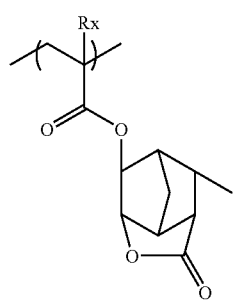
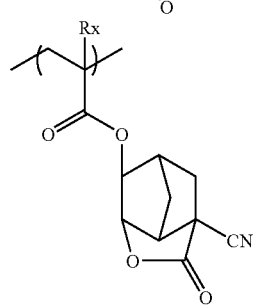
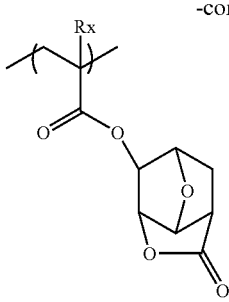
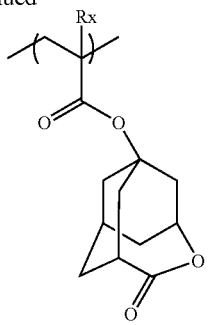
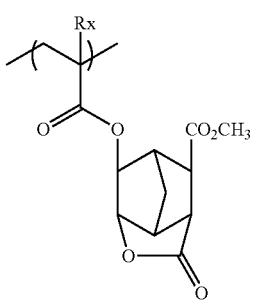
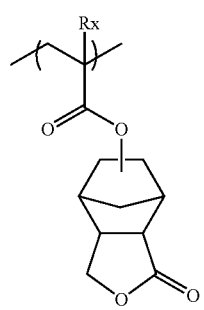
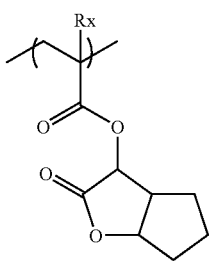
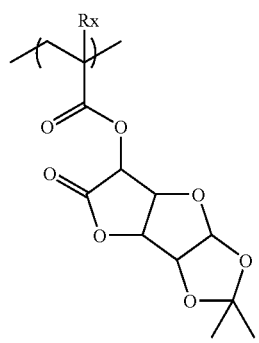
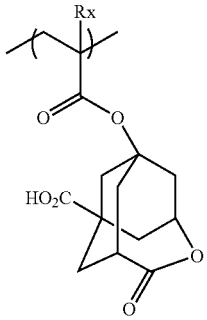
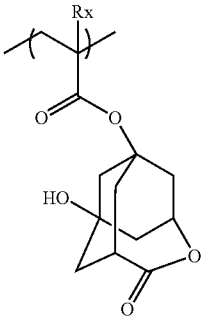

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The content of the lactone-containing repeating unit other than the repeating unit represented by formula (3) is, when a plurality of kinds of repeating units are contained, their total content is, preferably from 15 to 60 mol %, more preferably from 20 to 50 mol %, still more preferably from 30 to 50 mol %, based on all repeating units in the resin.

The resin (B) preferably contains a repeating unit having a hydroxyl group or a cyano group. Thanks to this repeating unit, the adherence to substrate and the affinity for developer are enhanced. The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by the following formulae (VIIa) to (VIId):

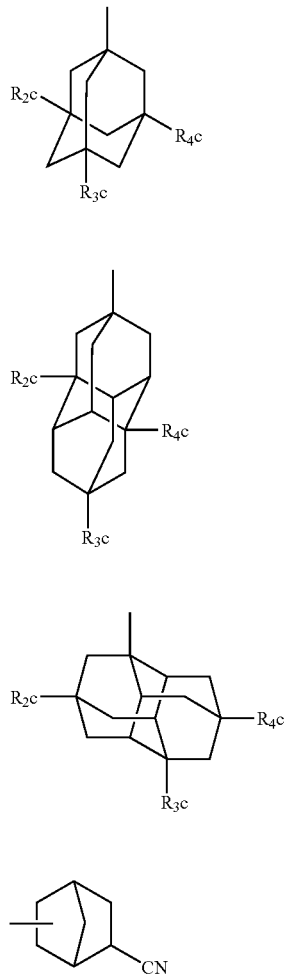

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

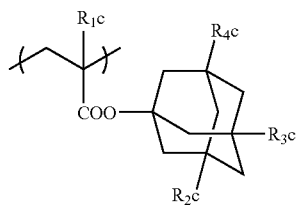

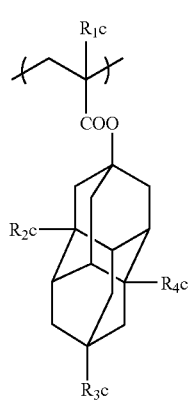

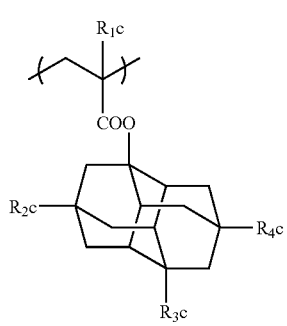

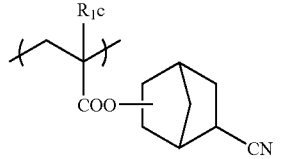

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The content of the repeating unit having a hydroxyl group or a cyano group is preferably from 5 to 40 mol %, more preferably from 5 to 30 mol %, still more preferably from 10 to 25 mol %, based on all repeating units in the resin (B).

Specific examples of the repeating unit having a hydroxyl group or a cyano group are set forth below, but the present invention is not limited thereto.

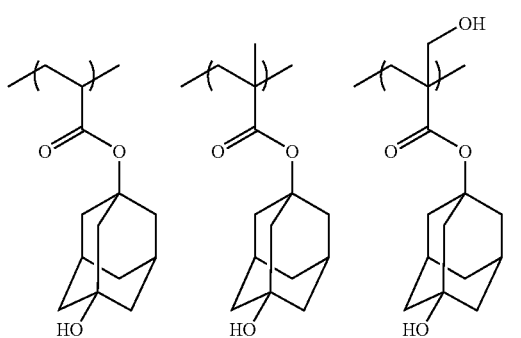
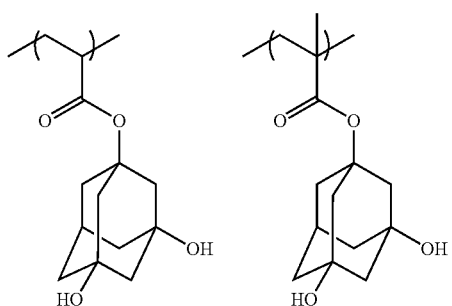
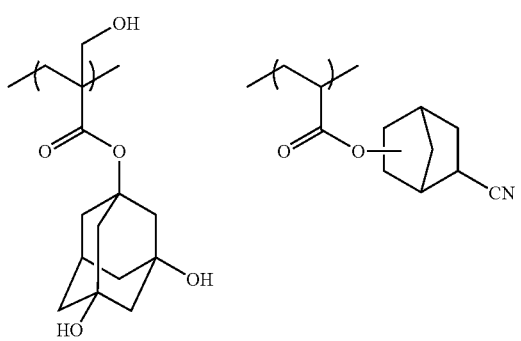
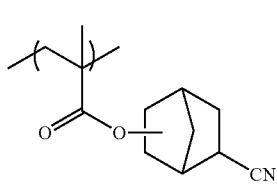
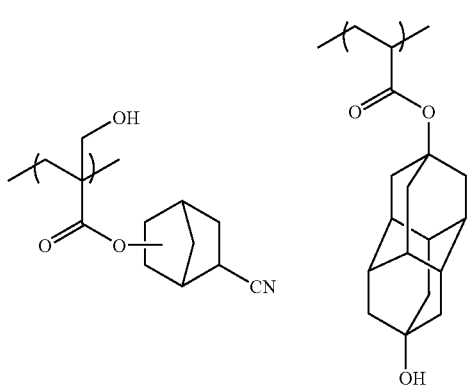

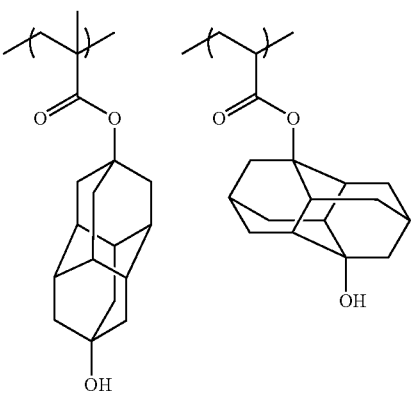
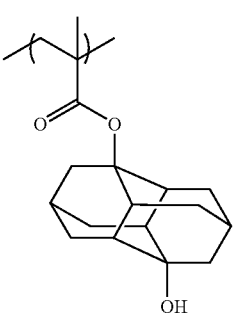

The resin for use in the composition of the present invention may contain a repeating unit having an alkali-soluble group. Examples of the alkali-soluble group include a carboxyl group, a sulfonamide group, a sulfonylimide group, a bissulfonylimide group, and an aliphatic alcohol with the α-position being substituted by an electron-withdrawing group, such as hexafluoroisopropanol group. It is more preferred to contain a repeating unit having a carboxyl group. By virtue of containing a repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic hydrocarbon structure. In particular, a repeating unit by an acrylic acid or a methacrylic acid is preferred.

The content of the repeating unit having an alkali-soluble group is preferably from 0 to 20 mol %, more preferably from 3 to 15 mol %, still more preferably from 5 to 10 mol %, based on all repeating units in the resin (B).

Specific examples of the repeating unit having an alkali-soluble group are set forth below, but the present invention is not limited thereto. In specific examples, Rx represents H, $CH_3$, $CH_2OH$ or $CF_3$.

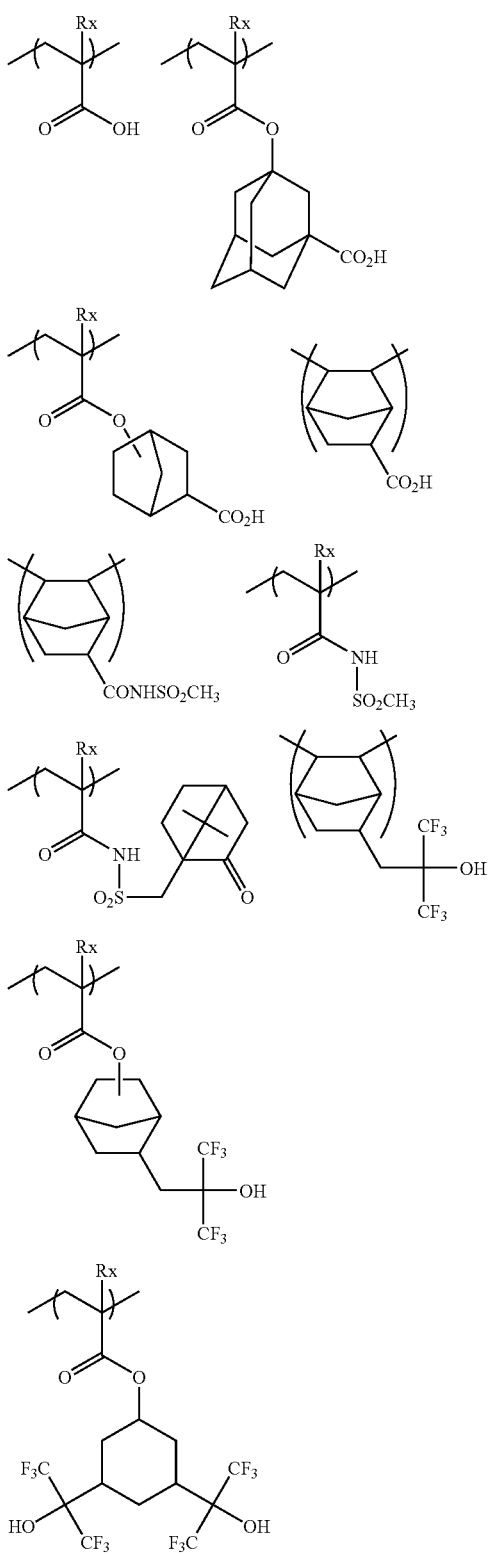

The resin (B) in the present invention may further contain a repeating unit having a polar group-free alicyclic hydrocarbon structure and not exhibiting acid decomposability. This repeating unit includes a repeating unit represented by formula (4):

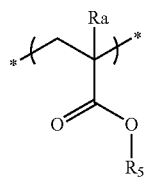

In formula (4), $R_5$ represents a hydrocarbon group having at least one cyclic structure and having neither a hydroxyl group nor a cyano group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure possessed by $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring gathered hydrocarbon group and a crosslinked cyclic hydrocarbon group. Examples of the ring gathered hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,0$^{2,6}$]decanyl group. Among these crosslinked cyclic hydrocarbon rings, a norbornyl group and an adamantyl group are more preferred.

These alicyclic hydrocarbon groups may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is preferably an alkoxycarbonyl group having a carbon number of 1 to 4.

The content of the repeating unit having a polar group-free alicyclic hydrocarbon structure and not exhibiting acid decomposability is preferably from 0 to 40 mol %, more preferably from 0 to 20 mol %, based on all repeating units in the resin (B).

Specific examples of the repeating unit having a polar group-free alicyclic hydrocarbon structure and not exhibiting acid decomposability are set forth below, but the present invention is not limited thereto. In the formulae, Ra represents a hydrogen atom, a methyl group, —CH$_2$OH or —CF$_3$.

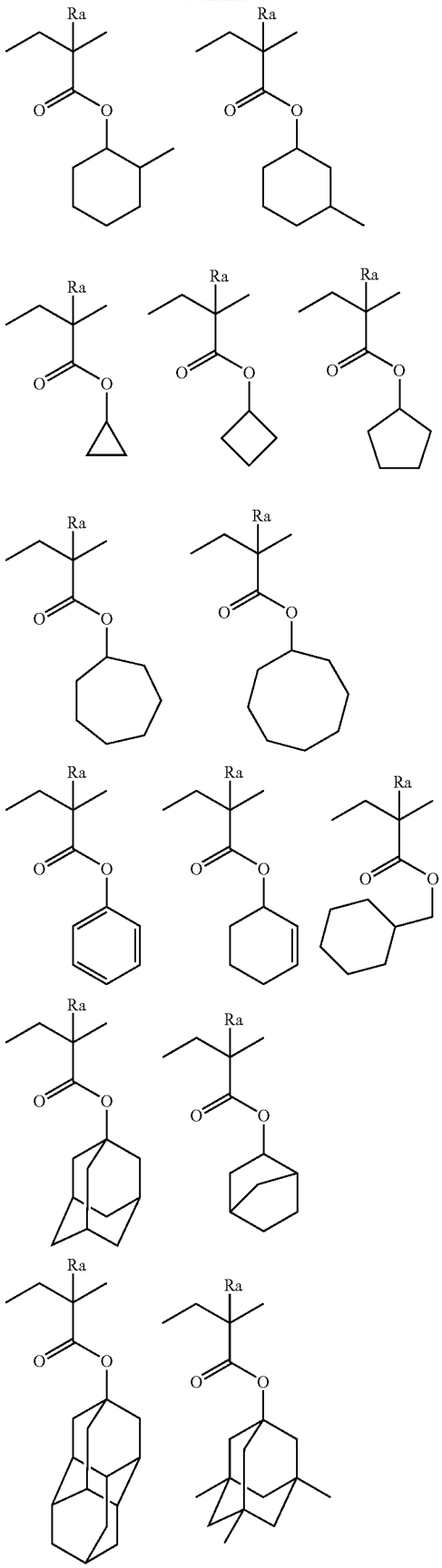

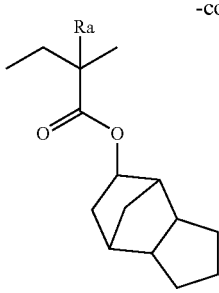

The resin for use in the composition of the present invention may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

Examples of such a repeating structural unit include, but are not limited to, repeating structural units corresponding to the monomers described below.

Thanks to such a repeating structural unit, the performance required of the resin for use in the composition of the present invention, particularly (1) solubility in the coating solvent,
(2) film-forming property (glass transition point),
(3) alkali developability,
(4) film loss (selection of hydrophilic, hydrophobic or alkali-soluble group),
(5) adherence of unexposed area to substrate,
(6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (B) for use in the composition of the present invention, the molar ratio of respective repeating structural units contained is appropriately determined to control the dry etching resistance of resist, suitability for standard developer, adherence to substrate, resist profile and performances generally required of the resist, such as resolution, heat resistance and sensitivity.

In the case where the composition of the present invention is used for ArF exposure, the resin (B) for use in the composition of the present invention preferably has substantially no aromatic group (specifically, in the resin, the ratio of an aromatic group-containing repeating unit is preferably 5 mol % or less, more preferably 3 mol % or less, and ideally 0 mol %, that is, no aromatic group is contained) in view of transparency to ArF light, and the resin (B) preferably has a monocyclic or polycyclic alicyclic hydrocarbon structure.

Also, the resin (B) for use in the present invention preferably contains no fluorine atom and no silicon atom in view of compatibility with the hydrophobic resin (C).

The resin (B) for use in the composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating unit may be composed of a methacrylate-based repeating unit and an acrylate-based repeating unit, but the content of the acrylate-based repeating unit is preferably 50 mol % or less based on all repeating units. The resin is also preferably a copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted by a hydroxyl group or a cyano group, and from 0 to 20 mol % of other (meth)acrylate-based repeating units.

In the case where the composition of the present invention is irradiated with KrF excimer laser light, electron beam, X-ray or high-energy beam at a wavelength of 50 nm or less (e.g., EUV), the resin (B) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl(meth)acrylate.

Preferred examples of the hydroxystyrene-based repeating unit having an acid-decomposable group include a repeating unit composed of a tert-butoxycarbonyloxystyrene, a 1-alkoxyethoxystyrene or a tertiary alkyl(meth)acrylate. A repeating unit composed of a 2-alkyl-2-adamantyl(meth)acrylate or a dialkyl(1-adamantyl)methyl(meth)acrylate is more preferred.

The resin (B) for use in the present invention can be synthesized by an ordinary method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane, diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the composition of the present invention. By the use of this solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is collected by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

The weight average molecular weight of the resin (B) for use in the present invention is preferably from 1,000 to 200,000, more preferably from 2,000 to 20,000, still more preferably from 3,000 to 15,000, yet still more preferably from 3,000 to 10,000, in terms of polystyrene by the GPC method. The weight average molecular weight in the range above is advantageous for preventing deterioration of heat resistance, dry etching resistance and developability and preventing the film-forming property from deteriorating due to increase in the viscosity.

The polydispersity (molecular weight distribution) is usually from 1 to 3, preferably from 1 to 2.6, more preferably from 1 to 2, still more preferably from 1.4 to 2.0. As the molecular weight distribution is smaller, the resolution and resist profile are more excellent, the side wall of the resist pattern is smoother, and the roughness is more improved.

The amount of the resin blended is preferably from 50.0 to 99.9 mass %, more preferably from 60.0 to 99.0 mass %, based on the entire solid content of the composition.

As to the resin for use in the present invention, one kind of a resin may be used or a plurality of kinds of resins may be used in combination.

[2] Low Molecular Compound Having a Group Capable of Leaving by the Action of an Acid (D)

The composition of the present invention contains (D) a low molecular compound having a group capable of leaving by the action of an acid (sometimes referred to as the component (D)). The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of the low molecular compound having a group capable of leaving by the action of an acid is preferably from 100 to 1,000, more preferably from 100 to 700, still more preferably from 100 to 500.

In the case where the low molecular compound having a group capable of leaving by the action of an acid has a tertiary ester structure, the compound is preferably a carboxylic acid ester or unsaturated carboxylic acid ester represented by the following formula (1a):

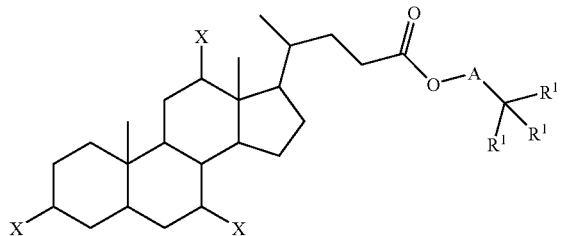

(1a)

In formula (1a), each $R^1$ independently represents a monovalent alicyclic hydrocarbon group (preferably having a carbon number of 4 to 20) or a derivative thereof, or an alkyl group (preferably having a carbon number of 1 to 4) and at the same time, at least one $R^1$ is the alicyclic hydrocarbon group or a derivative thereof, or while any two $R^1$'s are combined with each other to form a divalent alicyclic hydrocarbon group (preferably having a carbon number of 4 to 20) or a derivative thereof together with the carbon atom to which they are bonded, the remaining $R^1$ represents an alkyl group (preferably having a carbon number of 1 to 4), or a monovalent alicyclic hydrocarbon group (preferably having a carbon number of 4 to 20) or a derivative thereof.

Each X independently represents a hydrogen atom or a hydroxy group, and at least one X is a hydroxy group.

A represents a single bond or a divalent linking group, and preferably represents a single bond or a group represented by -D-COO— (wherein D represents an alkylene group (preferably having a carbon number of 1 to 4)).

In formula (1a), A represents a single bond or a divalent linking group, and examples of the divalent linking group include a methylene group, a methylenecarbonyl group, a methylenecarbonyloxy group, an ethylene group an ethylenecarbonyl group, an ethylenecarbonyloxy group, a propylene group, a propylenecarbonyl group and a propylenecarbonyloxy group, with a methylenecarbonyloxy group being preferred.

In formula (1a), examples of the monovalent alicyclic hydrocarbon group (preferably having a carbon number of 4 to 20) of $R^1$ and the divalent alicyclic hydrocarbon group (preferably having a carbon number of 4 to 20) formed by combining any two $R^1$'s with each other include a group composed of an alicyclic ring derived from norbornane, tricyclodecane, tetracyclododecane, adamantane or cycloalkanes such as cyclobutane, cyclopentane, cyclohexane, cycloheptane and cyclooctane; and a group where the group composed of an alicyclic ring is substituted by one or more kinds of or one or more groups of an alkyl group having a carbon number of 1 to 4, such as methyl group, ethyl group, n-propyl group, i-propyl group, n-butyl group, 2-methylpropyl group, 1-methylpropyl group and tert-butyl group, and a cycloalkyl group. Among these alicyclic hydrocarbon groups, preferred are a group composed of an alicyclic ring derived from norbornane, tricyclodecane, tetracyclododecane, adamantane, cyclopentane or cyclohexane, and a group where the group composed of an alicyclic ring is substituted by the alkyl group above.

Examples of the derivative of the alicyclic hydrocarbon group include a group having one or more kinds of or one or more groups of substituents such as: a hydroxyl group; a carboxyl group; an oxo group (i.e., =O group); a hydroxyalkyl group having a carbon number of 1 to 4, e.g., hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group and 4-hydroxybutyl group; an alkoxyl group having a carbon number of 1 to 4, e.g., methoxy group, ethoxy group, n-propoxy group, i-propoxy group, n-butoxy group, 2-methylpropoxy group, 1-methylpropoxy group and tert-butoxy group; and a cyanoalkyl group having a carbon number of 2 to 5, e.g., cyanomethyl group, 2-cyanoethyl group, 3-cyanopropyl group and 4-cyanobutyl group. Among these substituents, a hydroxyl group, a carboxyl group, a hydroxymethyl group, a cyano group and a cyanomethyl group are preferred.

Examples of the alkyl group of $R^1$ include an alkyl group having a carbon number of 1 to 4, such as methyl group, ethyl group, n-propyl group, i-propyl group, n-butyl group, 2-methylpropyl group, 1-methylpropyl group and tert-butyl group. Among these alkyl groups, a methyl group, an ethyl group, an n-propyl group and an i-propyl group are preferred.

Specific preferred examples include the following compounds.

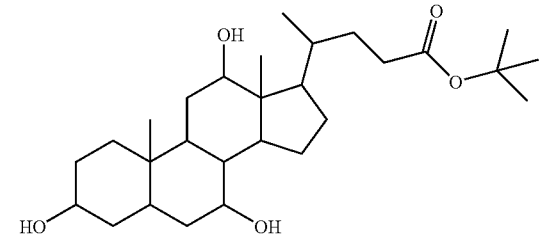
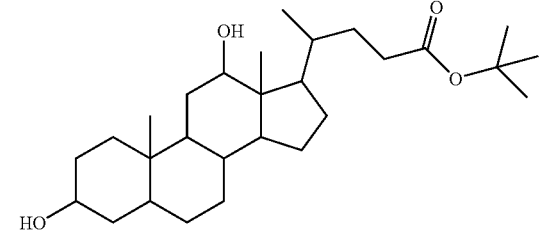
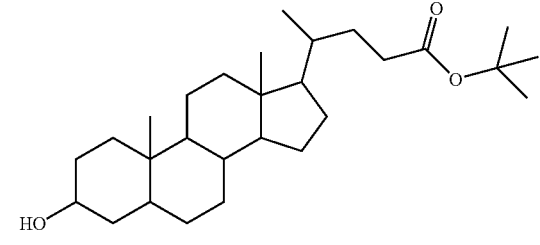
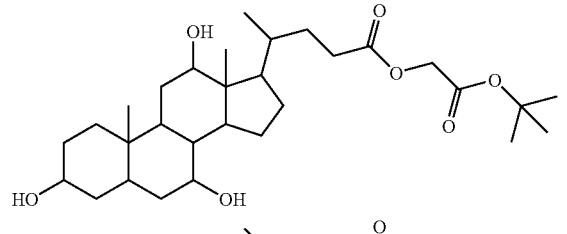
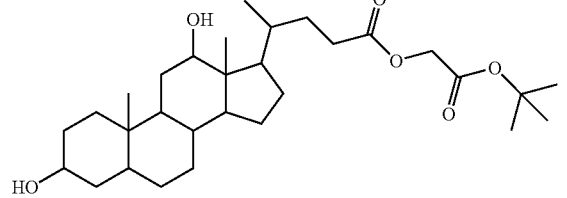
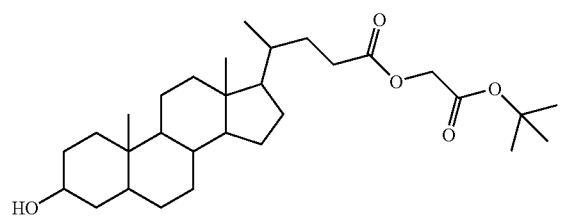
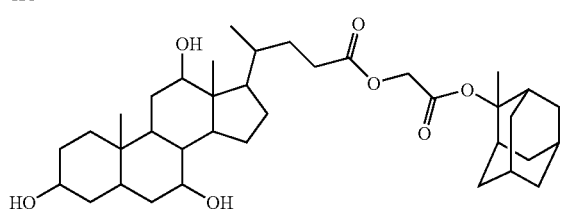

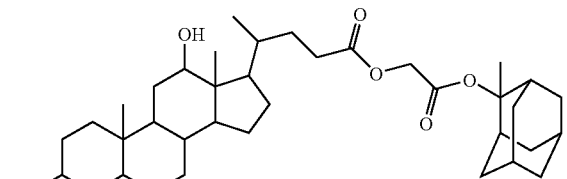
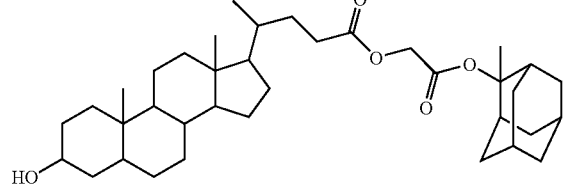
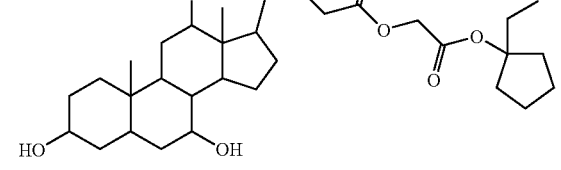
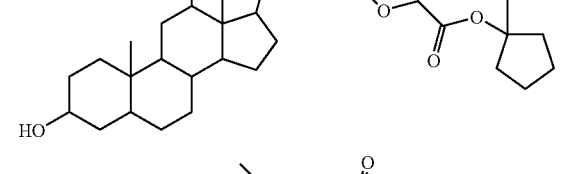
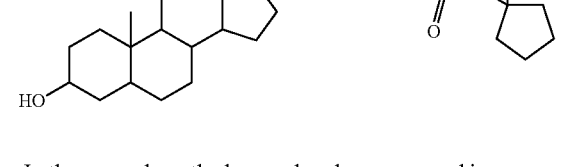
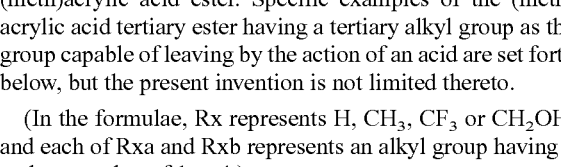

In the case where the low molecular compound is an unsaturated carboxylic acid ester, the compound is preferably a (meth)acrylic acid ester. Specific examples of the (meth)acrylic acid tertiary ester having a tertiary alkyl group as the group capable of leaving by the action of an acid are set forth below, but the present invention is not limited thereto.

(In the formulae, Rx represents H, CH$_3$, CF$_3$ or CH$_2$OH, and each of Rxa and Rxb represents an alkyl group having a carbon number of 1 to 4.)

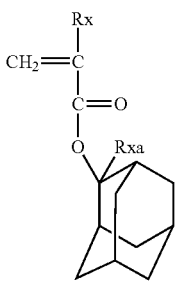

1

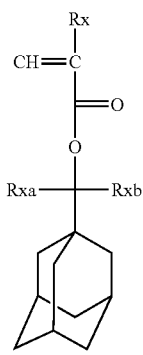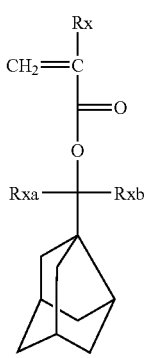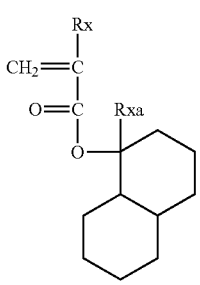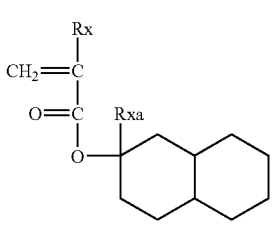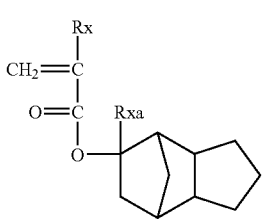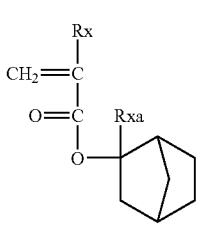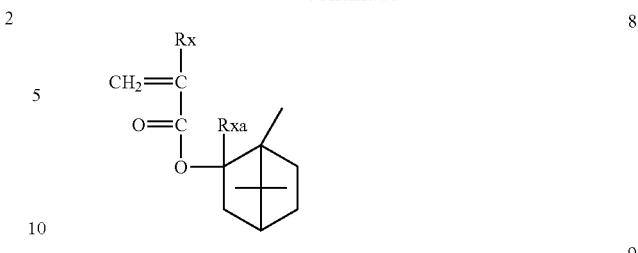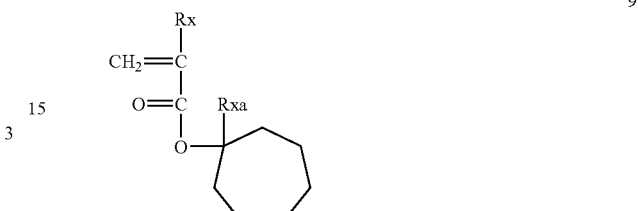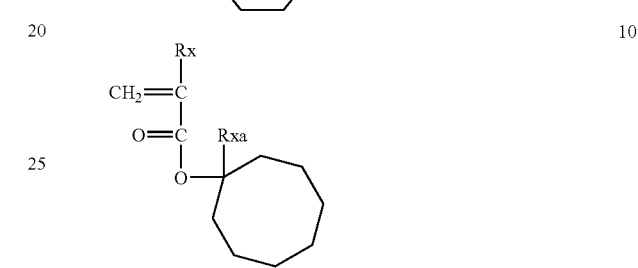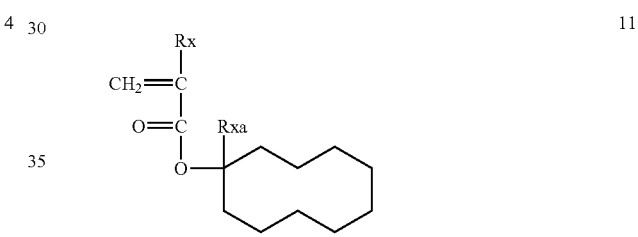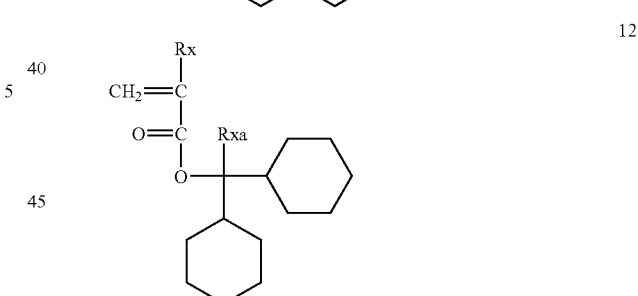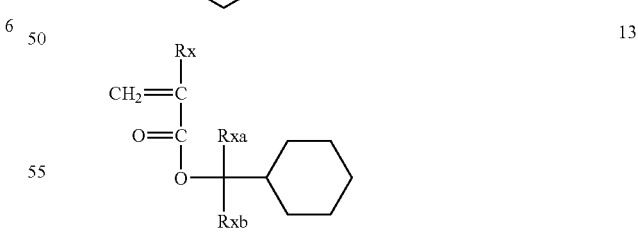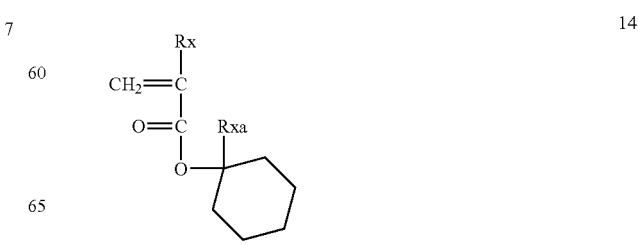

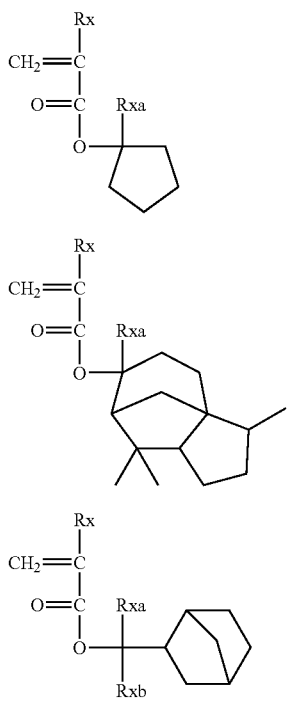

As for the (D) low molecular compound having a group capable of leaving by the action of an acid, a commercially available product may be used or the compound may be synthesized by a known method.

Also, the component D is preferably an amine derivative having on the nitrogen atom a group capable of leaving by the action of an acid, more preferably a compound having a structure represented by the following formula (A).

Incidentally, the component D may be a compound corresponding to the later-described basic compound as long as it is a low molecular compound having a group capable of decomposing by the action of an acid.

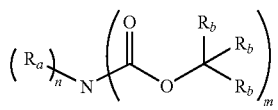

In formula (A), each Ra independently represents a hydrogen atom, an alkyl group, a cycloalkyl group, an aryl group or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group or an aralkyl group, provided that in —C(Rb)(Rb)(Rb), when one or more Rb is a hydrogen atom, at least one of the remaining Rb's is a cyclopropyl group or a 1-alkoxyalkyl group.

At least two Rb's may combine with each other to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (A), each of the alkyl group, cycloalkyl group, aryl group and aralkyl group of Ra and Rb may be substituted by a functional group such as hydroxyl group, cyano group, amino group, pyrrolidino group, piperidino group, morpholino group and oxo group, an alkoxy group or a halogen atom.

Examples of the alkyl group, cycloalkyl group, aryl group and aralkyl group (each of these alkyl, cycloalkyl, aryl and aralkyl groups may be substituted by the above-described functional group, an alkoxy group or a halogen atom) of Ra and Rb include:

a group derived from a linear or branched alkane such as methane, ethane, propane, butane, pentane, hexane, heptane, octane, nonane, decane, undecane and dodecane, or a group where the group derived from an alkane is substituted by one or more kinds of or one or more groups of cycloalkyl groups such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted by one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted by one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted by one or more kinds of or one or more groups of linear or branched alkyl groups or aromatic compound-derived groups; a group where the group derived from a linear or branched alkane or the group derived from a cycloalkane is substituted by one or more kinds of or one or more groups of aromatic compound-derived groups such as phenyl group, naphthyl group and anthracenyl group; and a group where the substituent above is substituted by a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydro quinoxaline, perhydroquinoline and 1,5,9-triazacyclododecane, and a group where the group derived from a heterocyclic compound is substituted by one or more kinds of or one or more groups of linear or branched alkane-derived groups, cycloalkane-derived groups, aromatic compound-derived groups, heterocyclic compound-derived group, and functional groups such as hydroxyl group, cyano group, amino group, pyrrolidino group, piperidino group, morpholino group and oxo group.

Specific examples particularly preferred in the present invention include N-tert-butoxycarbonyldi-n-octylamine, N-tert-butoxycarbonyldi-n-nonylamine, N-tert-butoxycarbonyldi-n-decylamine, N-tert-butoxycarbonyldicyclohexylamine, N-tert-butoxycarbonyl-1-adamantylamine, N-tert-butoxycarbonyl-2-adamantylamine, N-tert-butoxycarbonyl-N-methyl-1-adamantylamine, (S)-(−)-1-(tert-butoxycarbonyl)-2-pyrrolidinemethanol, (R)-(+)-1-(tert-butoxycarbonyl)-2-pyrrolidinemethanol, N-tert-butoxycarbonyl-4-hydroxypiperidine, N-tert-butoxycarbonylpyrrolidine, N-tert-butoxycarbonylmorpholine, N-tert-butoxycarbonylpiperazine, N,N-di-tert-butoxycarbonyl-1-adamantylamine, N,N-di-tert-butoxycarbonyl-N-methyl-1-adamantylamine, N-tert-butoxycarbonyl-4,4'-diaminodiphenylmethane, N,N'-di-tert-butoxycarbonylhexamethylenediamine, N,N,N',N'-tetra-tert-butoxycarbonylhexamethylenediamine, N,N'-di-tert-butoxycarbonyl-1,7-diaminoheptane, N,N'-di-tert-butoxycarbonyl-1,8-diaminooctane, N,N'-di-tert-butoxycarbonyl-1,9-diaminononane, N,N'-di-tert-butoxycarbonyl-1,10-diaminodecane, N,N'-di-tert-butoxycarbonyl-1,12-diaminododecane, N,N'-di-tert-butoxycarbonyl-4,4'-diaminodiphenylmethane, N-tert-butoxycarbonylbenzimidazole, N-tert-butoxycarbonyl-2-methylbenzimidazole and N-tert-butoxycarbonyl-2-phenylbenzimidazole.

The compound represented by formula (A) can be easily synthesized from a commercially available amine by a method described, for example, in Protective Groups in Organic Synthesis, 4th edition. A most general method is a method of causing a dicarbonic acid ester or a haloformic acid ester to act on a commercially available amine to obtain the compound. In the formulae, X represents a halogen atom, and Ra and Rb have the same meanings as those in formula (A).

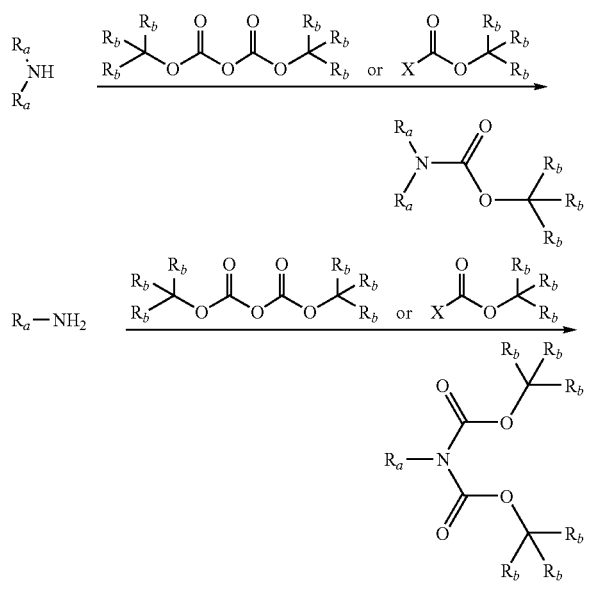

In the present invention, one kind of (D) a low molecular compound having a group capable of leaving by the action of an acid may be used alone, or two or more kinds of the compounds may be mixed and used.

In the present invention, the amount used of the (D) low molecular compound having a group capable of leaving by the action of an acid is usually from 0.001 to 20 mass %, preferably from 0.001 to 10 mass %, more preferably from 0.01 to 5 mass %, based on the entire solid compound of the composition combined with the later-described basic compound.

The ratio between an acid generator and (D) a low molecular compound having a group capable of leaving by the action of an acid, which are used in the composition, is preferably an acid generator/[(D) a low molecular compound having a group capable of leaving by the action of an acid+the later-described basic compound] (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The ratio of an acid generator/[(D) a low molecular compound having a group capable of leaving by the action of an acid+the later-described basic compound] (by mol) is more preferably from 5.0 to 200, still more preferably from 7.0 to 150.

[3] Acid Generator (A)

The actinic ray-sensitive or radiation-sensitive resin composition of the present invention (hereinafter, sometimes simply referred to as the "composition") contains a compound capable of generating an acid upon irradiation with an actinic ray or radiation.

The photo-acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for a microresist and the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the acid generators, preferred compounds include compounds represented by the following formulae (ZI), (ZII) and (ZIII):

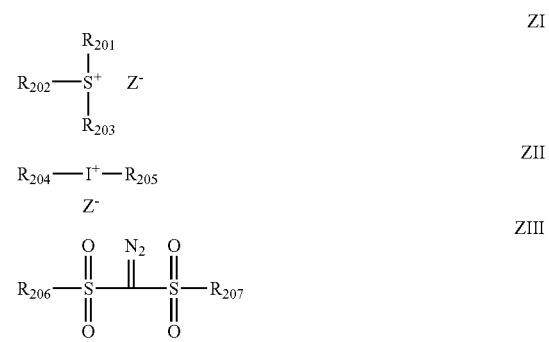

In formula (ZI), each of $R_{201}$, $R_{202}$ and $R_{203}$ independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction, and this anion can suppress decomposition with aging due to an intramolecular nucleophilic reaction. Thanks to this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

Examples of the aliphatic moiety in the aliphatic carboxylate anion include the same alkyl groups and cycloalkyl groups as in the aliphatic sulfonate anion.

Examples of the aromatic group in the aromatic carboxylate anion include the same aryl groups as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Each of the alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same halogen atoms, alkyl groups, cycloalkyl groups, alkoxy groups and alkylthio groups as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a fluorine atom-containing group, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl)benzenesulfonate anion.

The non-nucleophilic anion of $Z^-$ may also be a structure represented by the following formula (Xa) or (Xb):

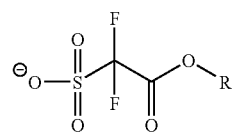
(Xa)

In formula (Xa), R represents a hydrogen atom or an organic group and is preferably an organic group having a carbon number of 1 to 40, more preferably an organic group having a carbon number of 3 to 20, and most preferably an organic group represented by the following formula (XI).

The organic group of R is sufficient if it has one or more carbon atoms. The organic group is preferably an organic group where the atom bonded to the oxygen atom in the ester bond shown in formula (Xa) is a carbon atom, and examples thereof include an alkyl group, a cycloalkyl group, an aryl group, an aralkyl group and a group having a lactone structure. The organic group may contain a heteroatom such as oxygen atom and sulfur atom in the chain. Also, one of these groups may have another as a substituent, or the organic group may have a substituent such as hydroxyl group, acyl group, acyloxy group, oxy group (=O) or halogen atom.

—$(CH_2)_n$-Rc-$(Y)_m$ (XI)

In formula (XI), Rc represents a monocyclic or polycyclic organic group having a carbon number of 3 to 30, which may contain a cyclic ether, cyclic thioether, cyclic ketone, cyclic carbonic acid ester, lactone or lactam structure. Y represents a hydroxyl group, a halogen atom, a cyano group, a carboxyl group, a hydrocarbon group having a carbon number of 1 to 10, a hydroxyalkyl group having a carbon number of 1 to 10, an alkoxy group having a carbon number of 1 to 10, an acyl group having a carbon number of 1 to 10, an alkoxycarbonyl group having a carbon number of 2 to 10, an acyloxy group having a carbon number of 2 to 10, an alkoxyalkyl group having a carbon number of 2 to 10, or an alkyl halide group having a carbon number of 1 to 8. m is from 0 to 6, and when a plurality of Y's are present, each Y may be the same as or different from every other Y. n is from 0 to 10.

The total number of carbon atoms constituting the R group represented by formula (XI) is preferably 40 or less.

It is preferred that n is from 0 to 3 and Rc is a monocyclic or polycyclic organic group having a carbon number of 7 to 16.

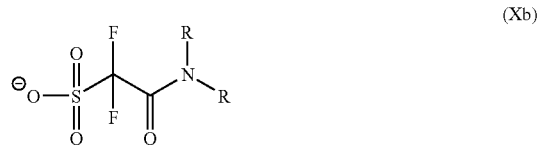

(Xb)

In formula (Xb), R represents a hydrogen atom or a polycyclic skeleton-free organic group and is preferably a hydrogen atom or a polycyclic skeleton-free organic group having a carbon number of 1 to 40, more preferably a hydrogen atom or a polycyclic skeleton-free organic group having a carbon number of 3 to 20. R's may be different from each other and may combine together to form a ring. The organic group of R is sufficient if it has one or more carbon atoms. The organic group is preferably an organic group where the atom bonded to the nitrogen atom in the amide bond shown in formula (Xb) is a carbon atom, and examples thereof include an alkyl group, a cycloalkyl group, an aryl group, an aralkyl group and a lactone structure-containing group, each having no polycyclic skeleton. The organic group may contain a heteroatom such as oxygen atom and sulfur atom in the chain. Also, one of these groups may have another as a substituent, or the organic group may have a substituent such as hydroxyl group, acyl group, acyloxy group, oxy group (=O) or halogen atom.

The molecular weight of the non-nucleophilic anion moiety represented by formula (Xa) or (Xb) is generally from 300 to 1,000, preferably from 400 to 800, more preferably from 500 to 700.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, a compound having a structure where at least one of $R_{201}$ to $R_{203}$ in a compound represented by formula (ZI) is bonded to at least one of $R_{201}$ to $R_{203}$ in another compound represented by formula (ZI).

More preferred compounds as the component (ZI) include compounds (ZI-1), (ZI-2) and (ZI-3) described below.

The compound (ZI-1) is an arylsulfonium compound where at least one of $R_{201}$ to $R_{203}$ in formula (ZI) is an aryl group, that is, a compound having arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group foamed by removing one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

Each of the aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, having a carbon number of 1 to 5), a hydroxyl group, a cyano group or a nitro group.

The compound (ZI-3) is a compound represented by the following formula (ZI-3), and this is a compound having a phenacylsulfonium salt structure.

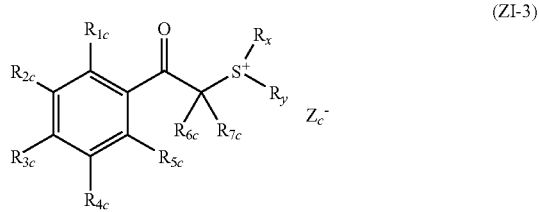

(ZI-3)

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine with each other to form a ring structure. This ring structure may contain an oxygen atom, a sulfur atom, an ester bond or an amide bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

Examples of the alkyl group and cycloalkyl group as $R^x$ and $R_y$ include the same alkyl groups and cycloalkyl groups as in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group of $R_{1c}$ to $R_{7c}$.

Examples of the alkoxy group in the alkoxycarbonylmethyl group include the same alkoxy groups as in $R_{1c}$ to $R_{5c}$.

Each of $R_x$ and $R_y$ is preferably an alkyl or cycloalkyl group having a carbon number of 4 or more, more preferably 6 or more, still more preferably 8 or more.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

Each of the aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

Z⁻ represents a non-nucleophilic anion, and examples thereof are the same as those of the non-nucleophilic anion of Z⁻ in formula (ZI).

Other examples of the acid generator include compounds represented by the following formulae (ZIV), (ZV) and (ZVI):

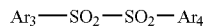
ZIV

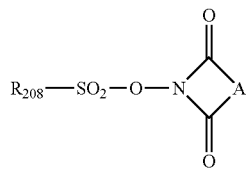
ZV

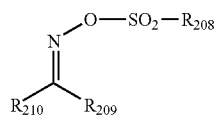
ZVI

In formulae (ZIV) to (ZVI), each of $Ar_3$ and $Ar_4$ independently represents an aryl group. Each of $R_{208}$, $R_{209}$ and $R_{210}$ independently represents an alkyl group, a cycloalkyl group or an aryl group.

A represents an alkylene group, an alkenylene group or an arylene group.

Among the acid generators, more preferred are the compounds represented by formulae (ZI) to (ZIII).

The acid generator is preferably a compound capable of generating an acid having one sulfonic acid group or imide group, more preferably a compound capable of generating a monovalent perfluoroalkanesulfonic acid, a compound capable of generating an aromatic sulfonic acid substituted by a monovalent fluorine atom or a fluorine atom-containing group, or a compound capable of generating an imide acid substituted by a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound capable of generating a fluoro-substituted alkanesulfonic acid, a fluoro-substituted benzenesulfonic acid or a fluoro-substituted imide acid, where pKa of the acid generated is pKa=−1 or less, and in this case, the sensitivity is enhanced.

Out of the acid generators, particularly preferred examples are set forth below.

(z1)
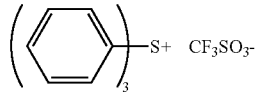

(z2)
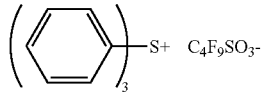

(z3)
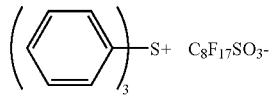

(z4)
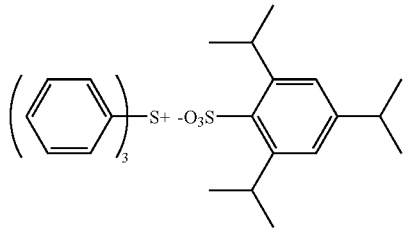

(z5)
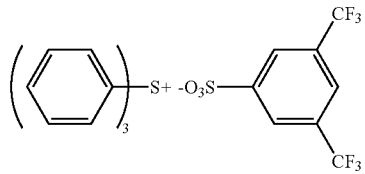

(z6)
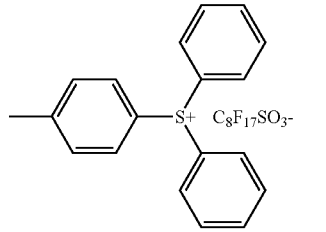

(z7)
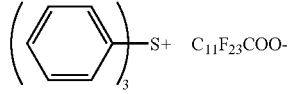

(z8)
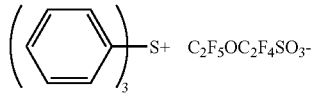

(z9)
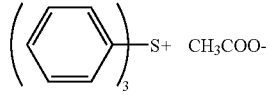

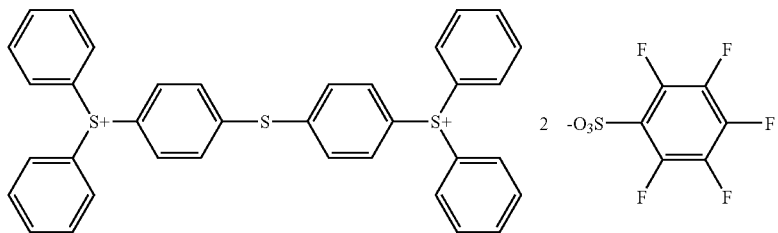
(z10)
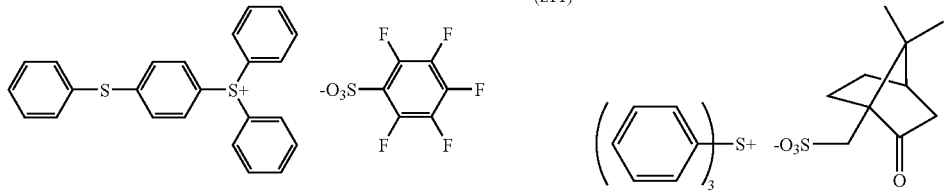
(z11) (z12)
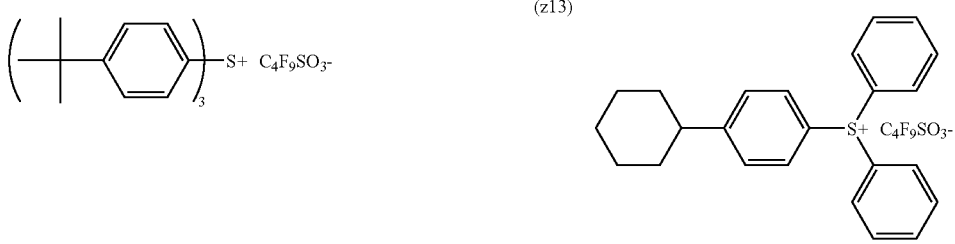
(z13) (z14)
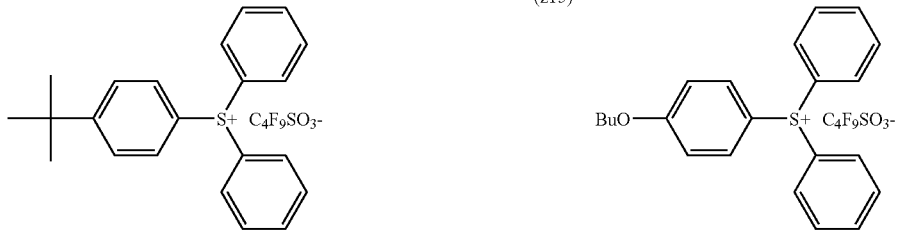
(z15) (z16)
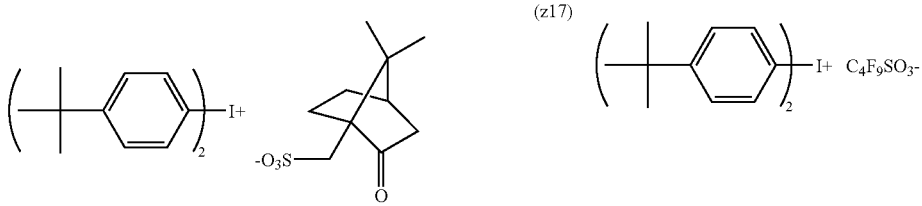
(z17) (z18)
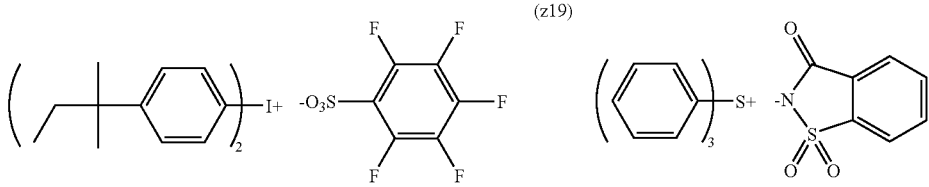
(z19) (z20)
(z21) (z22)
(z23) (z24)

-continued
(z25) 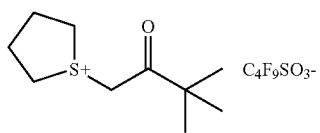
(z26) 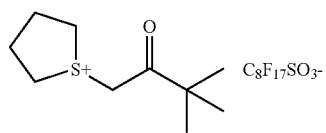
(z27) 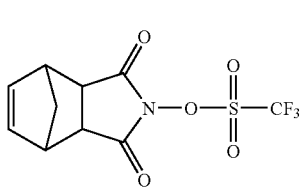
(z28) 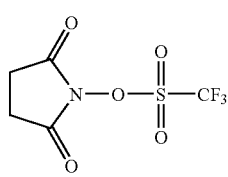
(z29) 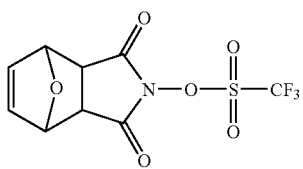
(z30) 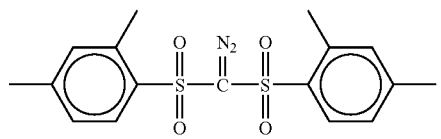
(z31) 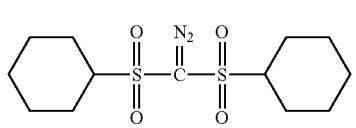
(z32) 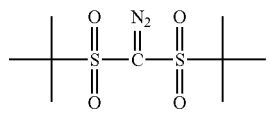
(z33) 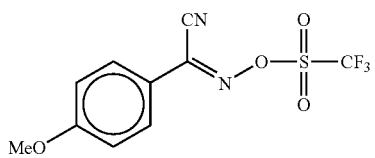
(z34) 
(z35) 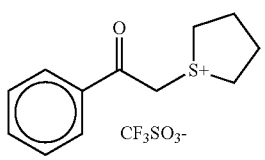
(z36) 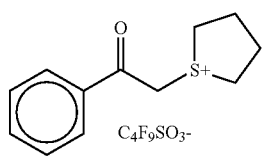
(z37) 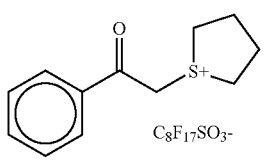
(z38) 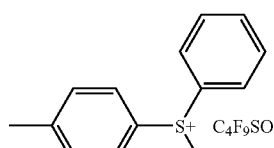
(z39) 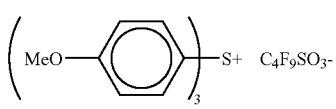
(z40) 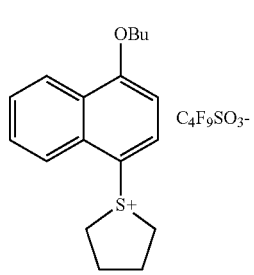

-continued
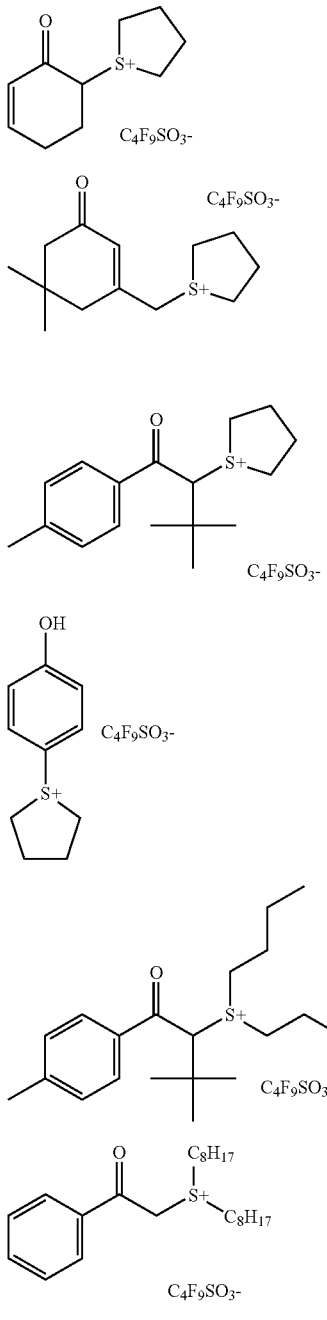
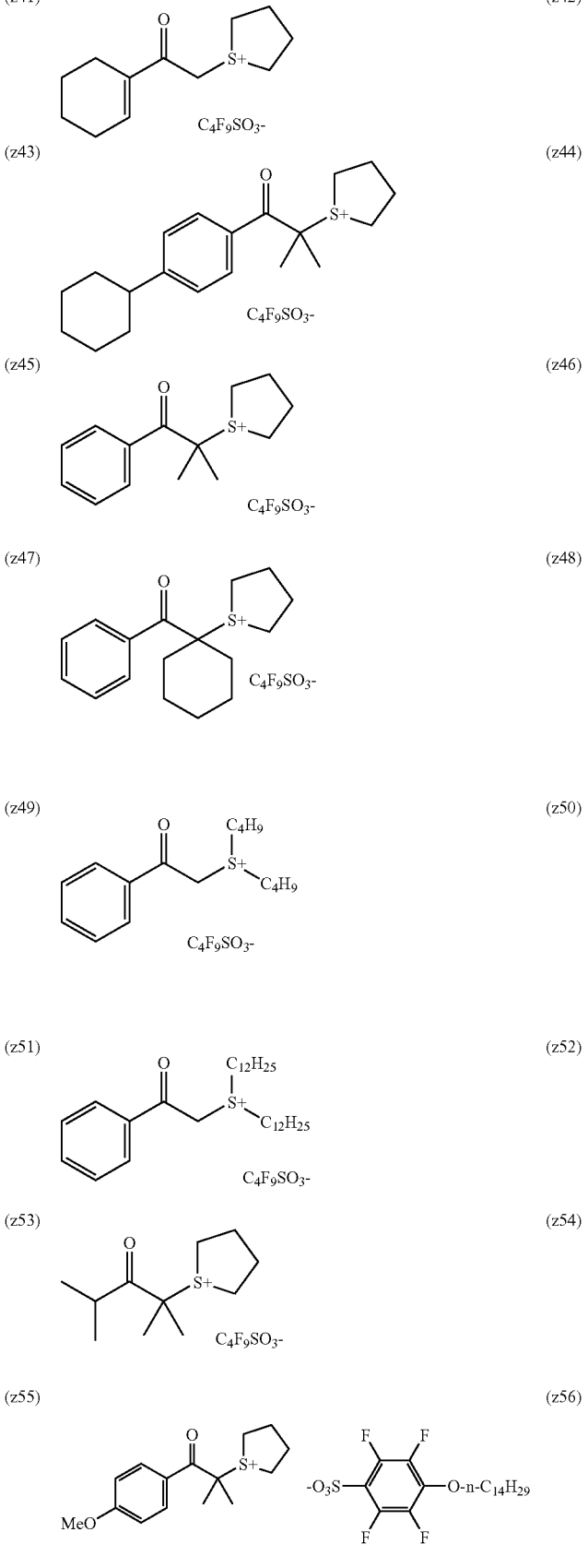

-continued
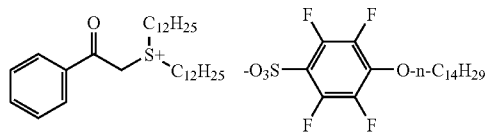 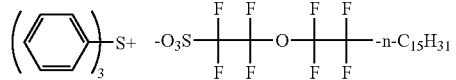
(z57) (z58)
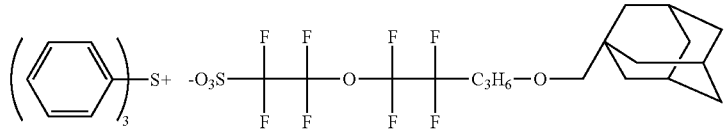
(z59)
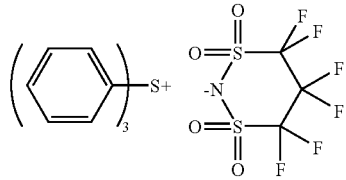 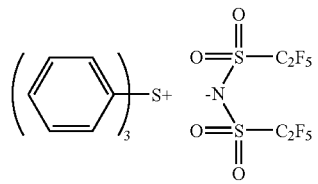
(z60) (z61)
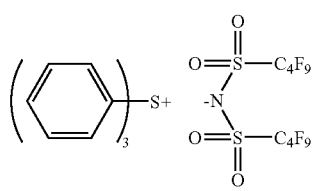 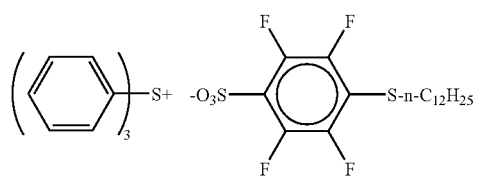
(z62) (z63)
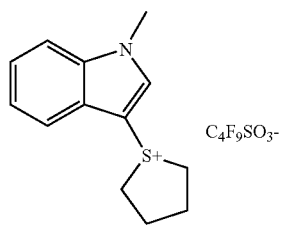 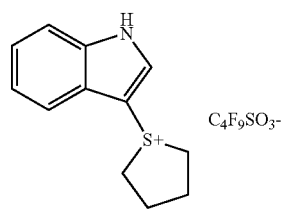
(z64) (z65)
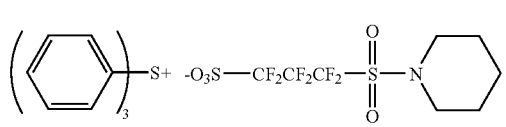 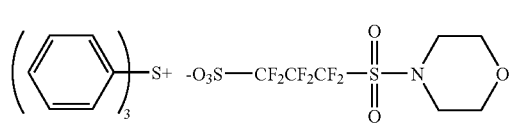
(z66) (z67)
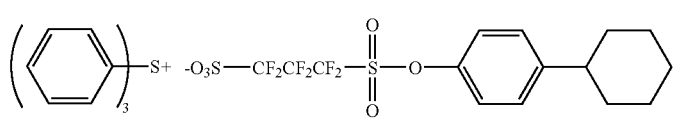
(z68)
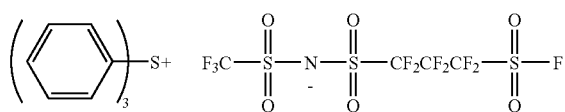
(z69)
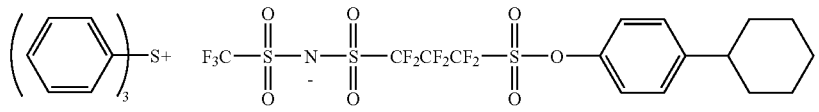
(z70) (z71)
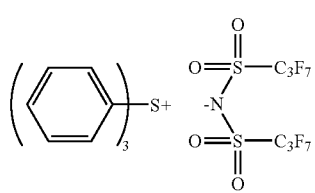 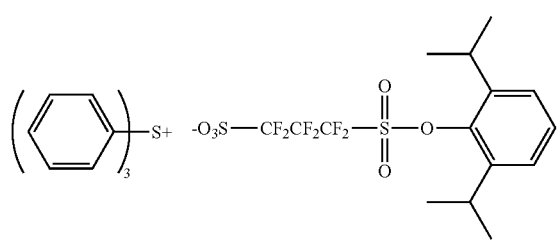
(z72)

-continued
(z73) 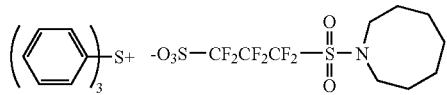
(z74) 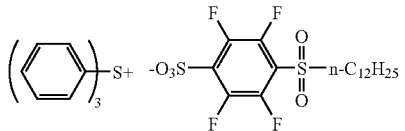
(z75) 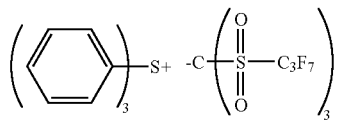
(z76) 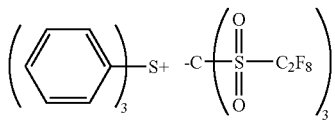
(z77) 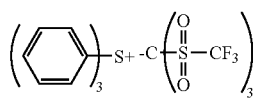
(z78) 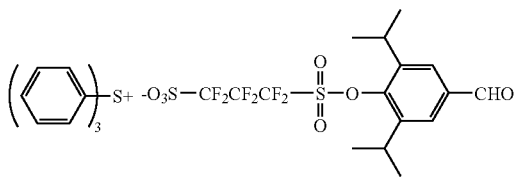
(z79) 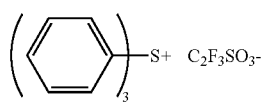
(z80) 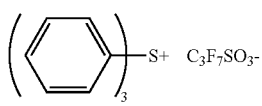
(z81) 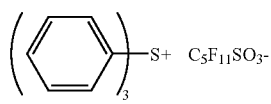
(z82) 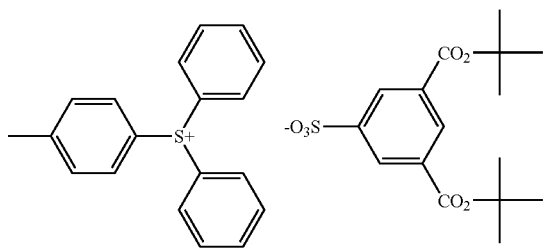
(z83) 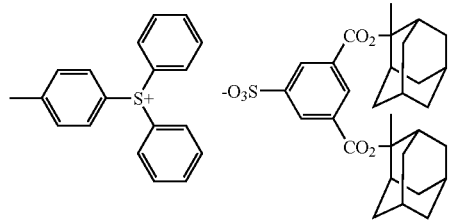
(z84) 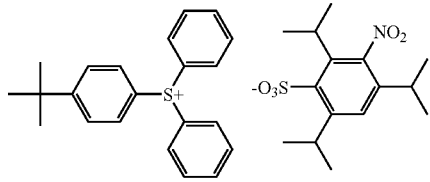
(z85) 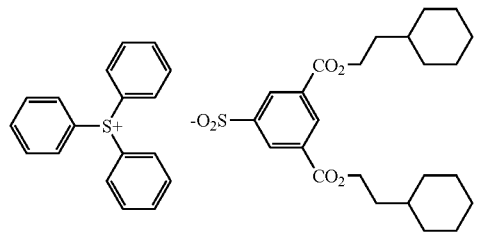
(z86) 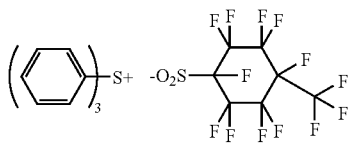
(z87) 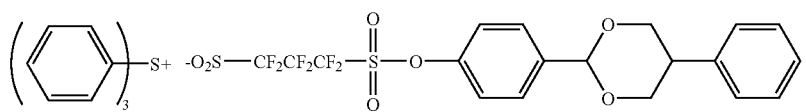
(z88) 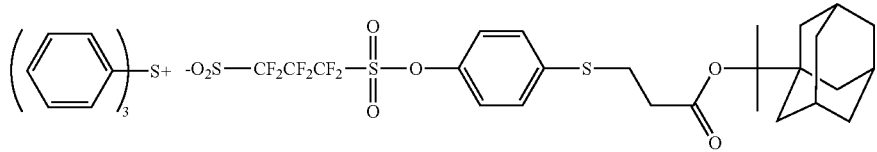

-continued
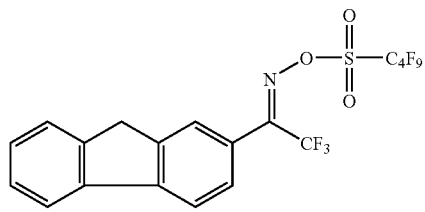
(z89)
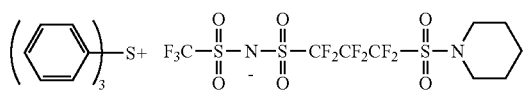
(z90)
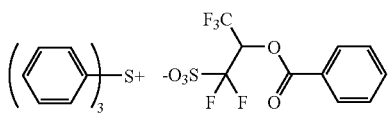
(z91)
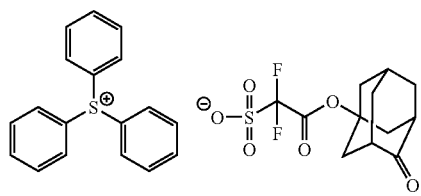
(Y-1)
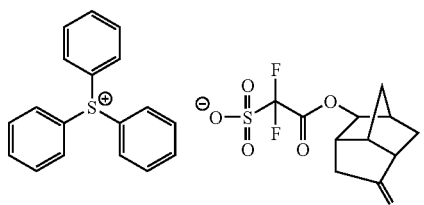
(Y-2)
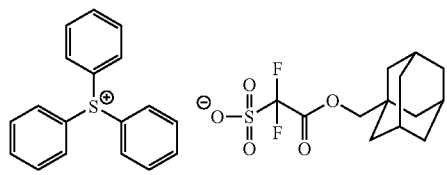
(Y-3)
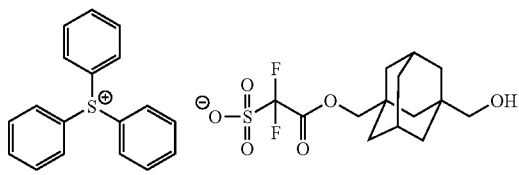
(Y-4)
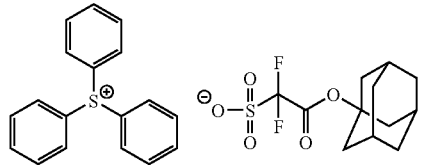
(Y-5)
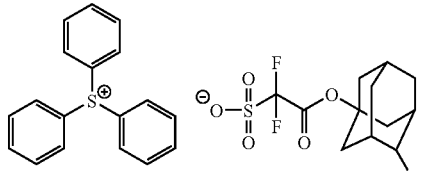
(Y-6)
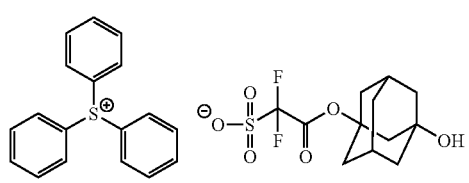
(Y-7)
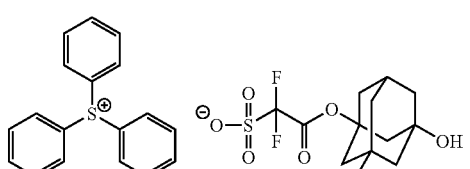
(Y-8)
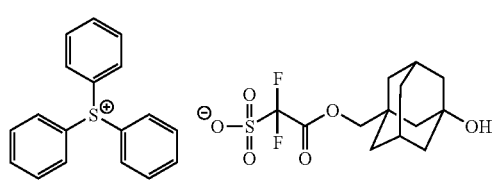
(Y-9)
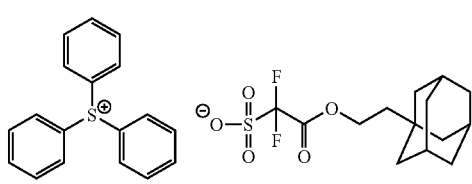
(Y-10)
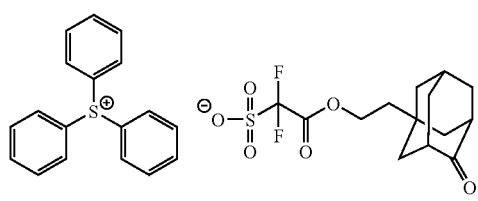
(Y-11)
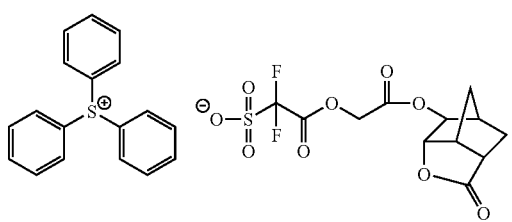
(Y-12)

-continued
(Y-13) 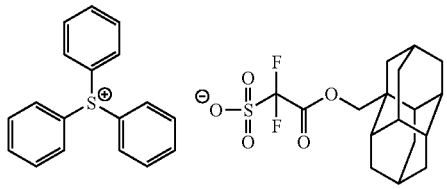
(Y-14) 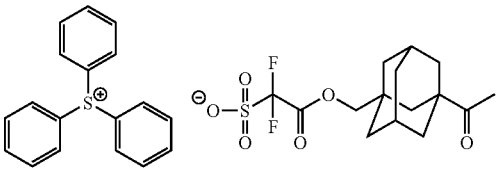
(Y-15) 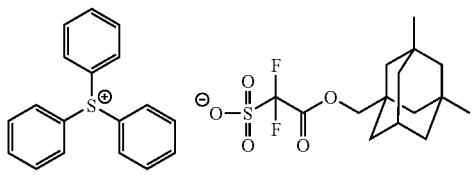
(Y-16) 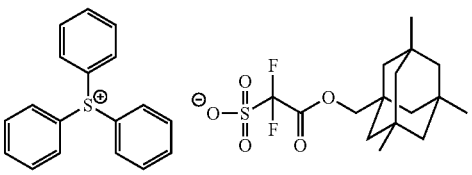
(Y-17) 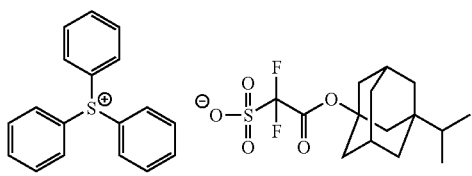
(Y-18) 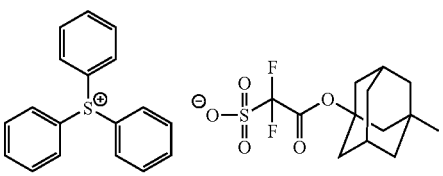
(Y-19) 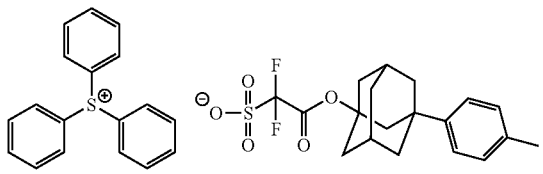
(Y-20) 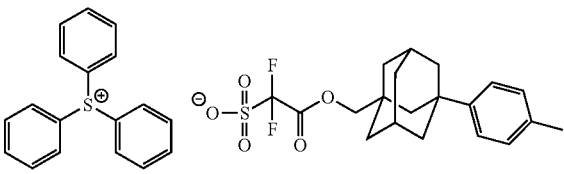
(Y-21) 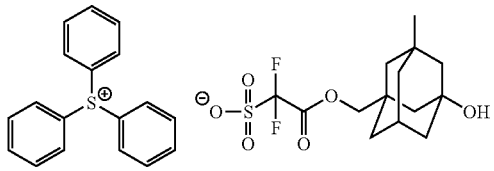
(Y-22) 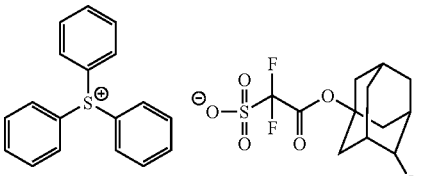
(Y-23) 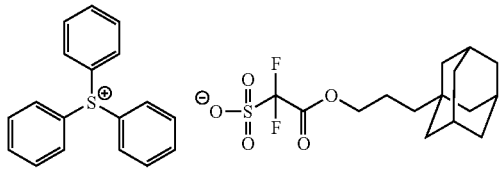
(Y-24) 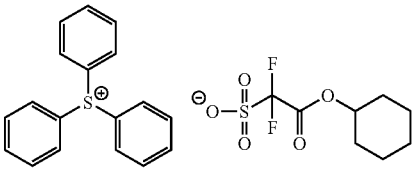
(Y-25) 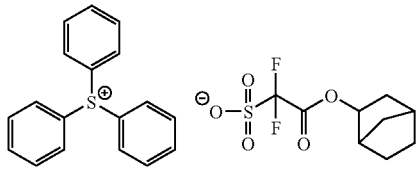
(Y-26) 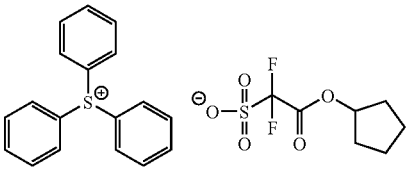
(Y-27) 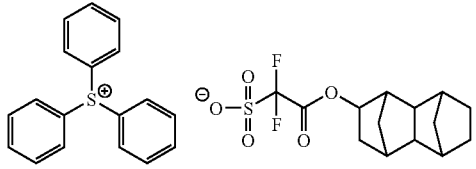
(Y-28) 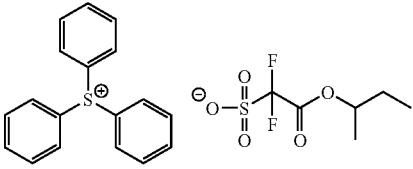

(Y-29) 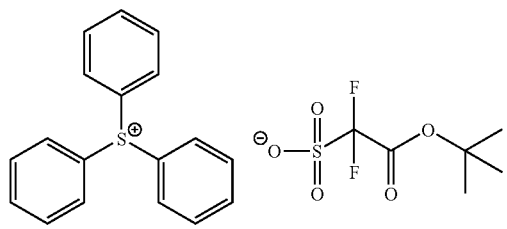
(Y-30) 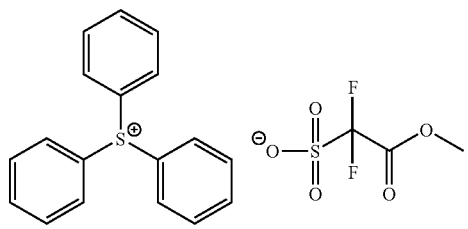
(Y-31) 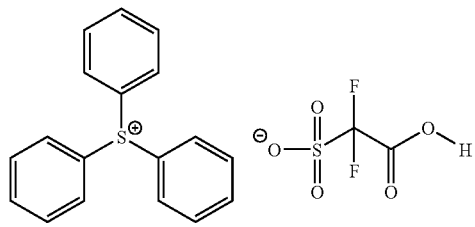
(Y-32) 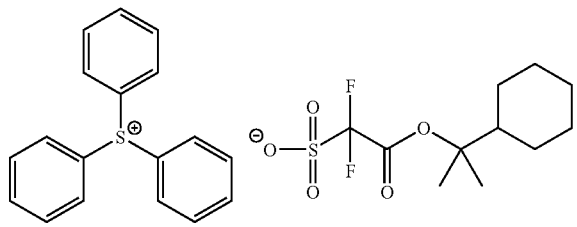
(Y-33) 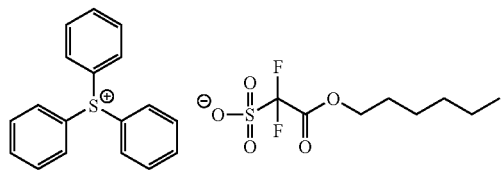
(Y-34) 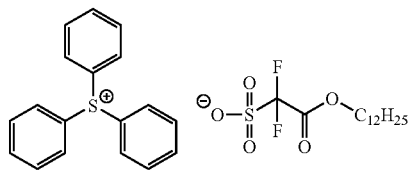
(Y-35) 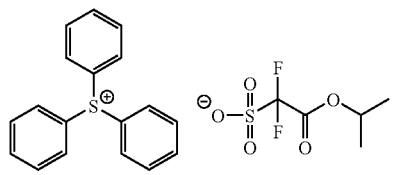
(Y-36) 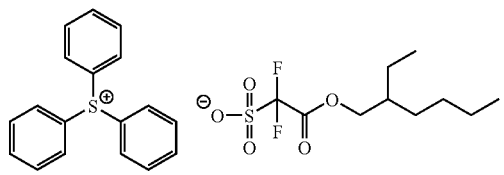
(Y-37) 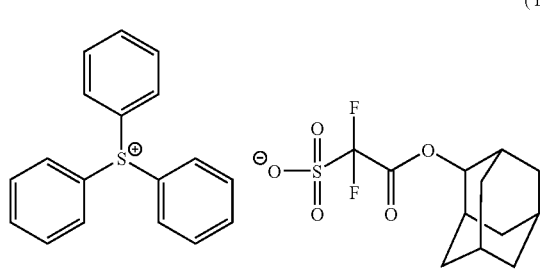
(Y-38) 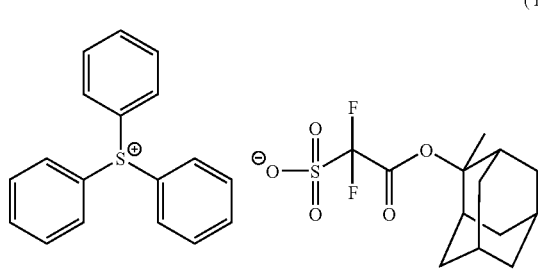
(Y-39) 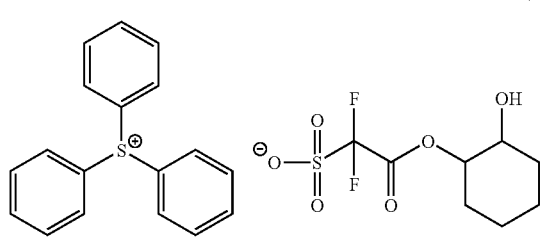
(Y-40) 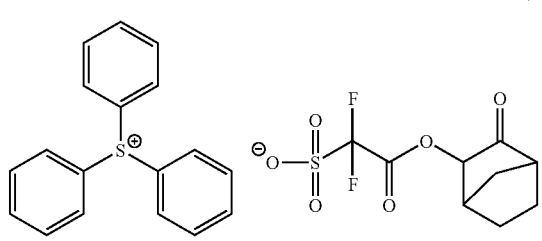
(Y-41) 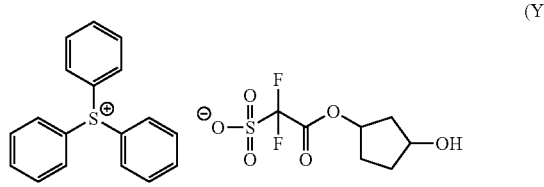
(Y-42) 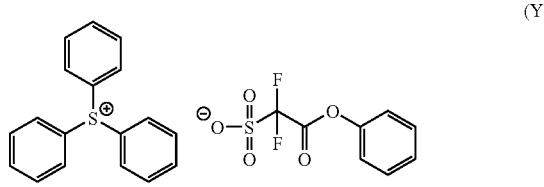

-continued
(Y-43)
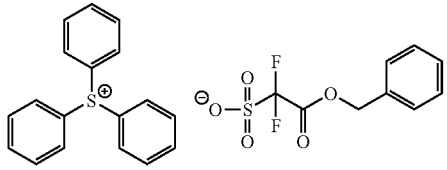
(Y-44)
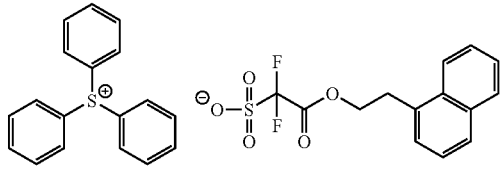
(Y-45)
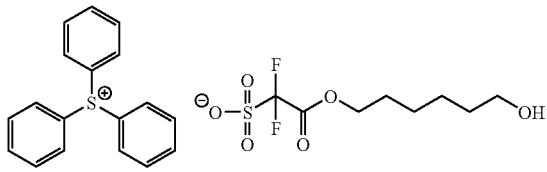
(Y-46)
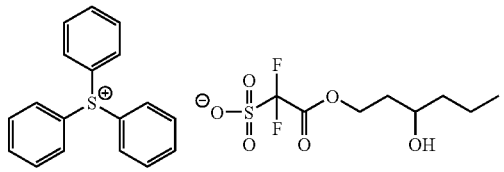
(Y-47)
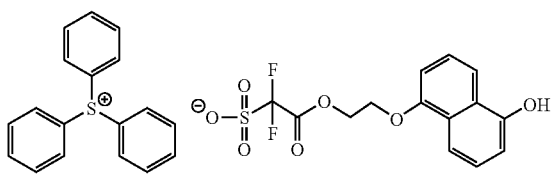
(Y-48)
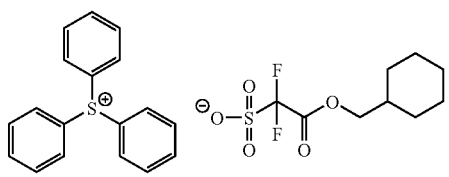
(Y-49)
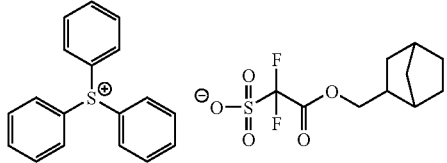
(Y-50)
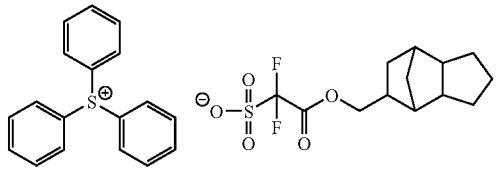
(Y-51)
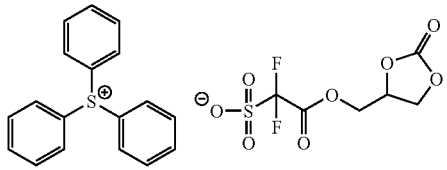
(Y-52)
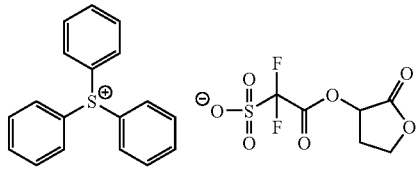
(Y-53)
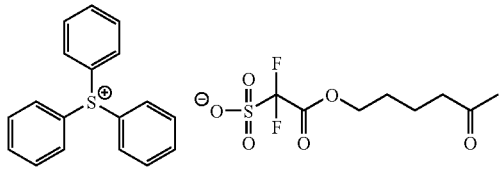
(Y-54)
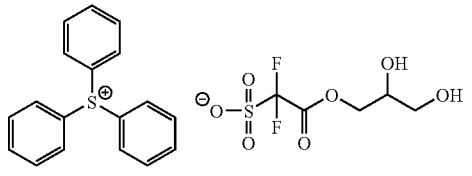
(Y-55)
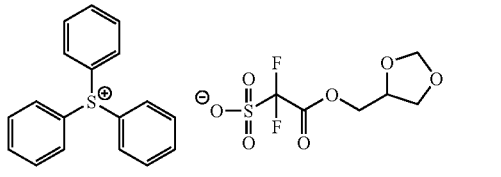
(Y-56)
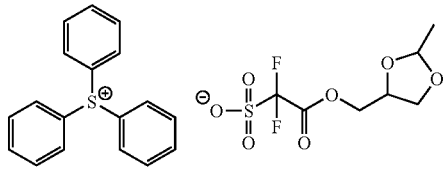
(Y-57)
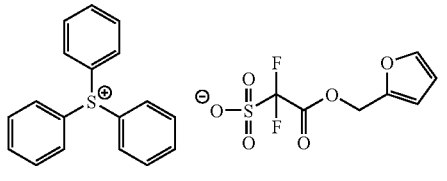
(Y-58)
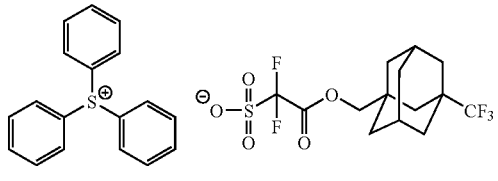

-continued
(Y-59) 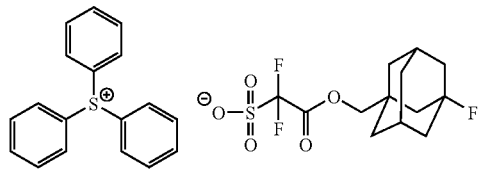
(Y-60) 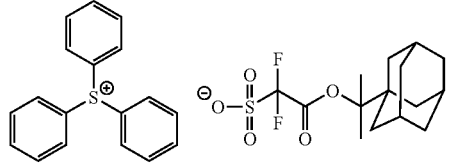
(Y-61) 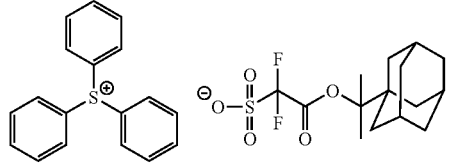
(Y-62) 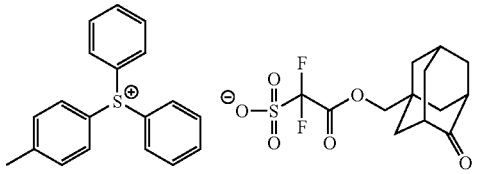
(Y-63) 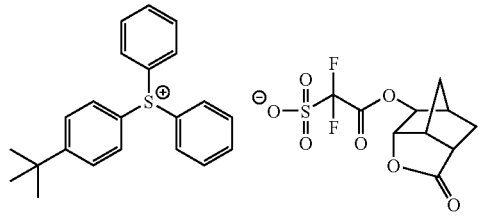
(Y-64) 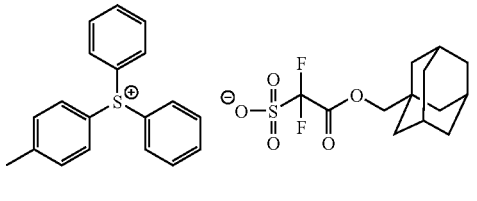
(Y-65) 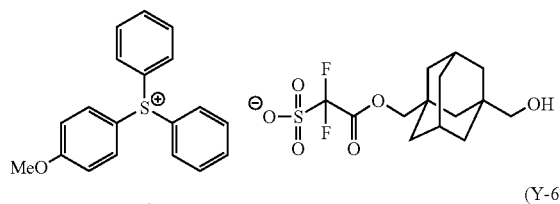
(Y-66) 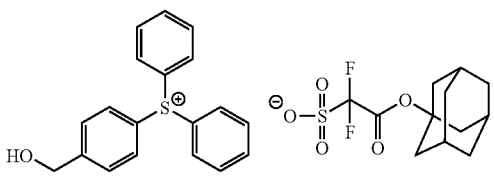
(Y-67) 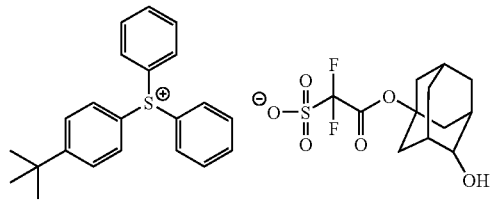
(Y-68) 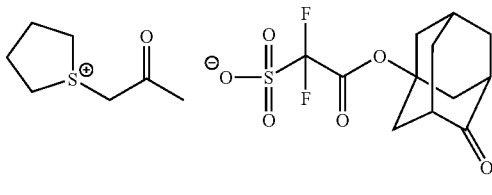
(Y-69) 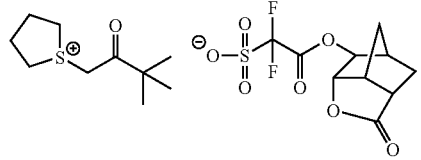
(Y-70) 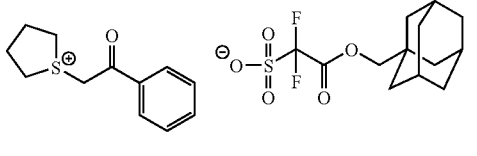
(Y-71) 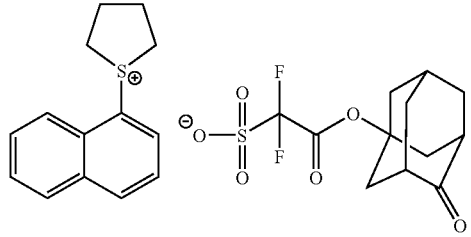
(Y-72) 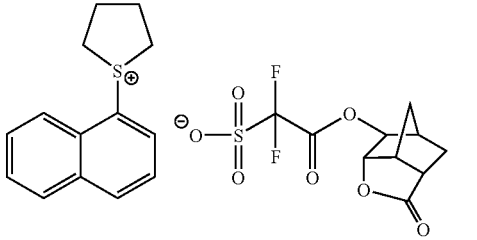
(Y-73) 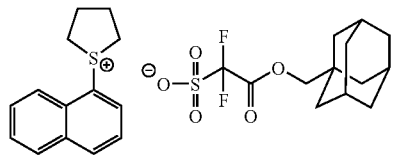
(Y-74) 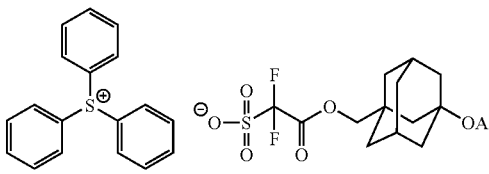

-continued

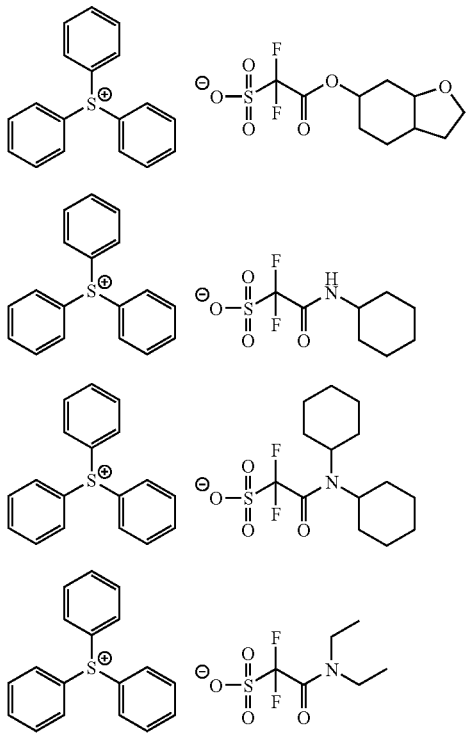

(Y-75)
(Y-77)
(Y-79)
(Y-81)

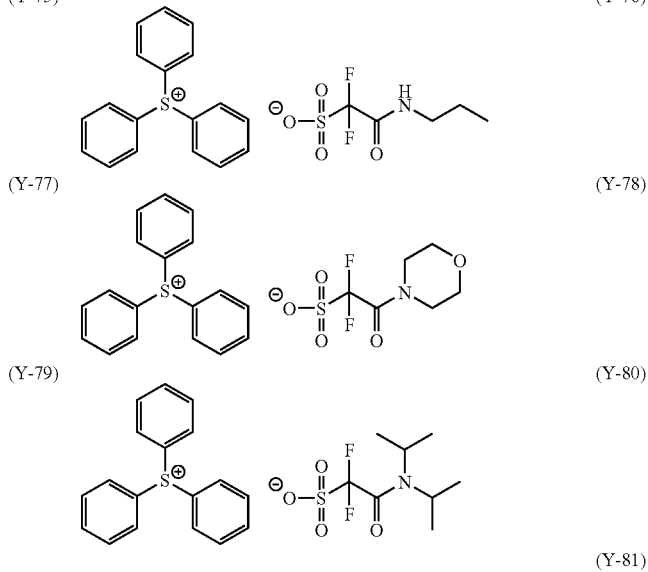

(Y-76)
(Y-78)
(Y-80)

In the present invention, the (A) compound capable of generating an acid upon irradiation with an actinic ray or radiation is preferably a compound capable of generating an acid represented by the following formula (I-A), (I-B), (I-C) or (I-D) upon irradiation with an actinic ray or radiation.

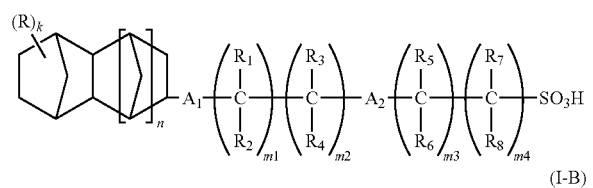

(I-A)

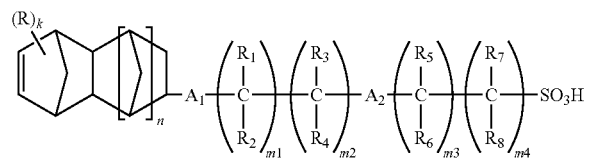

(I-B)

(I-C)

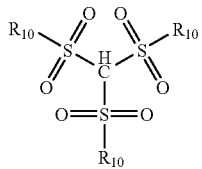

(I-D)

In formulae (I-A) and (I-B), each of $R_1$ to $R_8$ independently represents a hydrogen atom, an alkyl group, a cycloalkyl group, a halogen atom or a hydroxyl group, provided that at least one of $R_1$ to $R_8$ is a fluorine atom or a fluorine atom-containing group.

Each of $A_1$ and $A_2$ independently represents a divalent linking group or a single bond.

R represents a substituent, and when a plurality of R's are present, two or more R's may combine with each other to form a ring.

k represents an integer of 0 to 5, n represents an integer of 0 to 5, and each of m1 to m4 independently represents an integer of 0 to 12, provided that at least one of m1 to m4 is an integer of 1 or more.

Examples of the divalent linking group of $A_1$ and $A_2$ include —O—, —S—, a carbonyl group, an ester group, a sulfinyl group, a sulfonyl group, a methylene group, a 1,1-ethylene group, a 1,2-ethylene group, a propylene group, a 1-methylpropylene group, a 1-ethylpropylene group, a trimethylene group, a difluoromethylene group, a tetrafluoro-1,2-ethylene group, a 1,2-phenylene group, a 1,3-phenylene group and a 1,4-phenylene group. Among these divalent groups, a carbonyl group, an ester group, a methylene group, a difluoromethylene group and a tetrafluoro-1,2-ethylene group are preferred.

Examples of the substituent of R include an oxo group (=O), a hydroxyl group, a carboxyl group, a formyl group, an alkyl group (linear or branched, preferably having a carbon number of 1 to 10), a vinylidene group (linear or branched, preferably having a carbon number of 1 to 10), a monovalent cyclic organic group (preferably having a carbon number of 1 to 12), an aryl group (preferably having a carbon number of 6 to 20), an alkoxy group (linear or branched, preferably having a carbon number of 1 to 10), an aryloxy group (preferably having a carbon number of 6 to 20), an alkylcarbonyl group (linear or branched, preferably having a carbon number of 2 to 10), an arylcarbonyl group (preferably having a carbon number of 7 to 20), an alkoxycarbonyl group (linear or branched, preferably having a carbon number of 1 to 10) and an aryloxycarbonyl group (preferably having a carbon number of 7 to 20).

The substituent of R is preferably an oxo group (=O), an alkyl group, an alkoxy group, an alkylcarbonyl group (linear or branched, preferably having a carbon number of 2 to 10) or an alkoxycarbonyl group.

Examples of the alkyl group include a methyl group, an ethyl group, an n-propyl group, an i-propyl group, an n-butyl group, a tert-butyl group, an n-pentyl group, an n-hexyl group, an n-heptyl group, an n-octyl group, an n-nonyl group and an n-decyl group.

Examples of the vinylidene group include a carbenzyl group, a 1,1-ethylidenyl group, a propylidenyl group, a 1-methylpropylidenyl group and a 1-ethylpropylidenyl group.

Examples of the monovalent cyclic organic group include a cyclopentyl group, a cyclohexyl group, an adamantyl group, a norbornyl group and camphoroyl group.

Examples of the aryl group include a phenyl group, an o-tolyl group, an m-tolyl group, a p-tolyl group, a p-hydroxyphenyl group, a 1-naphthyl group, a 1-anthracenyl group and a benzyl group.

Examples of the alkoxy group include a methoxy group, an ethoxy group, an n-propoxy group, an i-propoxy group, an n-butoxy group and a tert-butoxy group.

Examples of the aryloxy group having a carbon number of 6 to 20 include a phenoxy group, a p-hydroxyphenoxy group, an o-tolyloxy group, an m-tolyloxy group and a p-tolyloxy group.

Examples of the alkylcarbonyl group include a methylcarbonyl group, an ethylcarbonyl group, an n-propylcarbonyl group, an i-propylcarbonyl group, an n-butylcarbonyl group and a tert-butylcarbonyl group.

Examples of the arylcarbonyl group include a phenylcarbonyl group and a benzylcarbonyl group.

Examples of the alkoxycarbonyl group include a methoxycarbonyl group, an ethoxycarbonyl group, an n-propoxycarbonyl group, an i-propoxycarbonyl group, an n-butoxycarbonyl group and a tert-butoxycarbonyl group.

Examples of the aryloxycarbonyl group include a phenoxycarbonyl group and a benzyloxycarbonyl group. These substituents may further have an arbitrary substituent, for example, one or more of the above-mentioned substituents.

R may be bonded to any of the carbon atoms constituting the norbornene ring or norbornane ring in each formula, and when a plurality of R's are present, each may be the same as or different from every other R. Also, when a plurality of R's are present, two or more R's may combine with each other to form a ring. That is, at least two or more R's may combine with each other to form a ring together with the carbon atoms to which they are bonded.

k is preferably 0, and n is preferably 0 or 1.

Of the structure represented by formula (I-A) and the structure represented by formula (I-B), the structure represented by formula (I-A) is preferred in view of absorption strength at a wavelength of 193 nm or the like.

Preferred examples of the acids represented by formulae (I-A) or (I-B) include structures shown by the following formulae.

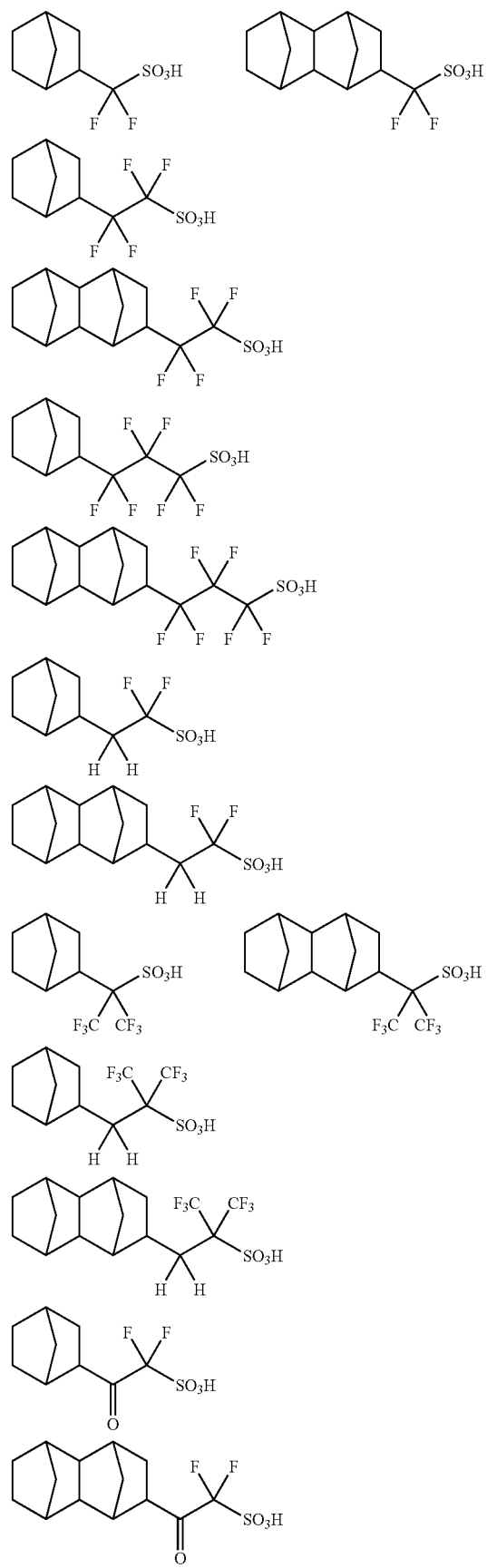

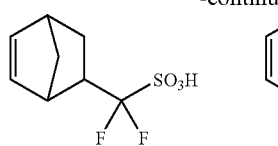
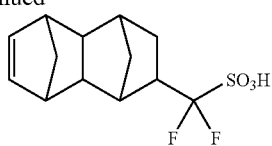
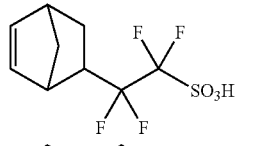
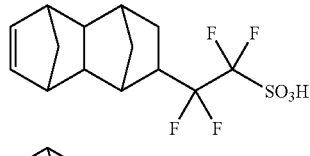
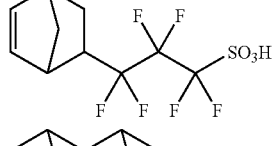
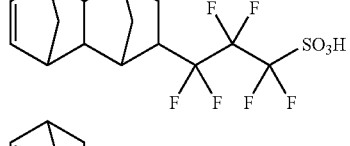
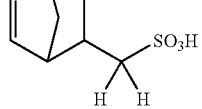
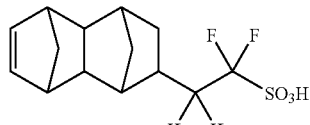
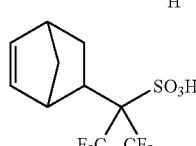
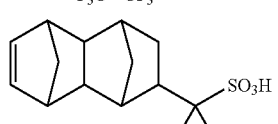
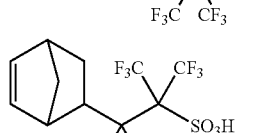
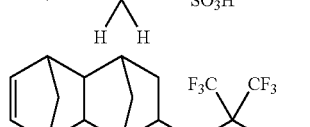
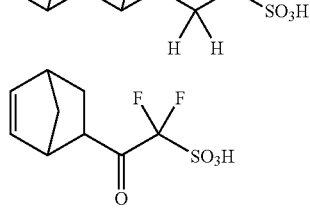
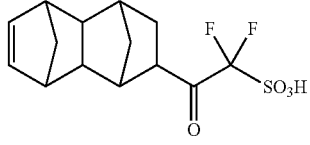
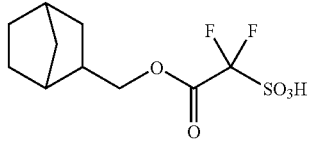
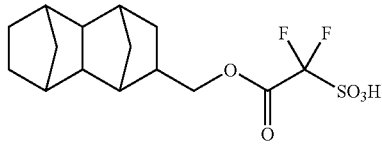
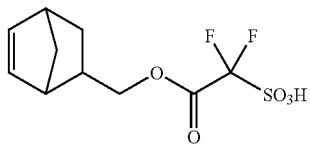
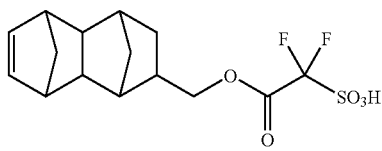
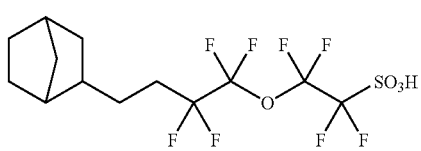
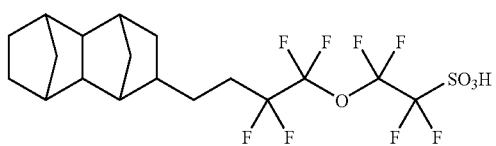
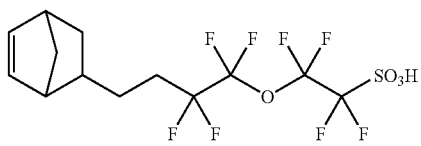
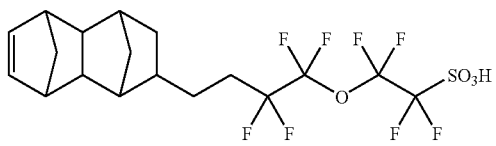
The compound capable of generating an acid represented by formula (I-A) or (I-B) is more preferably a structure represented by the following formula (II-A) or (II-B):
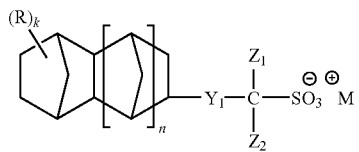
(II-A)

-continued

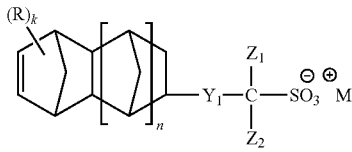

(II-B)

In formulae (II-A) and (II-B), each of $Z_1$ and $Z_2$ independently represents a fluorine atom, a perfluoroalkyl group or a perfluorocycloalkyl group.

$Y_1$ represents a single bond or a divalent linking group.

R represents a substituent, and when a plurality of R's are present, two or more R's may combine with each other to form a ring.

$M^+$ represents a monovalent onium cation.

k represents an integer of 0 to 5, and n represents an integer of 0 to 5.

The perfluoroalkyl group of $Z_1$ and $Z_2$ may be linear or branched and is preferably a perfluoroalkyl group having a carbon number of 1 to 10.

The perfluorocycloalkyl group of $Z_1$ and $Z_2$ may be monocyclic or polycyclic and is preferably, for example, a perfluorocyclohexyl group or a perfluorocyclopentyl group.

Examples of the divalent group of $Y_1$ are the same as those for $A_1$ and $A_2$ in formulae (I-A) and (I-B). R, k and n are the same as those in formulae (I-A) and (I-B).

The monovalent onium cation represented by $M^+$ is preferably an iodonium or sulfonium ion, more preferably a sulfonium ion, still more preferably a sulfonium ion represented by the following formula (VIII):

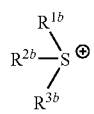

(VIII)

In formula (VIII), each of $R^{1b}$ to $R^{3b}$ independently represents an alkyl group (linear or branched, preferably having a carbon number of 1 to 30) or a cyclic hydrocarbon group (preferably having a carbon number of 3 to 30).

When any one of $R^{1b}$ to $R^{3b}$ is an alkyl group, the alkyl group may contain, as the substituent, one or more of a hydroxyl group, an alkoxy group (chain or alicyclic, preferably having a carbon number of 1 to 12) and a cyclic hydrocarbon group (preferably having a carbon number of 3 to 12), and when $R^{1b}$ to $R^{3b}$ are a cyclic hydrocarbon group, the cyclic hydrocarbon group may contain, as the substituent, one or more of a hydroxyl group, an alkyl group (linear or branched, preferably having a carbon number of 1 to 12), a cycloalkyl group and an alkoxy group (chain or alicylcic, preferably having a carbon number of 1 to 12).

Examples of the alkyl group include a methyl group, an ethyl group, an n-propyl group, an isopropyl group, an n-butyl group, a sec-butyl group, a tert-butyl group, a pentyl group, a hexyl group, an octyl group and a 2-ethylhexyl group.

Examples of the alkoxy group include a methoxy group, an ethoxy group, a propoxy group, a butoxy group, a hexyloxy group, an octyloxy group and a 2-ethylhexyloxy group.

Examples of the cyclic hydrocarbon group include a cyclopentyl group, a cyclohexyl group, an adamantyl group, a bicyclohexyl group, a phenyl group, a naphthyl group, a fluorenyl group and a biphenyl group.

One preferred embodiment of the sulfonium ion represented by formula (VIII) is a sulfonium ion represented by the following formula (IIIc).

The monovalent onium cation represented by $M^+$ is preferably a cation of the following formulae (IIIc) to (IIId).

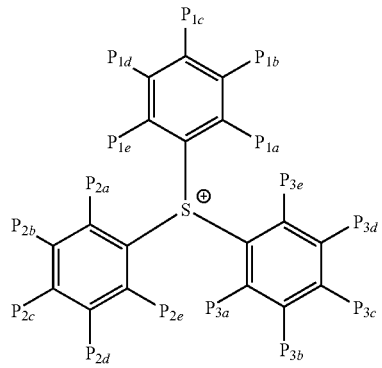

(IIIa)

In formula (IIIa), each of $P_{1a}$ to $P_{1e}$, $P_{2a}$ to $P_2$, and $P_{3a}$ to $P_{3e}$ independently represents a hydrogen atom, a hydroxyl group, an alkyl group (preferably having a carbon number of 1 to 12), a cycloalkyl group (preferably having a carbon number of 3 to 12) or an alkoxy group (preferably having a carbon number of 1 to 12).

Each of pairs $P_{1a}$ and $P_{3e}$, $P_{1e}$ and $P_{2a}$, and $P_{2e}$ and $P_{3a}$ may combine together through a single bond, methylene, an ether bond or a sulfide bond.

The alkyl group of $P_{1a}$ to $P_{1e}$, $P_{2a}$ to $P_{2e}$ and $P_{3a}$ to $P_{3e}$ may be linear or branched. The cycloalkyl group may be monocyclic or polycyclic. These groups may further have a substituent.

Examples of the alkyl group of $P_{1a}$ to $P_{1e}$, $P_{2a}$ to $P_{2e}$ and $P_{3a}$ to $P_{3e}$ include methyl, ethyl, propyl, butyl, pentyl, hexyl, heptyl, octyl, dodecyl, 2-ethylhexyl, isopropyl, sec-butyl, tert-butyl and iso-amyl.

The cycloalkyl group of $P_{1a}$ to $P_{1e}$, $P_{2a}$ to $P_{2e}$ and $P_{3a}$ to $P_{3e}$ includes a monocyclic hydrocarbon group such as cyclopropyl, cyclobutyl, cyclopentyl, cyclohexyl, cyclobutyl, cyclooctyl, cyclododecanyl, cyclopentenyl, cyclohexenyl and cyclooctadienyl, and a polycyclic hydrocarbon group such as bicyclo[4.3.0]nonanyl, decahydronaphthalenyl, tricyclo[5.2.1.0(2,6)]decanyl, bornyl, isobornyl, norbornyl, adamantyl, noradamantyl, 1,7,7-trimethyltricyclo[2.2.1.0$^{2,6}$] heptanyl and 3,7,7-trimethylbicyclo[4.1.0]heptanyl. Above all, cyclopropyl, cyclopentyl, cyclohexyl, cyclooctyl, norbornyl, adamantyl, noradamantyl and the like are preferred.

The alkoxy group of $P_{1a}$ to $P_{1e}$, $P_{2a}$ to $P_{2e}$ and $P_{3a}$ to $P_{3e}$ may be a linear or branched-chain alkoxy or may have an alicyclic skeleton. Examples of the chain alkoxy include methoxy, ethoxy, propoxy, butoxy, pentyloxy, hexyloxy, heptyloxy, octyloxy, dodecyloxy, 2-ethylhexyloxy, iropropyloxy, sec-butyloxy, tert-butyloxy and iso-amyloxy. Examples of the cyclic alkoxy include cyclopropoxy, cyclobutoxy, cyclopentyloxy, cyclohexyloxy, cyclobutyloxy, cyclooctyloxy, cyclododecanyloxy, cyclopentenyloxy, cyclohexenyloxy and cyclooctadienyloxy groups, with cyclopropoxy, cyclopentyloxy, cyclohexyloxy and cyclooctyloxy groups being preferred.

The groups represented by $P_{1a}$ to $P_{1e}$, $P_{2a}$ to $P_{2e}$ and $P_{3a}$ to $P_{3e}$ may further have a substituent, and examples of the substituent which these groups may further have include a hydroxyl group, a halogen atom (e.g., fluorine, chlorine, bromine, iodine), a nitro group, a cyano group, an amide group, a sulfonamide group, an alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

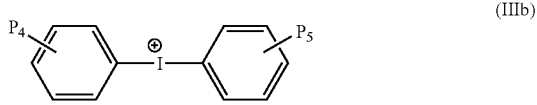

In formula (IIIb), each of $P_4$ and $P_5$ independently represents a hydrogen atom, a hydroxyl group, an alkyl group (preferably having a carbon number of 1 to 12), a cycloalkyl group (preferably having a carbon number of 3 to 12), an alkoxy group (preferably having a carbon number of 1 to 12) or a halogen atom (fluorine, chlorine, bromine, iodine).

Examples of the alkyl group, cycloalkyl group and alkoxy group of $P_4$ and $P_5$ are the same as those for $P_{1a}$ in formula (IIIa).

The groups represented by $P_4$ and $P_5$ may further have a substituent, and examples of the substituent which these groups may further have are the same as those for $P_{1a}$ in formula (IIIa).

In formula (IIIc), each of $P_6$ and $P_7$ independently represents an alkyl group or a cycloalkyl group. $P_6$ and $P_7$ may combine with each other to form a ring. $P_8$ represents a hydrogen atom or an alkyl group, and $P_9$ represents an alkyl group, a cycloalkyl group or an aryl group. Each of the pairs $P_6$ and $P_7$, and $P_8$ and $P_9$ may combine together to form a ring, and each of carbon atoms constituting the ring may be substituted by a carbonyl group, an oxygen atom or a sulfur atom.

The ring that may be formed by combining together each of the pairs $P_6$ and $P_7$, and $P_8$ and $P_9$ is preferably a ring having a carbon number of 3 to 12.

Examples of the alkyl group (preferably having a carbon number of 1 to 12) and cycloalkyl group (preferably having a carbon number of 3 to 12) in $P_6$ to $P_9$ are the same as those for $P_{1a}$ in formula (IIIa). The aryl group in $P_9$ may be monocyclic or polycyclic and is preferably monocyclic, and more preferably a phenyl group.

These groups may further have a substituent, and examples of the substituent which these group may further have are the same as those for $P_{1a}$ in formula (IIIa).

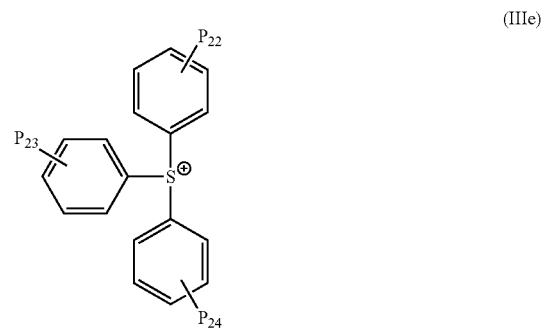

In formula (IIId), each of $P_{10}$ to $P_{21}$ independently represents a hydrogen atom, a hydroxyl group, an alkyl group (preferably having a carbon number of 1 to 12), a cycloalkyl group (preferably having a carbon number of 3 to 12), an alkoxy group (preferably having a carbon number of 1 to 12) or a halogen atom (fluorine, chlorine, bromine, iodine). Y represents a sulfur atom or an oxygen atom.

m represents 0 or 1.

Examples of the alkyl group, cycloalkyl group and alkoxy group of $P_{10}$ to $P_{21}$ are the same as those for $P_{1a}$ in formula (IIIa).

These groups may further have a substituent, and examples of the substituent which these groups may further have are the same as those for $P_{1a}$ in formula (IIIa).

One preferred embodiment of the sulfonium ion represented by formula (IIIa) is a sulfonium ion represented by the following formula (IIIe):

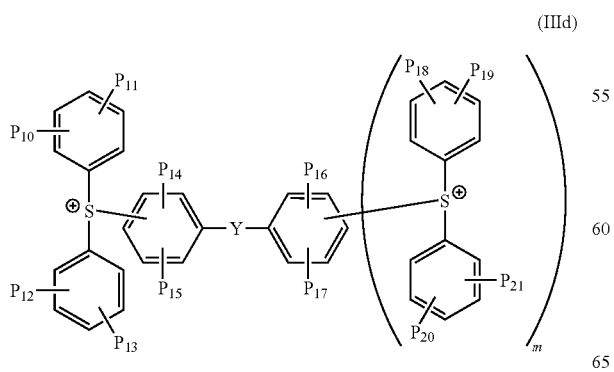

In the formula (IIIe), each of $P_{22}$ to $P_{24}$ independently represents a hydrogen atom or an alkyl group (preferably having a carbon number of 1 to 12).

Examples of the alkyl group of $P_{22}$ to $P_{24}$ are the same as those for $P_{1a}$ in formula (IIIa).

These groups may further have a substituent, and examples of the substituent which these groups may further have are the same as those for $P_{1a}$ in formula (IIIa).

Specific examples of the cations represented by any of formulae (VIII) and (IIIa) to (IIIe) include cations represented by the following formulae.

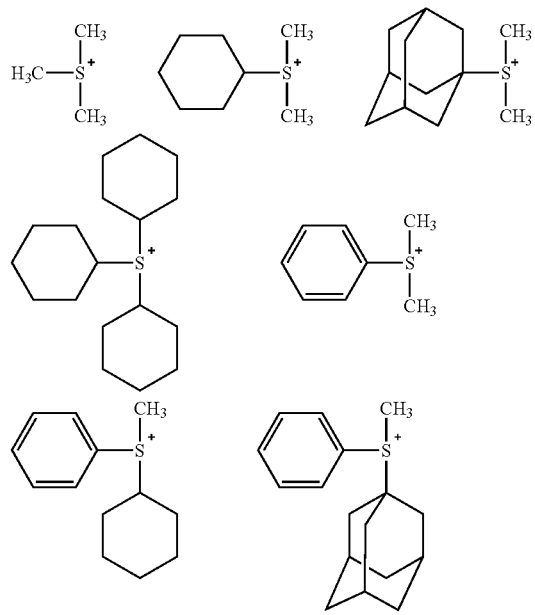

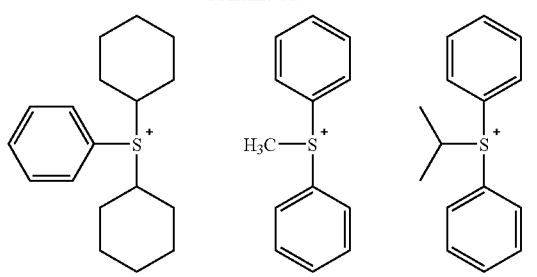
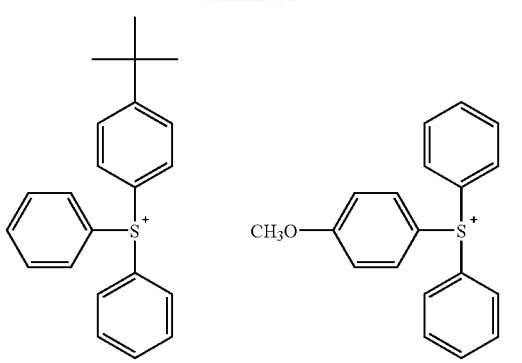

101
-continued
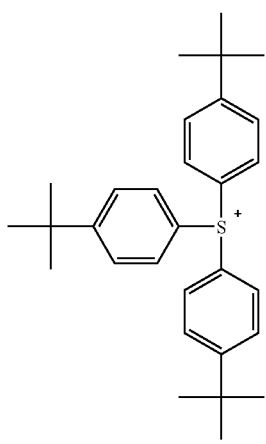
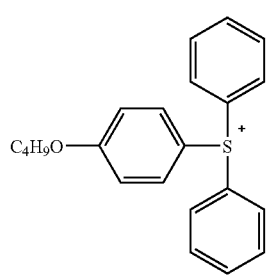
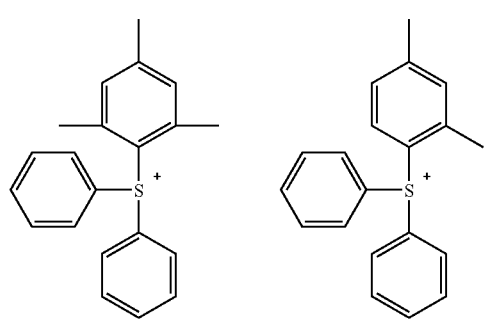
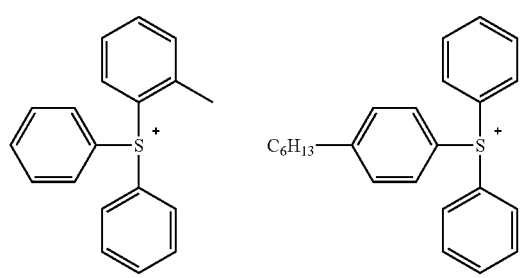
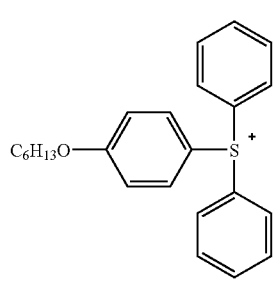
102
-continued
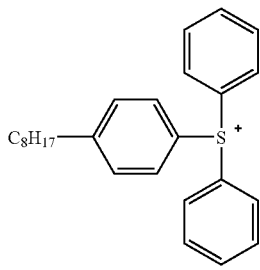
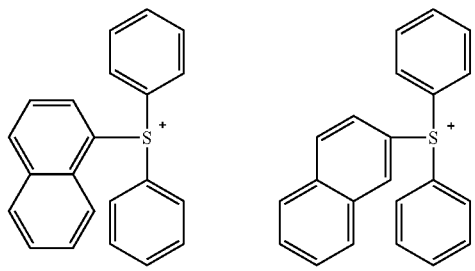
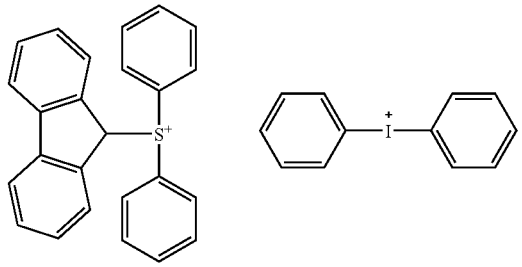
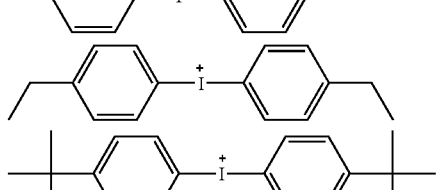
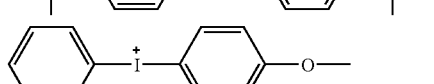
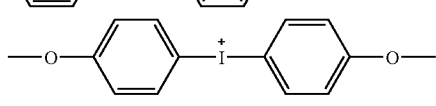
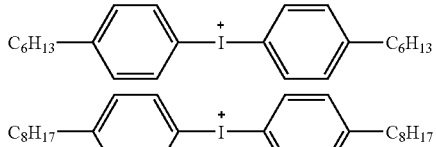
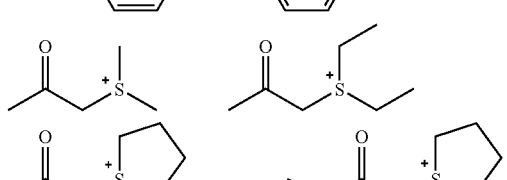
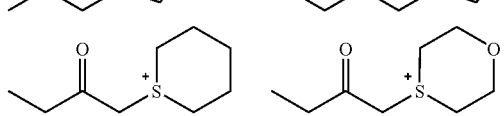

103
-continued
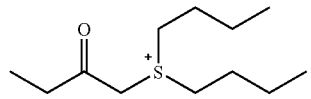
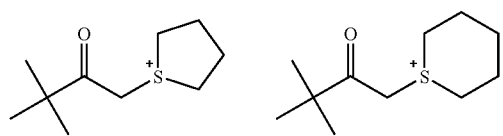
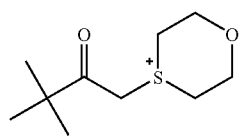
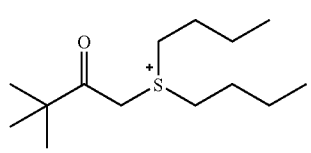
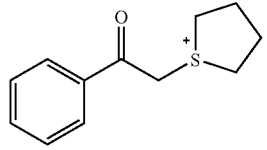
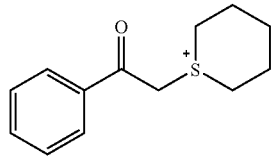
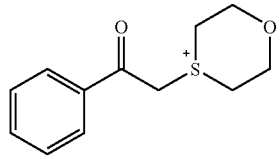
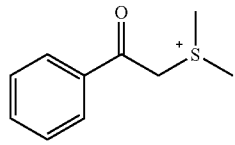
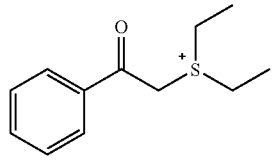
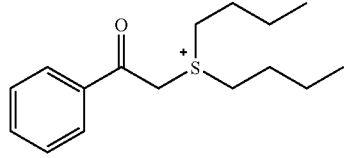
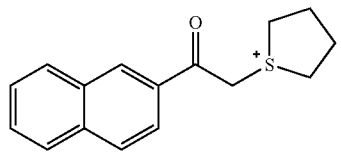
104
-continued
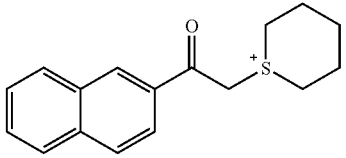
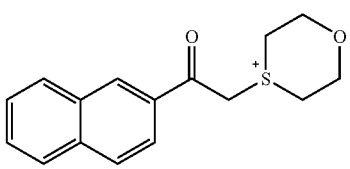
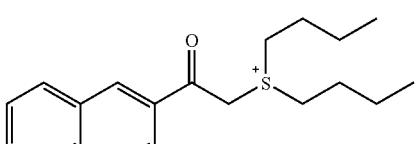
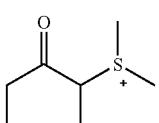
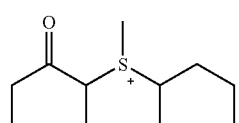
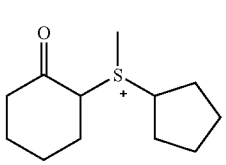
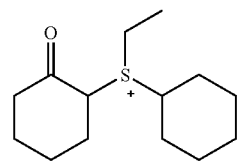
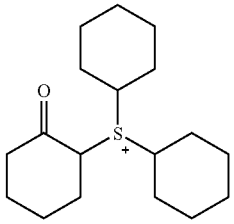
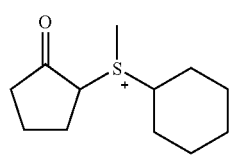
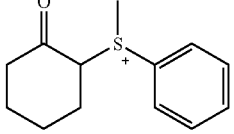
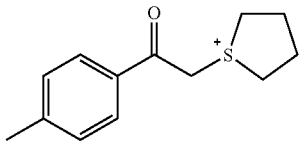
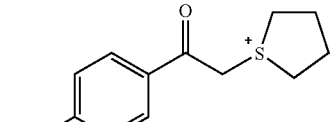
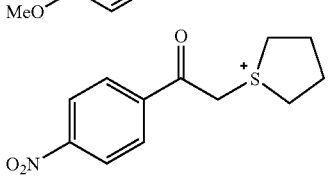

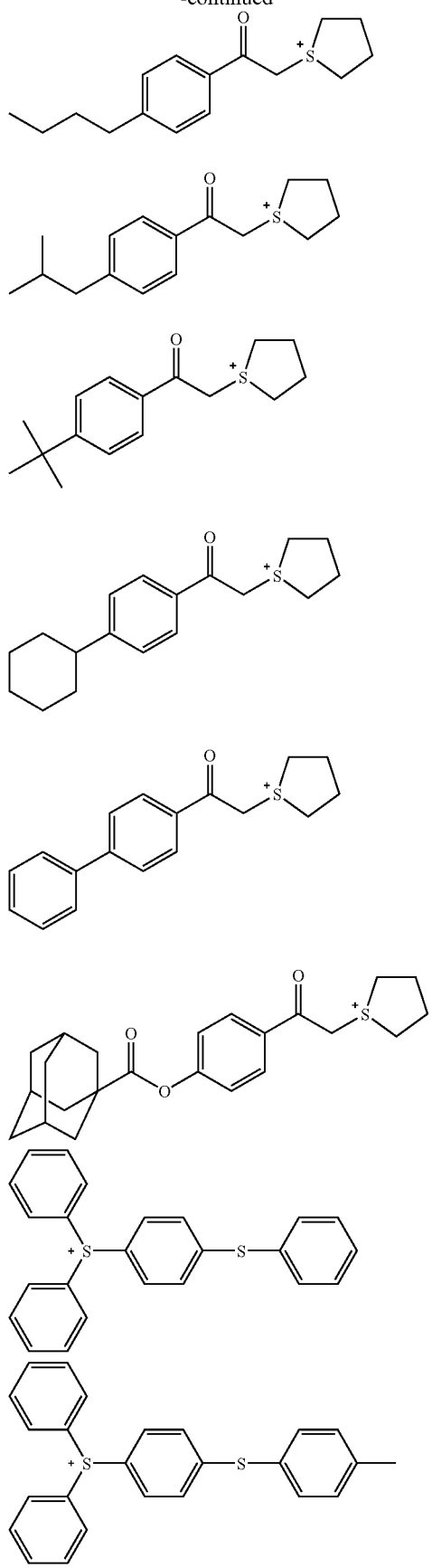
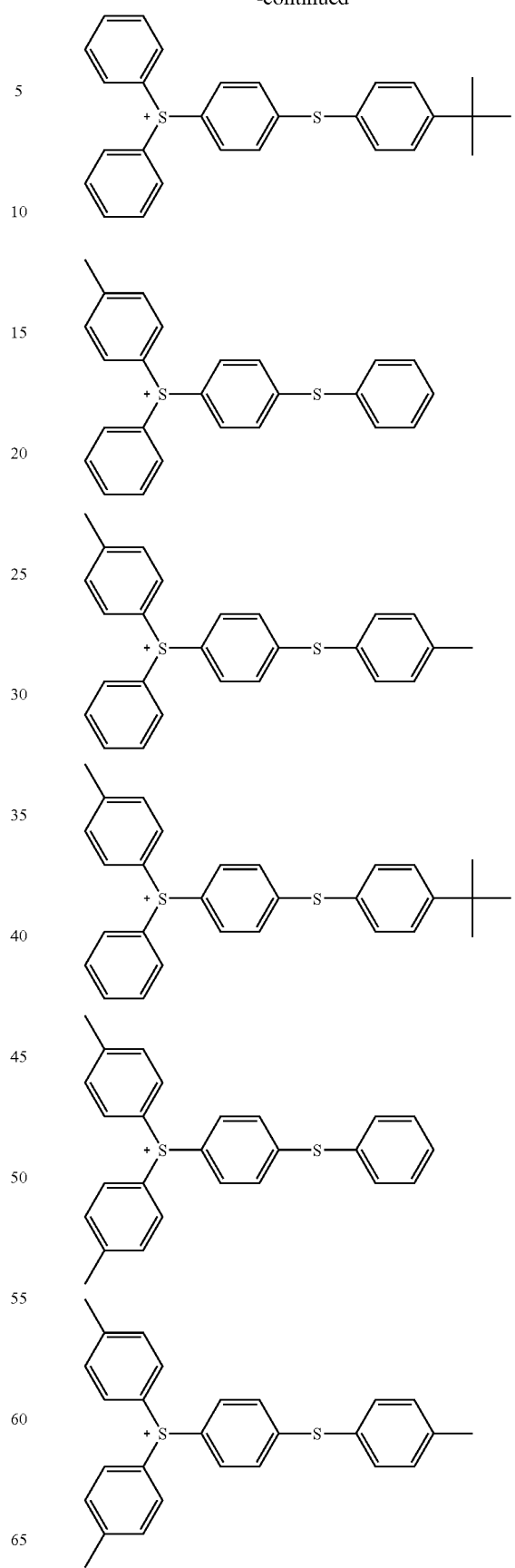

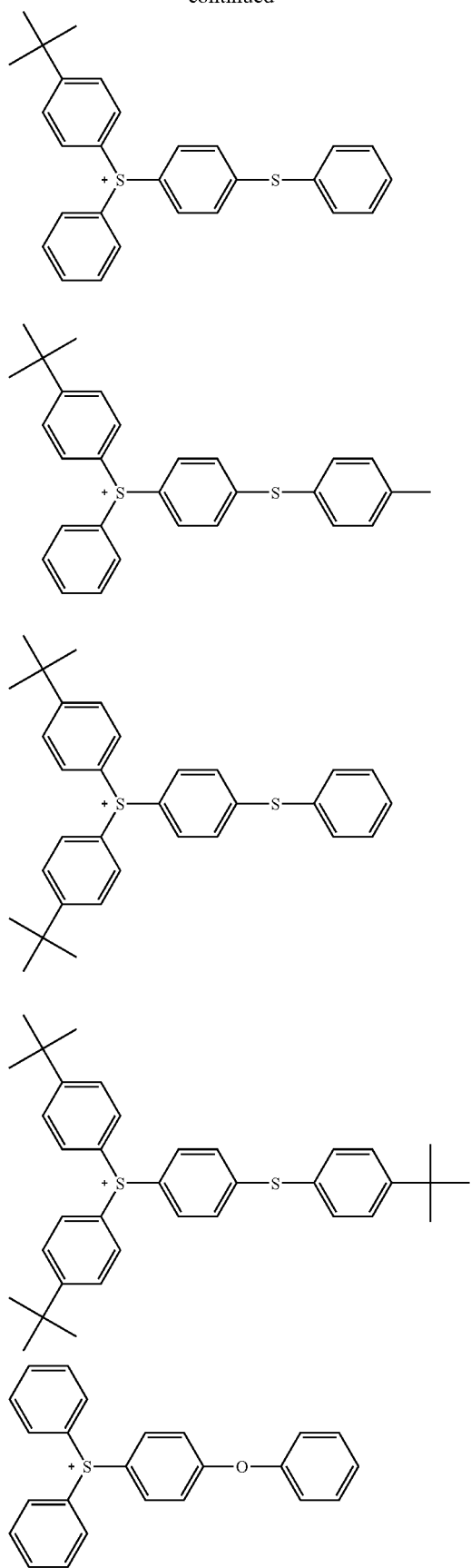
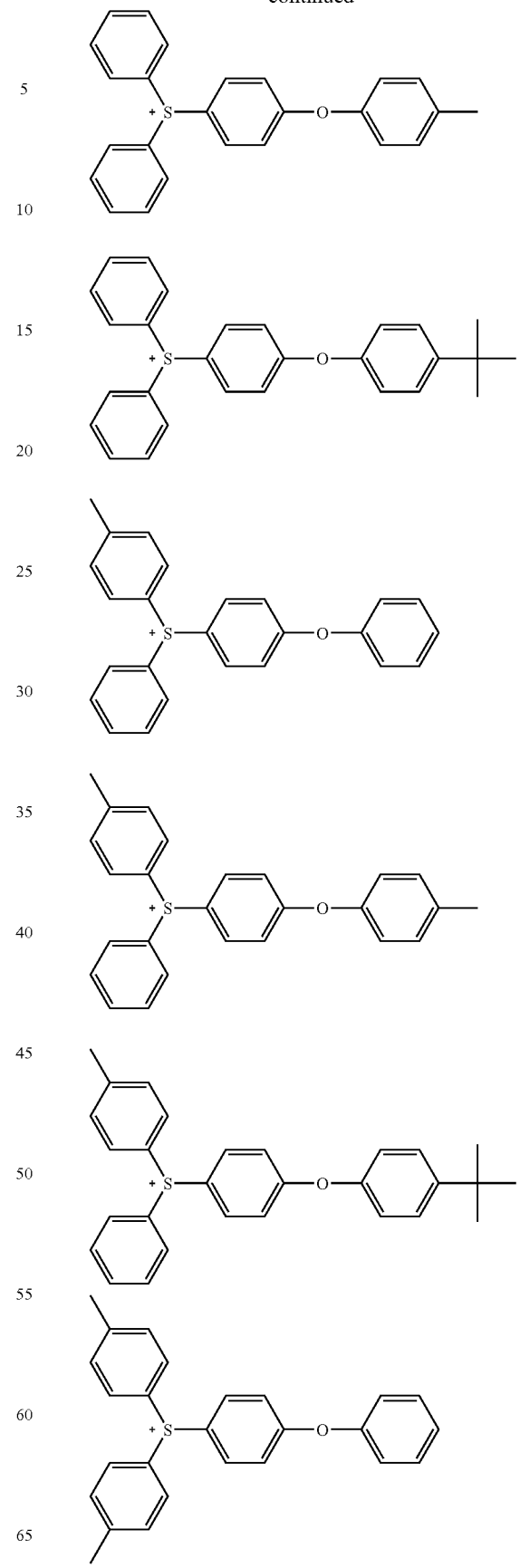

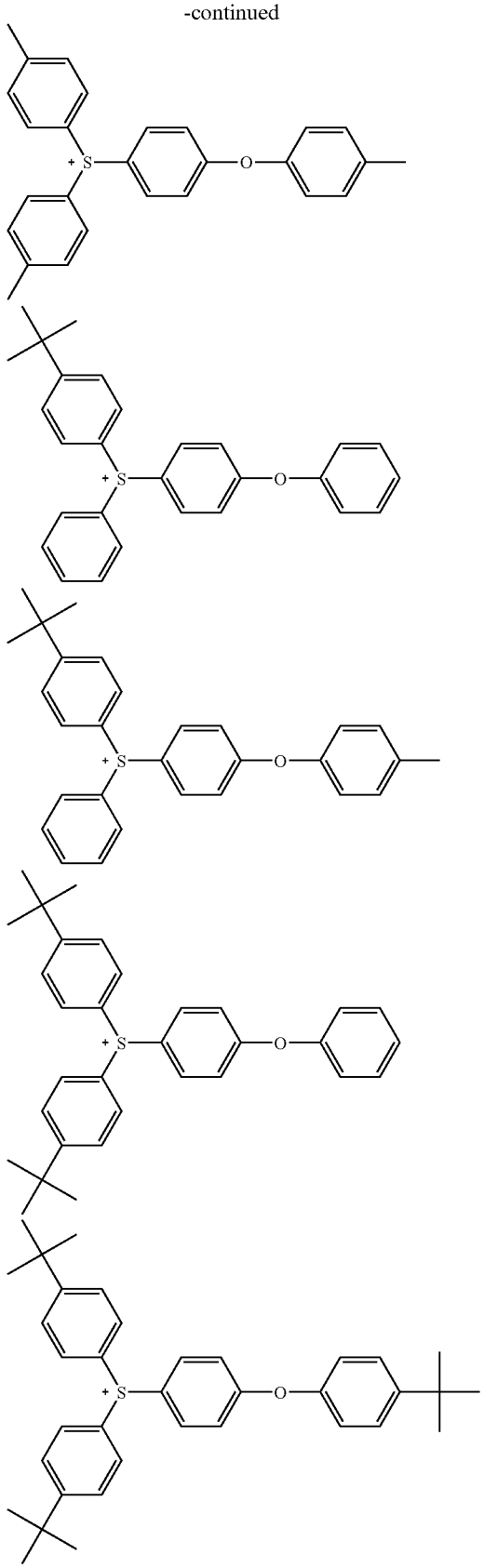

The onium cation M⁺ is more preferably a cation represented by the following formula (III):

(III)

In formula (III), $R_{13}$ represents a hydrogen atom, a fluorine atom, a hydroxyl group, an alkyl group, a cycloalkyl group, an alkoxy group or an alkoxycarbonyl group.

$R_{14}$ represents, when a plurality of $R_{14}$'s are present, each independently represents, an alkyl group, a cycloalkyl group, an alkoxy group, an alkylsulfonyl group or a cycloalkylsulfonyl group.

Each $R_{15}$ independently represents an alkyl group, a cycloalkyl group, a phenyl group or a naphthyl group, and two $R_{15}$'s may combine with each other to form a ring.

l represents an integer of 0 to 2.

r represents an integer of 0 to 10.

In formula (III), the alkyl group of $R_{13}$, $R_{14}$ and $R_{15}$ is a linear or branched alkyl group preferably having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

Examples of the cycloalkyl group of $R_{13}$, $R_{14}$ and $R_{15}$ include cyclopropyl, cyclobutyl, cyclopentyl, cyclohexyl, cycloheptyl, cyclooctyl, cyclododecanyl, cyclopentenyl, cyclohexenyl and cyclooctadienyl. Above all, cyclopropyl, cyclopentyl, cyclohexyl and cyclooctyl are preferred.

The alkoxy group of $R_{13}$ and $R_{14}$ is a linear or branched alkoxy group preferably having a carbon number of 1 to 10, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are preferred.

The alkoxycarbonyl group of $R_{13}$ is a linear or branched alkoxycarbonyl group preferably having a carbon number of 2 to 11, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are preferred.

The alkylsulfonyl group and cycloalkylsulfonyl group of $R_{14}$ are a linear, branched or cyclic alkylsulfonyl group preferably having a carbon number of 1 to 10, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

r is preferably an integer of 0 to 2.

In formula (III), examples of the phenyl group of $R_{15}$, which may be substituted, include a phenyl group and a phenyl group substituted by a linear, branched or cyclic alkyl group having a carbon number of 1 to 10, such as phenyl group, o-tolyl group, m-tolyl group, p-tolyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4,6-trimethylphenyl group, 4-ethylphenyl group, 4-tert-butylphenyl group, 4-cyclohexylphenyl group and 4-fluorophenyl group; and a group formed by substituting such a phenyl group or alkyl-substituted phenyl group with one or more members of at least one group such as hydroxyl group, carboxyl group, cyano group, nitro group, alkoxy group, alkoxyalkyl group, alkoxycarbonyl group or alkoxycarbonyloxy group.

Out of the substituents for the phenyl group and alkyl-substituted phenyl group, examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group. Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyl group and cyclohexyloxycarbonyl group. In formula (III), the phenyl group of $R_{15}$, which may be substituted, is preferably a phenyl group, a 4-cyclohexylphenyl group, a 4-tert-butylphenyl group, a 4-methoxyphenyl group, a 4-tert-butoxyphenyl group or the like.

Examples of the naphthyl group of $R_{15}$, which may be substituted, include a naphthyl group and a naphthyl group substituted by a linear, branched or cyclic alkyl group having a carbon number of 1 to 10, such as 1-naphthyl group, 2-methyl-1-naphthyl group, 3-methyl-1-naphthyl group, 4-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 2,3-dimethyl-1-naphthyl group, 2,4-dimethyl-1-naphthyl group, 2,5-dimethyl-1-naphthyl group, 2,6-dimethyl-1-naphthyl group, 2,7-dimethyl-1-naphthyl group, 2,8-dimethyl-1-naphthyl group, 3,4-dimethyl-1-naphthyl group, 3,5-dimethyl-1-naphthyl group, 3,6-dimethyl-1-naphthyl group, 3,7-dimethyl-1-naphthyl group, 3,8-dimethyl-1-naphthyl group, 4,5-dimethyl-1-naphthyl group, 5,8-dimethyl-1-naphthyl group, 4-ethyl-1-naphthyl group, 2-naphthyl group, 1-methyl-2-naphthyl group, 3-methyl-2-naphthyl group and 4-methyl-2-naphthyl group; and a group formed by substituting such a naphthyl group or alkyl-substituted naphthyl group with one or more members of at least one group such as hydroxyl group, carboxyl group, cyano group, nitro group, alkoxy group, alkoxyalkyl group, alkoxycarbonyl group or alkoxycarbonyloxy group.

Examples of the alkoxy group, alkoxyalkyl group, alkoxycarbonyl group and alkoxycarbonyloxy group as the substituent include the groups exemplified above for the phenyl group and alkyl-substituted phenyl group. In formula (III), the naphthyl group of $R_{15}$, which may be substituted, is preferably a 1-naphthyl group, a 1-(4-methoxynaphthyl) group, a 1-(4-ethoxynaphthyl) group, a 1-(4-n-propoxynaphthyl) group, a 1-(4-n-butoxynaphthyl) group, a 2-(7-methoxynaphthyl) group, a 2-(7-ethoxynaphthyl) group, a 2-(7-n-propoxynaphthyl) group, a 2-(7-n-butoxynaphthyl) group or the like.

As for the ring structure which may be formed by combining two $R_{15}$'s with each other, a group capable of forming a 5- or 6-membered ring, preferably a 5-membered ring (that is, a tetrahydrothiophene ring), together with the sulfur atom in formula (III) is preferred. Examples of the substituent on the divalent linking group include those exemplified as the substituent for the phenyl group and alkyl-substituted phenyl group, that is, a hydroxyl group, a carboxyl group, a cyano group, a nitro group, an alkoxy group, an alkoxyalkyl group, an alkoxycarbonyl group and an alkoxycarbonyloxy group. In formula (III), $R_{15}$ is preferably, for example, a methyl group, an ethyl group, a phenyl group, a 4-methoxyphenyl group, a 1-naphthyl group, or a divalent group for forming a tetrahydrothiophene ring structure together with the sulfur atom when two $R_{15}$'s are combined with each other.

Specific preferred examples of the cation represented by formula (III) are set forth below.

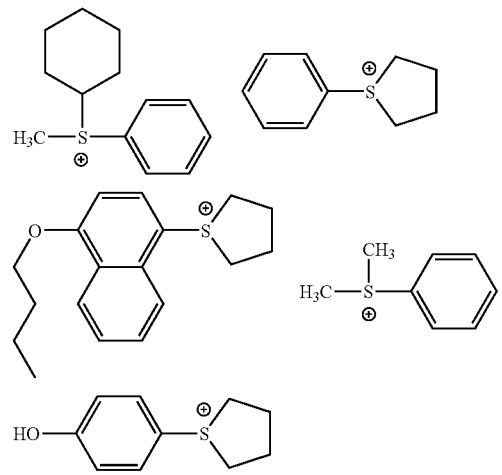

-continued
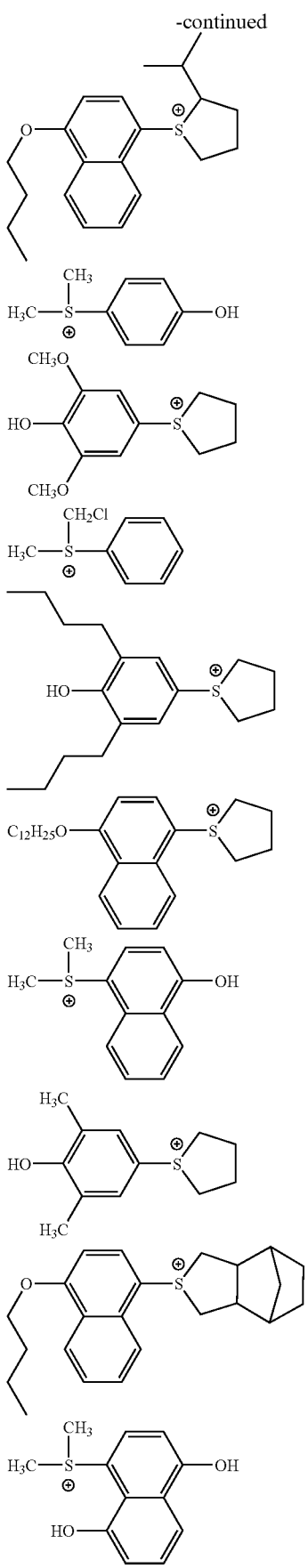
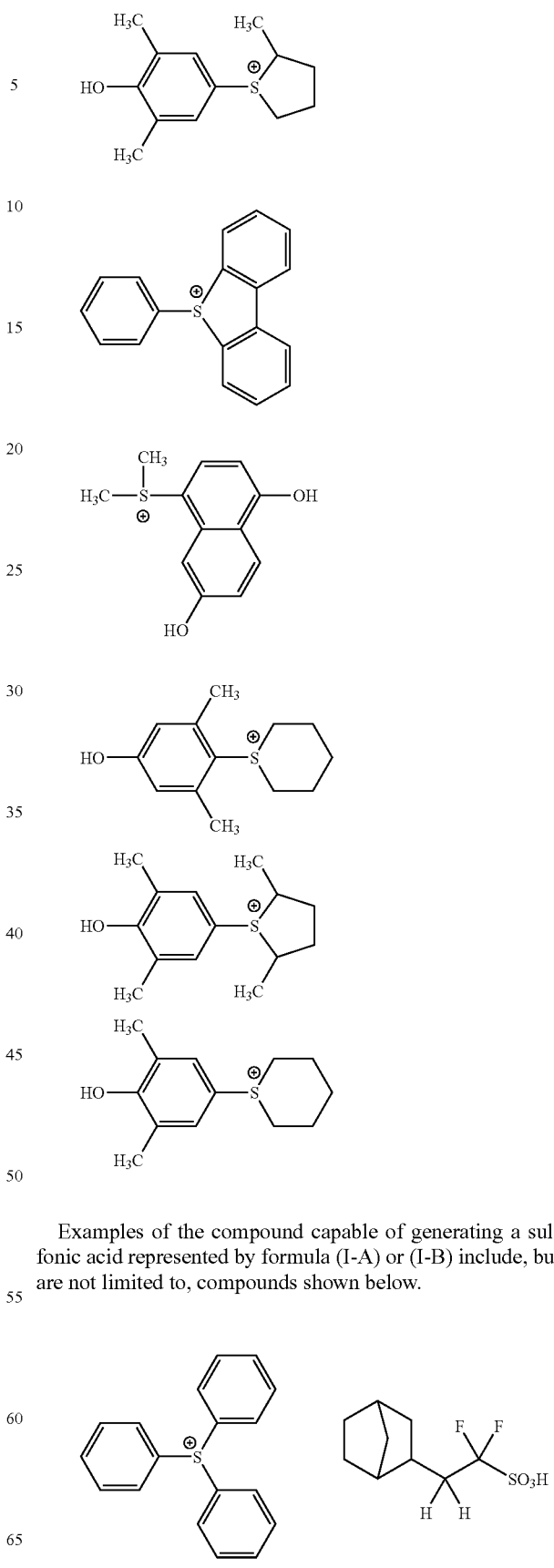
Examples of the compound capable of generating a sulfonic acid represented by formula (I-A) or (I-B) include, but are not limited to, compounds shown below.
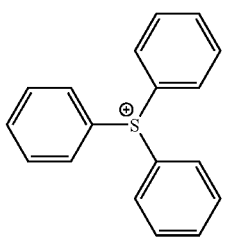
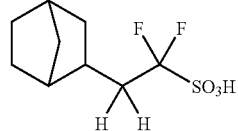

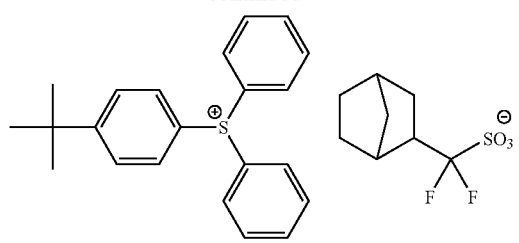
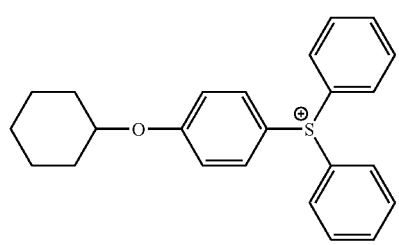
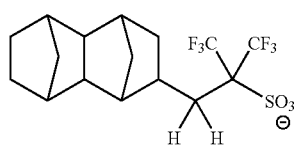
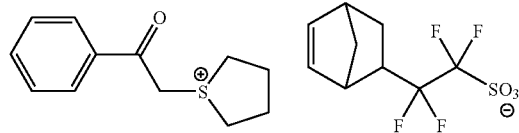
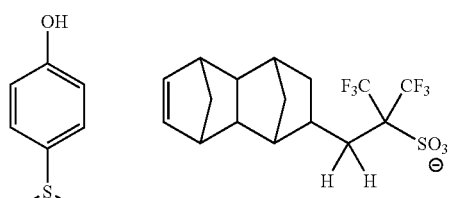
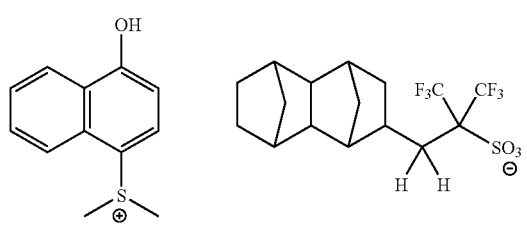
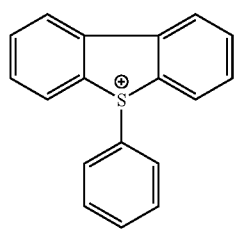
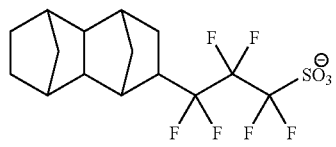
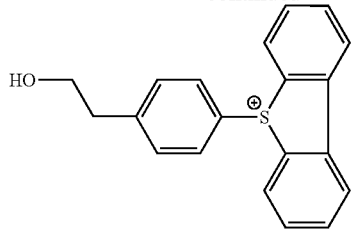
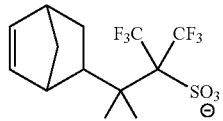
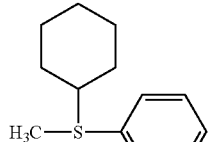
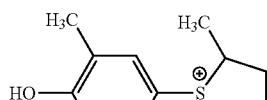
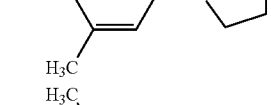
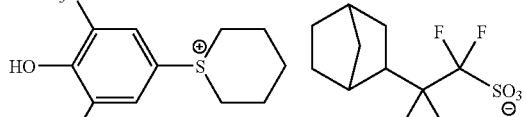
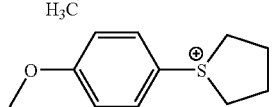
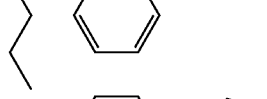
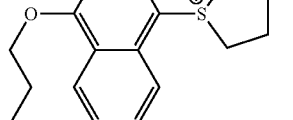
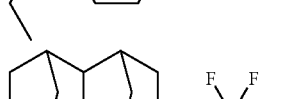
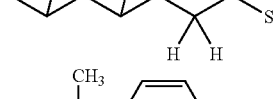
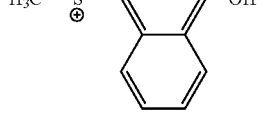

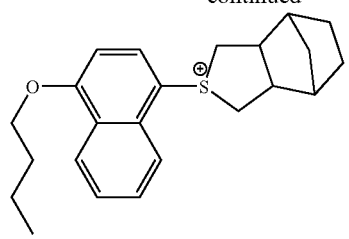

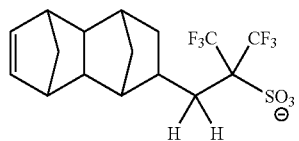

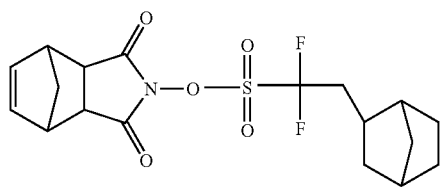

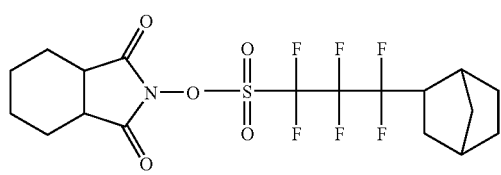

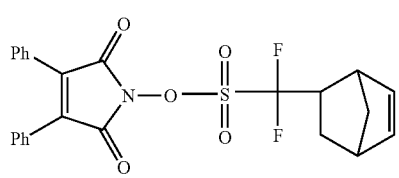

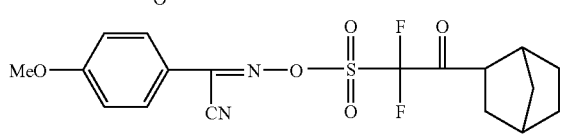

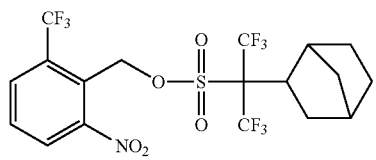

In formula (I-C), each $R_9$ independently represents an at least partially fluorinated alkyl group (preferably having a carbon number of 1 to 8) or cycloalkyl group (preferably having a carbon number of 3 to 8), or two $R_9$'s combine to form a fluorinated alkylene group.

In formula (I-D), each $R_{10}$ independently represents an at least partially fluorinated alkyl group (preferably having a carbon number of 1 to 8) or cycloalkyl group (preferably having a carbon number of 3 to 8), or at least two $R_{10}$'s combine to form a fluorinated alkylene group.

The compound capable of forming an acid represented by formula (I-C) or (I-D) is preferably a compound represented by the following formulae (P1) to (P4):

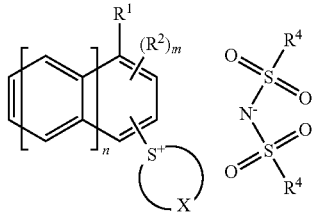

(P1)

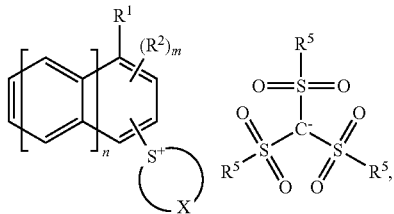

(P2)

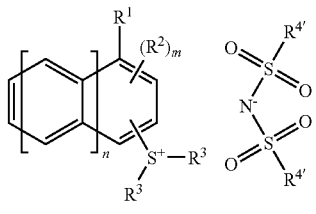

(P3)

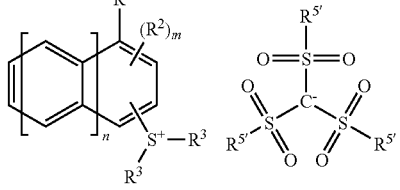

(P4)

In formulae (P1) to (P4), $R^1$ represents a hydrogen atom, a fluorine atom, a hydroxyl group, a linear or branched alkyl group (preferably having a carbon number of 1 to 10), a linear or branched alkoxy group (preferably having a carbon number of 1 to 10) or a linear or branched alkoxycarbonyl group (preferably having a carbon number of 2 to 11).

$R^2$ represents a linear or branched alkyl group (preferably having a carbon number of 1 to 10), a linear or branched alkoxy group (preferably having a carbon number of 1 to 10) or a linear, branched or cyclic alkanesulfonyl group (preferably having a carbon number of 1 to 10).

n is an integer of 0 to 2, and m is an integer of 0 to 10.

In formulae (P1) and (P2), X represents a divalent group (preferably having a carbon number of 2 to 10), and each of $R^4$ and $R^5$ independently represents a fluorinated alkyl group (preferably having a carbon number of 1 to 8) or a fluorinated cycloalkyl group (preferably having a carbon number of 3 to 8).

Two $R^4$'s may combine to form a fluorinated alkylene group, and at least two $R^5$'s may combine to form a fluorinated alkylene group.

In formulae (P3) and (P4), each $R^3$ independently represents a linear or branched alkyl group (preferably having a carbon number of 1 to 10), or a phenyl or naphthyl group which may be substituent, each $R^{4'}$ independently represents a linear or branched fluorinated alkyl group (preferably having a carbon number of 1 to 8), and each $R^{5'}$ independently represents a linear or branched fluorinated alkyl group (preferably having a carbon number of 1 to 8).

Two $R^{4'}$'s may combine to form a fluorinated alkylene group, and at least two $R^{5'}$'s may combine to form a fluorinated alkylene group.

Examples of the linear or branched alkyl group preferably having a carbon number of 1 to 10 in $R^1$, $R^2$ and $R^3$ include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are more preferred.

Examples of the linear or branched alkoxy group preferably having a carbon number of 1 to 10 in $R^1$ and $R^2$ include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are more preferred.

Examples of the linear or branched alkoxycarbonyl group preferably having a carbon number of 2 to 11 in $R^1$ include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are more preferred.

Examples of the linear, branched or cyclic alkanesulfonyl group preferably having a carbon number of 1 to 10 in $R^2$ include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkanesulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

m is preferably an integer of 0 to 2.

Examples of the phenyl group in $R^3$, which may be substituted, include a phenyl group and a phenyl group substituted by a linear, branched or cyclic alkyl group having a carbon number of 1 to 10, such as phenyl group, o-tolyl group, m-tolyl group, p-tolyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4,6-trimethylphenyl group, 4-ethylphenyl group, 4-tert-butylphenyl group, 4-cyclohexylphenyl group and 4-fluorophenyl group; and a group formed by substituting such a phenyl group or alkyl-substituted phenyl group with one or more members of at least one group such as hydroxyl group, carboxyl group, cyano group, nitro group, alkoxyl group, alkoxyalkyl group, alkoxycarbonyl group or alkoxycarbonyloxy group.

Out of the substituents for the phenyl group and alkyl-substituted phenyl group, examples of the alkoxyl group include a linear, branched or cyclic alkoxyl group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group. Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyl group and cyclohexyloxycarbonyl group.

Among the phenyl groups of $R^3$, which may be substituted, a phenyl group, a 4-cyclohexylphenyl group, a 4-tert-butylphenyl group, a 4-methoxyphenyl group and a 4-tert-butoxyphenyl group are preferred.

Examples of the naphthyl group of $R^3$, which may be substituted, include a naphthyl group and a naphthyl group substituted by a linear, branched or cyclic alkyl group having a carbon number of 1 to 10, such as 1-naphthyl group, 2-methyl-1-naphthyl group, 3-methyl-1-naphthyl group, 4-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 2,3-dimethyl-1-naphthyl group, 2,4-dimethyl-1-naphthyl group, 2,5-dimethyl-1-naphthyl group, 2,6-dimethyl-1-naphthyl group, 2,7-dimethyl-1-naphthyl group, 2,8-dimethyl-1-naphthyl group, 3,4-dimethyl-1-naphthyl group, 3,5-dimethyl-1-naphthyl group, 3,6-dimethyl-1-naphthyl group, 3,7-dimethyl-1-naphthyl group, 3,8-dimethyl-1-naphthyl group, 4,5-dimethyl-1-naphthyl group, 5,8-dimethyl-1-naphthyl group, 4-ethyl-1-naphthyl group, 2-naphthyl group, 1-methyl-2-naphthyl group, 3-methyl-2-naphthyl group and 4-methyl-2-naphthyl group; and a group formed by substituting such a naphthyl group or alkyl-substituted naphthyl group with one or more members of at least one group such as hydroxyl group, carboxyl group, cyano group, nitro group, alkoxyl group, alkoxyalkyl group, alkoxycarbonyl group or alkoxycarbonyloxy group.

Examples of the alkoxyl group, alkoxyalkyl group, alkoxycarbonyl group and alkoxycarbonyloxy group as the substituent include the groups exemplified above for the phenyl group and alkyl-substituted phenyl group.

The naphthyl group of $R^3$, which may be substituted, is preferably a 1-naphthyl group, a 1-(4-methoxynaphthyl) group, a 1-(4-ethoxynaphthyl) group, a 1-(4-n-propoxynaphthyl) group, a 1-(4-n-butoxynaphthyl) group, a 2-(7-methoxynaphthyl) group, a 2-(7-ethoxynaphthyl) group, a 2-(7-n-propoxynaphthyl) group or a 2-(7-n-butoxynaphthyl) group.

$R^3$ is preferably a methyl group, an ethyl group, a phenyl group, a 4-methoxyphenyl group or a 1-naphthyl group.

X represents a divalent group having a carbon number of 2 to 10, and the divalent group having a carbon number of 2 to 10 is preferably a group capable of forming a 5- or 6-membered ring, more preferably a 5-membered ring (that is, a tetrahydrothiophene ring), together with the sulfur atom in formula (P1) or (P2). Examples of the substituent on the divalent group include those exemplified as the substituent for the phenyl group and alkyl-substituted phenyl group, that is, a hydroxyl group, a carboxyl group, a cyano group, a nitro group, an alkoxyl group, an alkoxyalkyl group, an alkoxycarbonyl group and an alkoxycarbonyloxy group.

X is preferably a divalent group capable of forming a tetrahydrothiophene ring structure together with the sulfur atom.

The fluorinated alkyl group having a carbon number of 1 to 8 of $R^4$, $R^5$, $R^{4'}$ and $R^{5'}$ is a perfluoroalkyl group or a partially fluorinated alkyl group, and examples thereof include a trifluoromethyl group, a pentafluoroethyl group, a heptafluoro-n-butyl group, a heptafluoro-i-propyl group, a nonafluoro-n-butyl group, a nonafluoro-2-methylpropyl group, a nonafluoro-1-methylpropyl group, a nonafluoro-tert-butyl group, a perfluoro-n-pentyl group, a perfluoroneopentyl group, a perfluoro-n-hexyl group, a perfluoro-n-heptyl group and a perfluoro-n-octyl group.

The fluorinated alkylene group having a carbon number of 2 to 8 formed by combining $R^4$'s together, the fluorinated alkylene group having a carbon number of 2 to 8 formed by combining two $R^5$'s, and the fluorinated alkylene group having a carbon number of 2 to 8 formed by combining two $R^{5'}$'s together are specifically a perfluoroalkylene group or a partially fluorinated alkylene group, and examples thereof include a tetrafluoroethylene group, a 1,2-hexafluoropropylene group, a 1,3-hexafluoropropylene group, a 1,2-octafluorobutylene group, a 1,3-octafluorobutylene group, a 1,4-octafluorobutylene group, a 2-trifluoromethyl-1,3-pentafluoropropylene group, a 1,5-perfluoropentylene group, a 1,6-perfluorohexylene group, a 1,7-perfluoroheptylene group and a 1,8-perfluorooctylene group.

Preferred examples of the cation moiety of the acid generator (A) represented by formulae (P1) to (P4) include compounds set forth below.

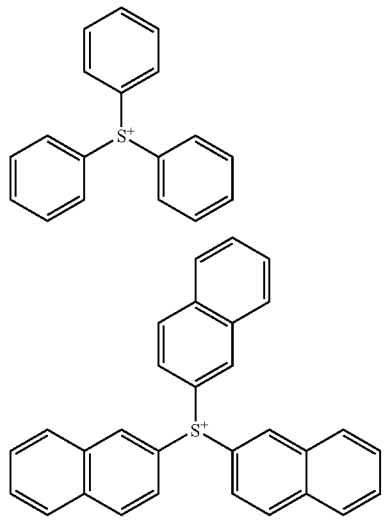

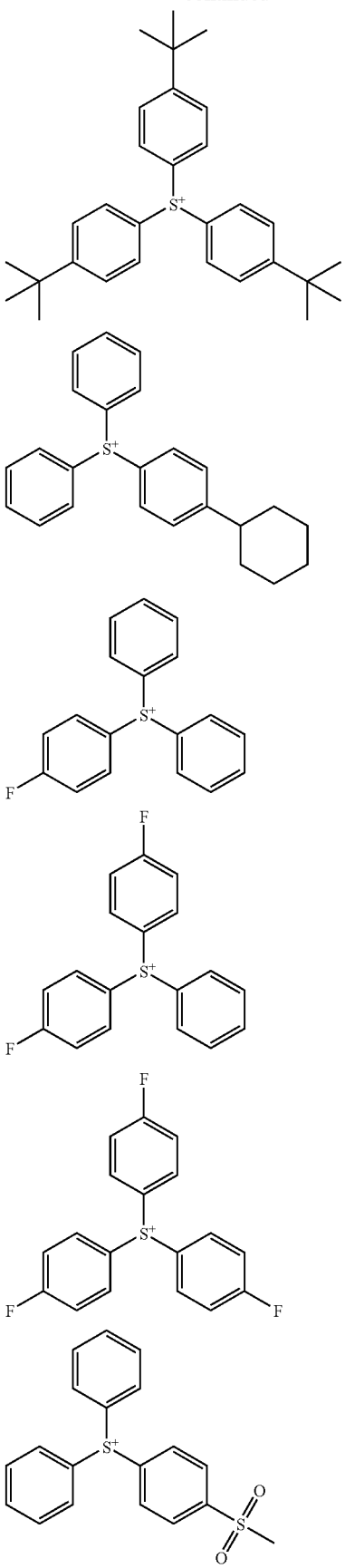

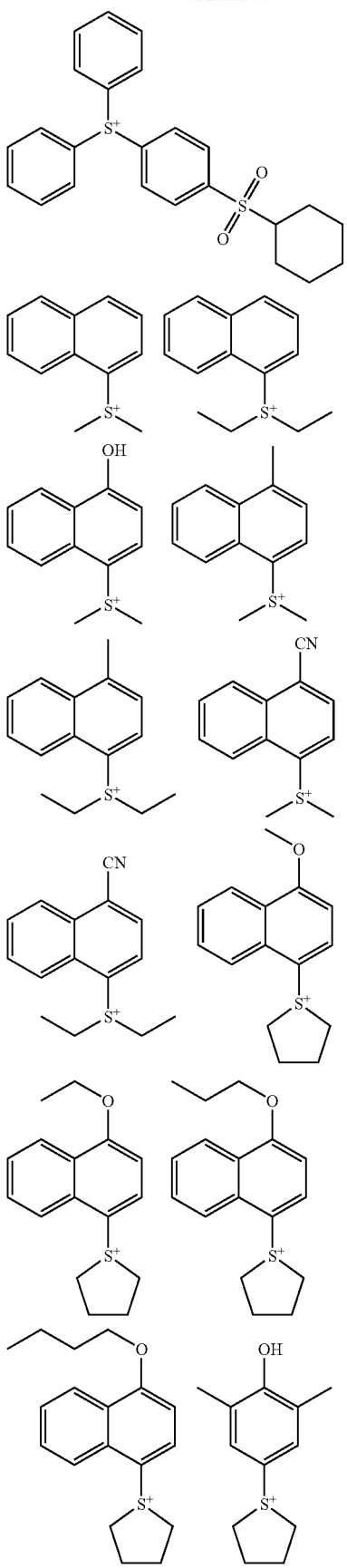
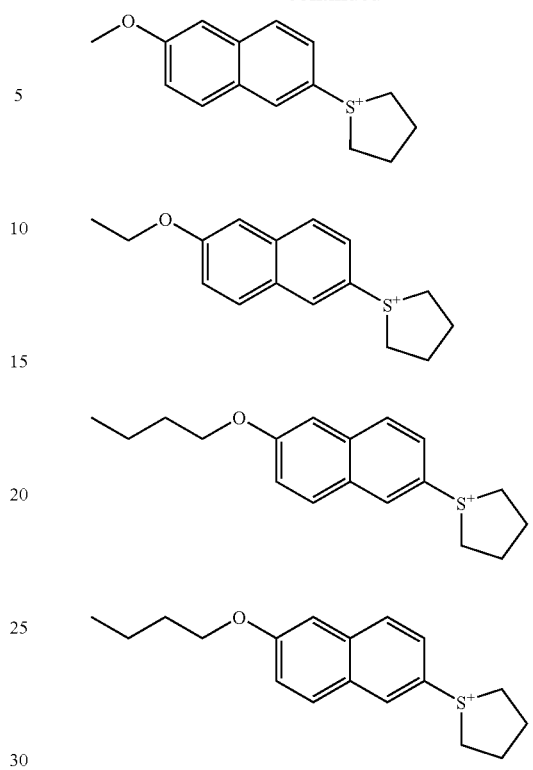
Preferred examples of the anion moiety of the acid generator (A) represented by formulae (P1) to (P4) include compounds set forth below.
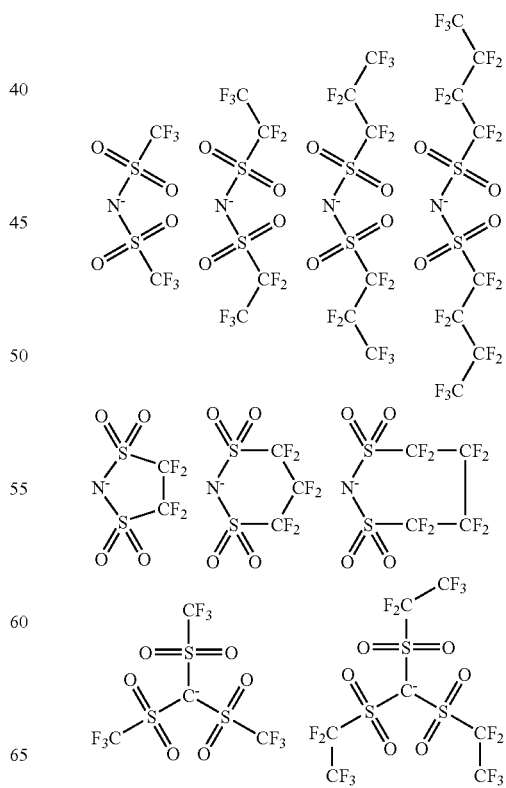

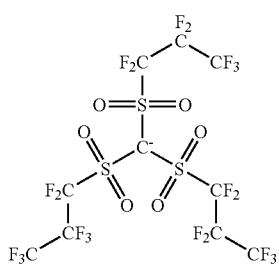
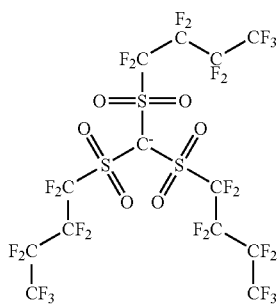
All combinations of the cation moiety and the anion moiety above may be preferably used. Also, sulfonium salts represented by the following formulae are preferred.
B1-1
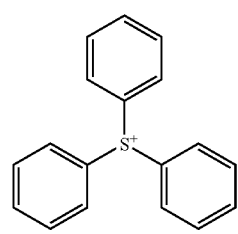 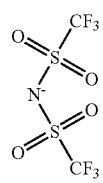
B1-2
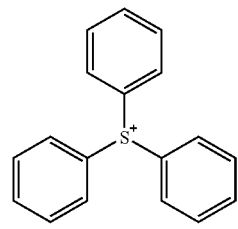 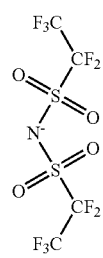
B1-3
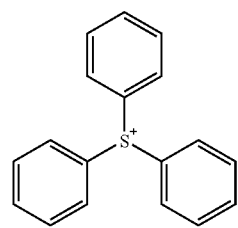 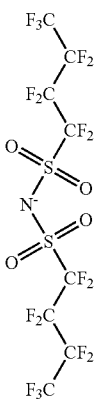
B1-4
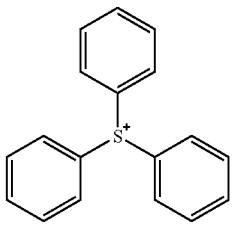 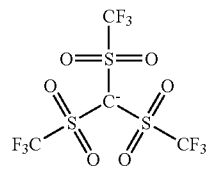
B1-5
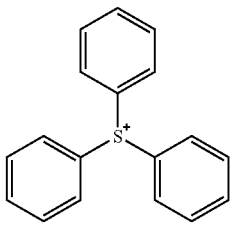 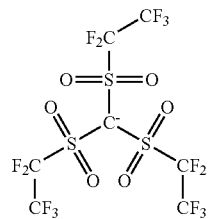
B1-6
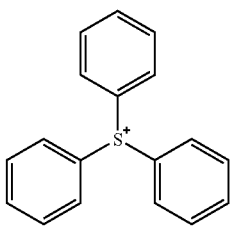 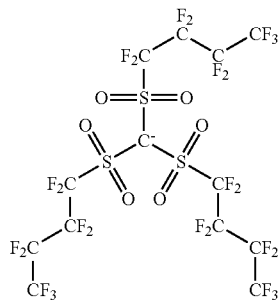
B1-7
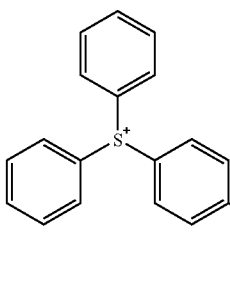 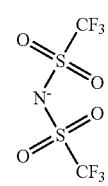
B1-8
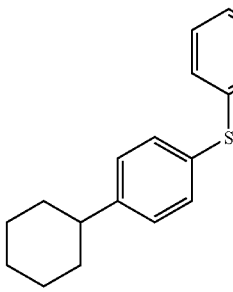 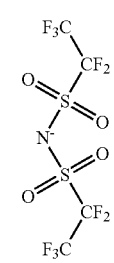

B1-9
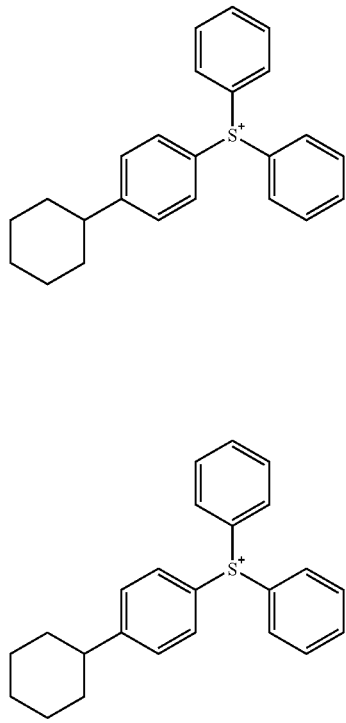
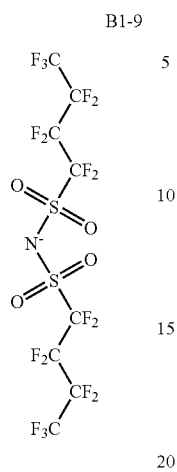
B1-10
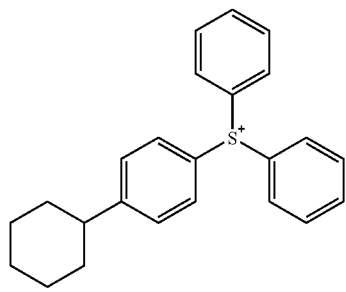
B1-11
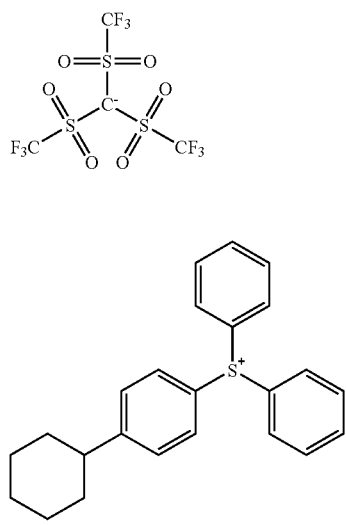
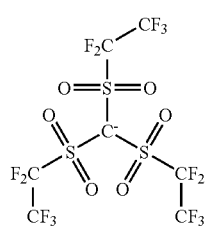
B1-12
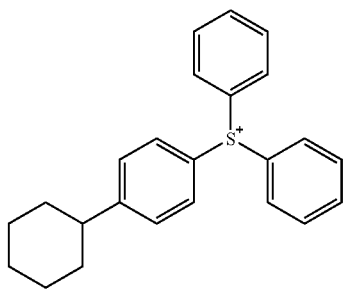
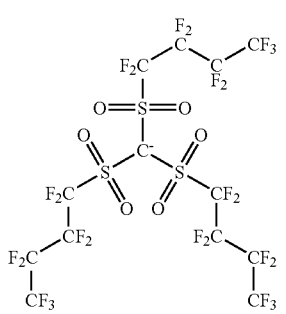
B1-13
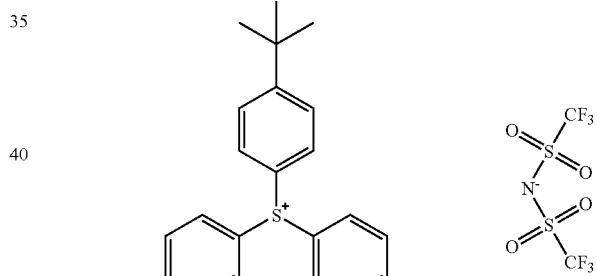
B1-14
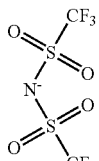

B1-15
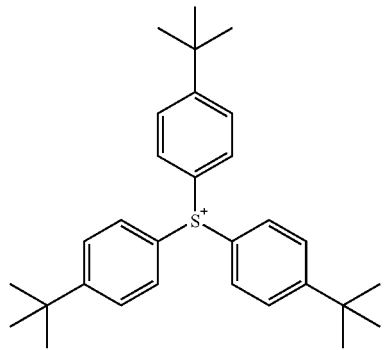
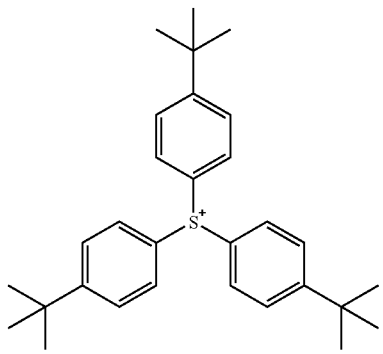
B1-18
B1-16
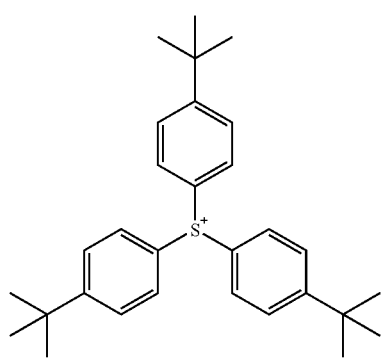
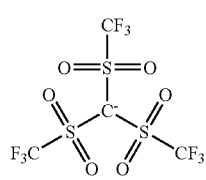
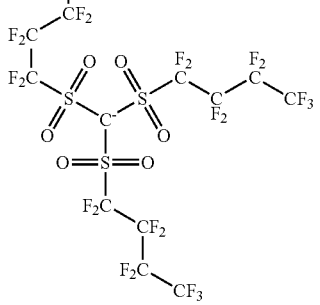
B1-17
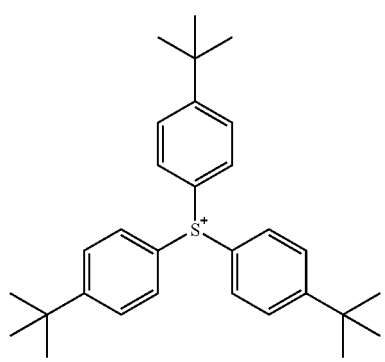
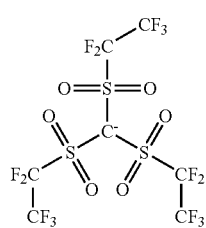
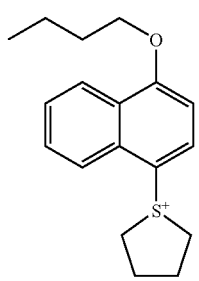 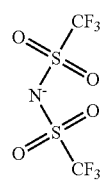
B1-19
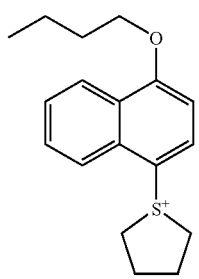 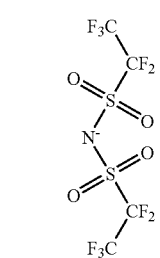
B1-20
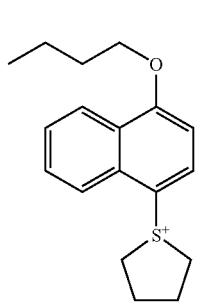 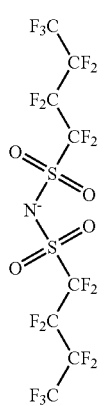
B1-21

| | | |
|---|---|---|
| B1-22 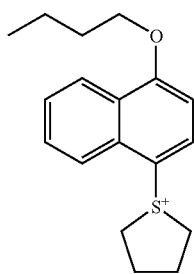 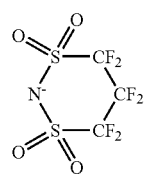 | B1-26 | 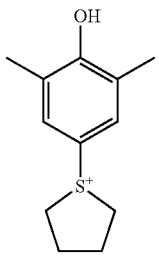 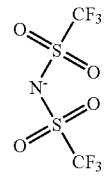 |
| B1-23 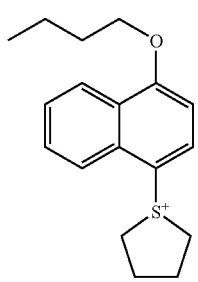 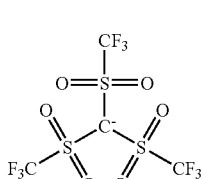 | B1-27 | 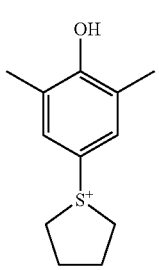 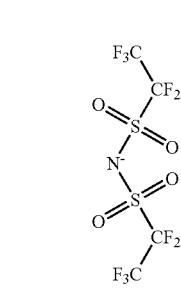 |
| B1-24 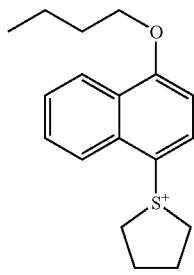 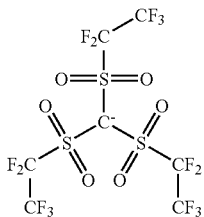 | B1-28 | 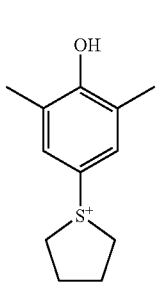 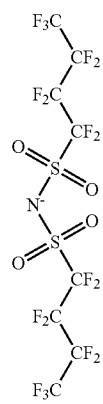 |
| B1-25 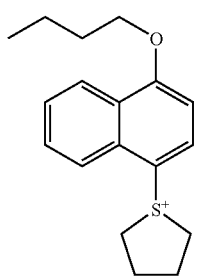 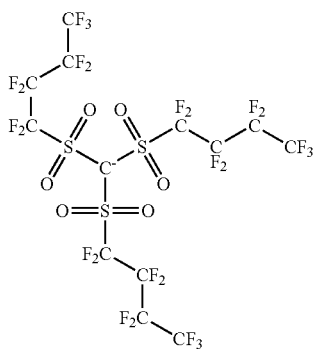 | B1-29 | 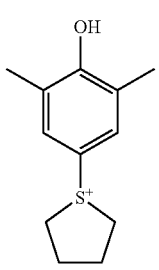 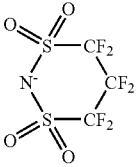 |
| | B1-30 | 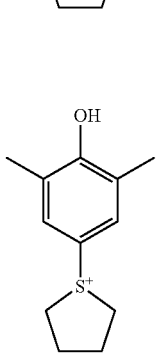 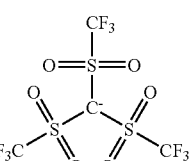 |

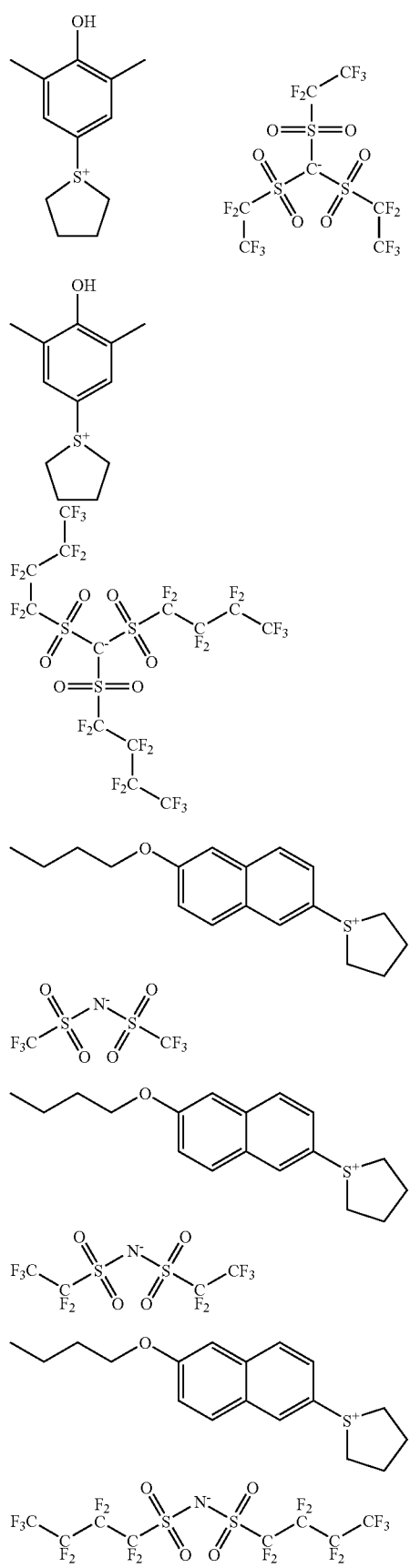
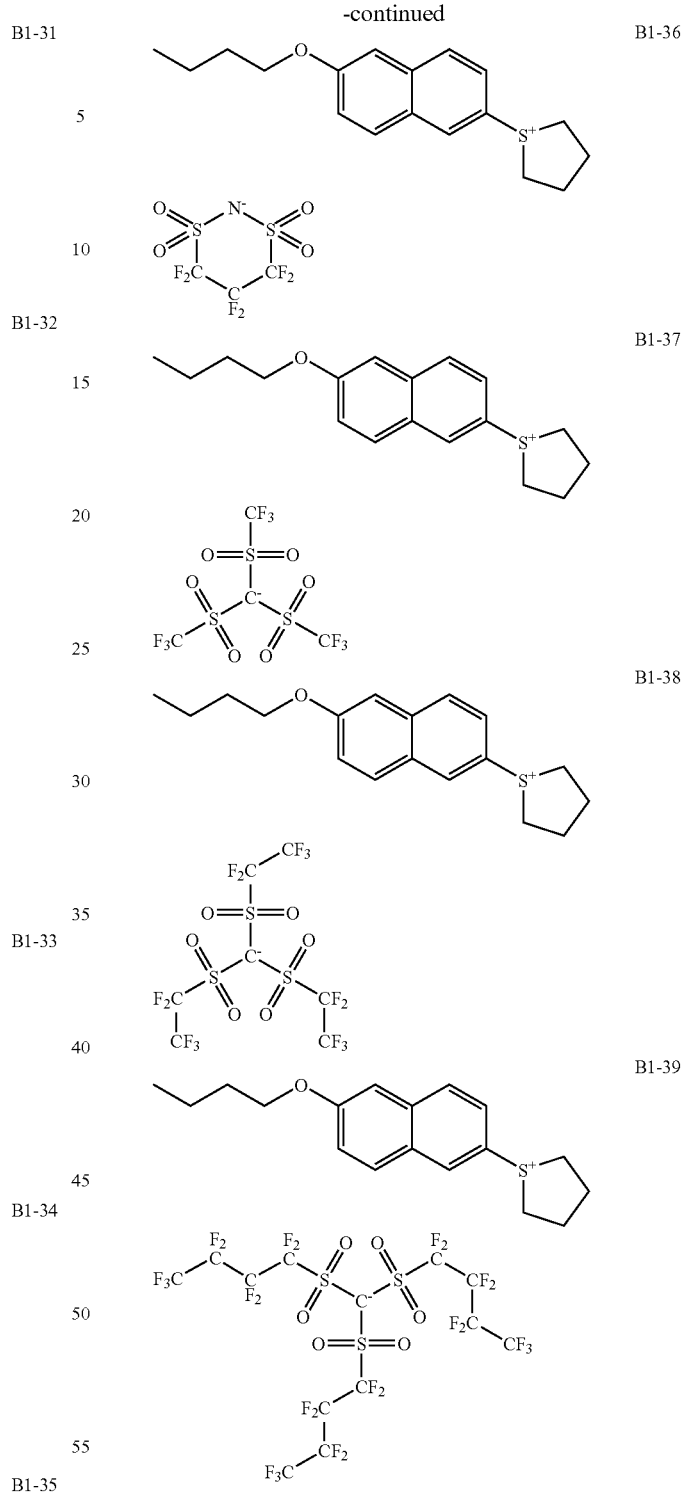

Among these sulfonium salts, preferred are B1-1 to B1-3, B1-7 to B1-9, B1-13 to B1-15, B1-19 to B1-22, B1-26 to B1-29, and B1-33 to B1-36. These are a sulfonium salt represented by formula (P1) or (P3).

As for the photo-acid generator (A), one photo-acid generator may be used alone, or a plurality of photo-acid generators may be used in combination.

The content of the photo-acid generator (A) is preferably from 1 to 60 mass %, more preferably from 3 to 50 mass %, still more preferably from 3 to 35 mass %, based on the entire solid content in the composition.

[4] Hydrophobic Resin (C)

In the case where a film formed of the composition of the present invention is exposed through an immersion medium, a hydrophobic resin (C) may be further added, if desired. The hydrophobic resin (C) when added is unevenly distributed to the surface layer of the resist film and in the case of using water as the immersion medium, the resist film formed can be enhanced in the receding contact angle on the resist film surface for water as well as in the followability of the immersion liquid. The hydrophobic resin (C) may be any resin as long as the receding contact angle on the surface is enhanced by its addition, but a resin having at least either one of a fluorine atom and a silicon atom is preferred. The receding contact angle of the resist film is preferably from 60 to 90°, more preferably 70° or more. The amount of the hydrophobic resin added may be appropriately adjusted to give a resist film having a receding contact angle in the range above but is preferably from 0.1 to 10 mass %, more preferably from 0.1 to 5 mass %, based on the entire solid content of the composition. The hydrophobic resin (C) is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and is generally known to be useful in simulating the mobility of a liquid droplet in a dynamic state. In a simple manner, the receding contact angle can be defined as a contact angle at the time of the liquid droplet interface receding when a liquid droplet ejected from a needle tip is landed on a substrate and then the liquid droplet is again suctioned into the needle. In general, the receding contact angle can be measured by a contact angle measuring method called an expansion/contraction method.

In the immersion exposure step, the immersion liquid needs to move on a wafer following the movement of an exposure head that is scanning the wafer at a high speed and forming an exposure pattern. Therefore, the contact angle of the immersion liquid with the resist film in a dynamic state is important and the resist is required to have a performance of allowing a liquid droplet to follow the high-speed scanning of an exposure head with no remaining.

The fluorine atom or silicon atom in the hydrophobic resin (C) may be present in the main chain of the resin or may be substituted on the side chain.

The hydrophobic resin (C) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being substituted by a fluorine atom and may further have other substituents.

The fluorine atom-containing cycloalkyl group is a monocyclic or polycyclic cycloalkyl group with at least one hydrogen atom being substituted by a fluorine atom and may further have other substituents.

The fluorine atom-containing aryl group is an aryl group (e.g., phenyl, naphthyl) with at least one hydrogen atom being substituted by a fluorine atom and may further have other substituents.

Preferred examples of the fluorine atom-containing alkyl group, fluorine atom-containing cycloalkyl group and fluorine atom-containing aryl group include groups represented by the following formulae (F2) to (F4), but the present invention is not limited thereto.

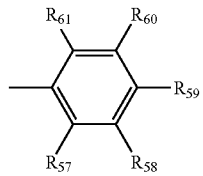

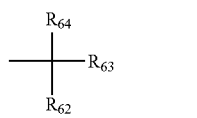

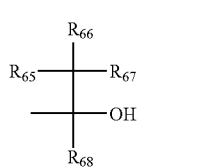

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted by a fluorine atom. It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit having a fluorine atom are set forth below, but the present invention is not limited thereto.

In specific examples, $X_1$ represents a hydrogen atom, —CH$_3$, —F or —CF$_3$.

$X_2$ represents —F or —CF$_3$.

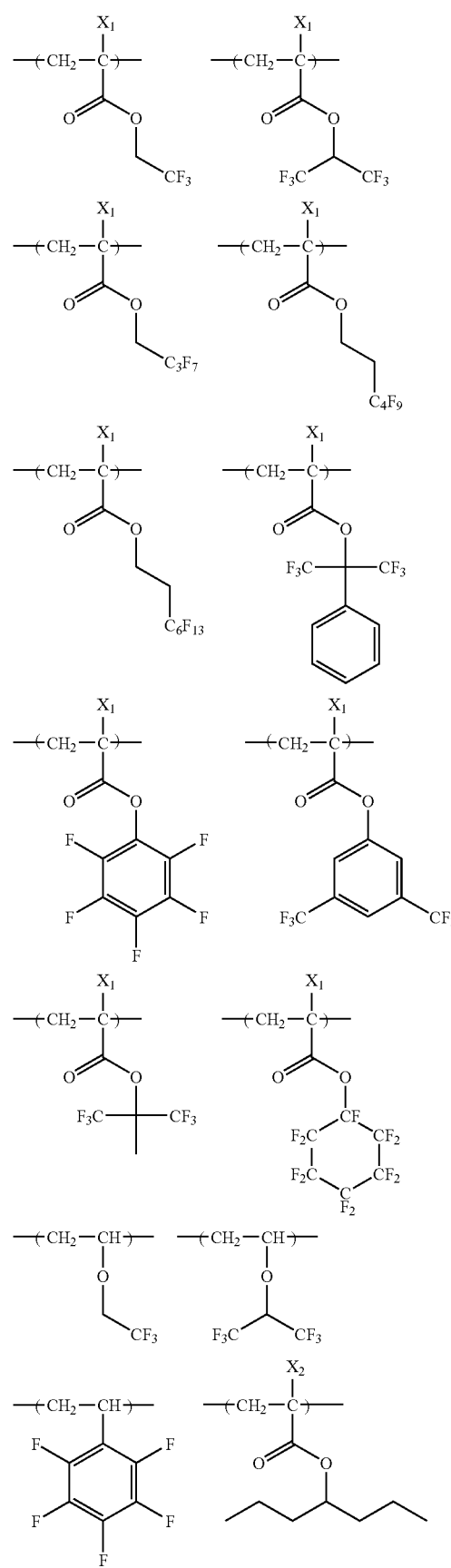
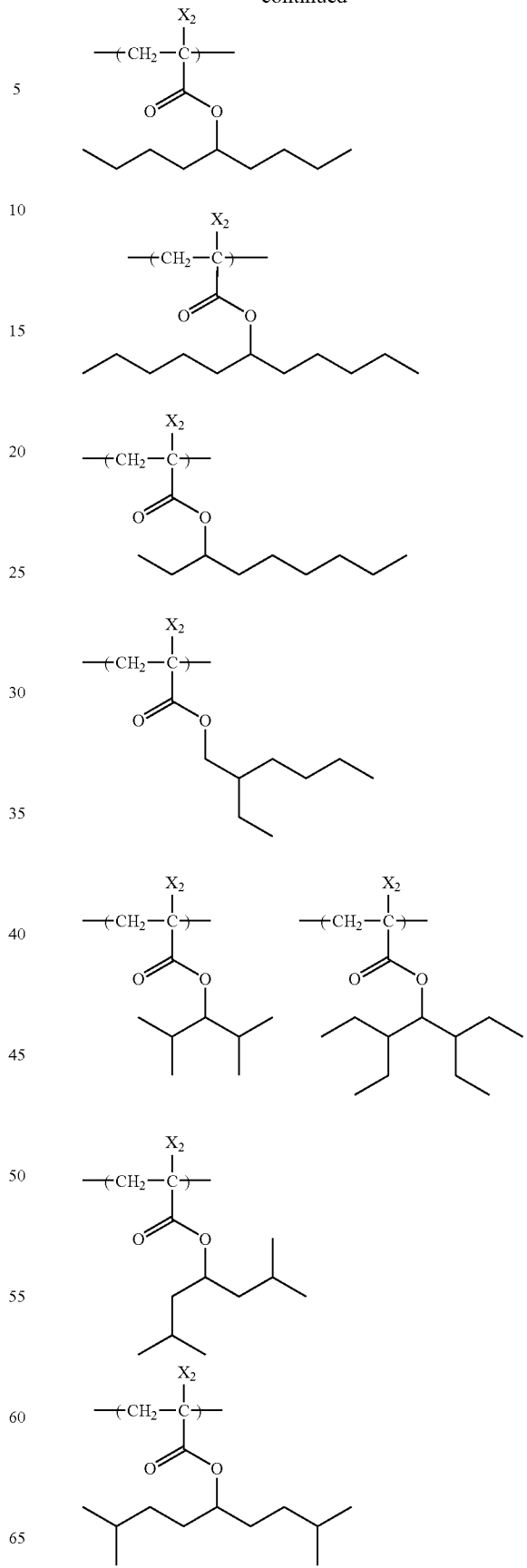

-continued

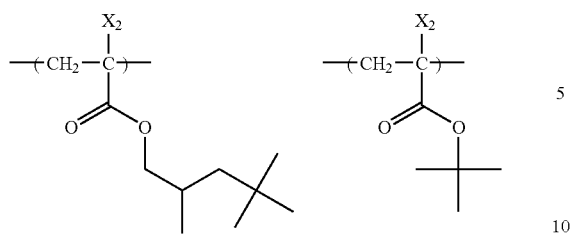

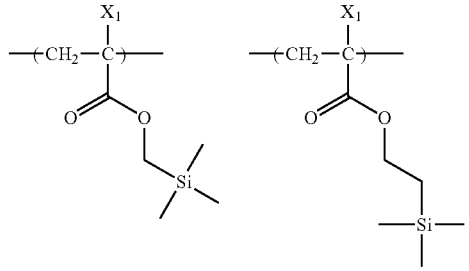

The hydrophobic resin (C) is preferably a resin having an alkylsilyl structure (preferably a trialkylsilyl group) or a cyclic siloxane structure, as a silicon atom-containing partial structure.

Specific examples of the alkylsilyl structure and cyclic siloxane structure include groups represented by the following formulae (CS-1) to (CS-3):

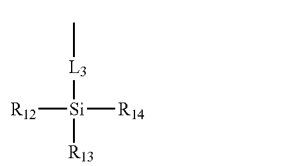
(CS-1)

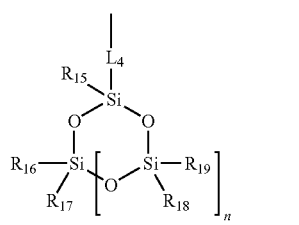
(CS-2)

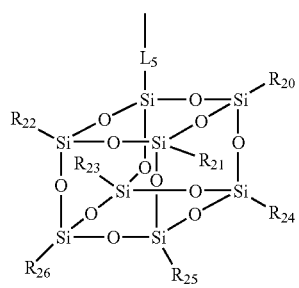
(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a single group or a combination of two or more groups, selected from the group consisting of an alkylene group, a phenylene group, an ether group, a thioether group, a carbonyl group, an ester group, an amide group, a urethane group and a ureylene group.

n represents an integer of 1 to 5.

Specific examples of the repeating unit having a group represented by formula (CS-1) to (CS-3) are set forth below, but the present invention is not limited thereto. In specific examples, $X_1$ represents a hydrogen atom, —$CH_3$, —F or —$CF_3$.

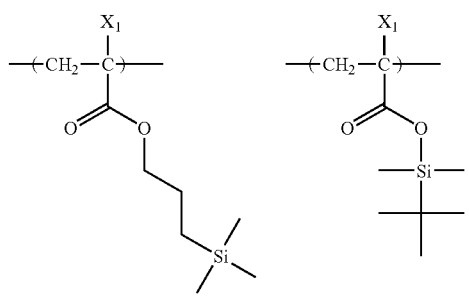

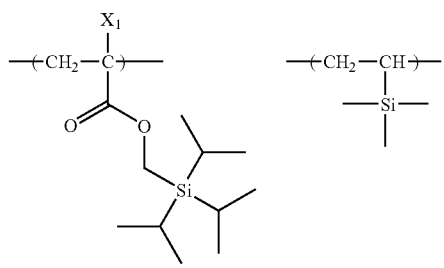

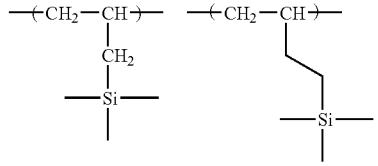

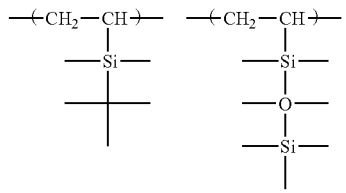

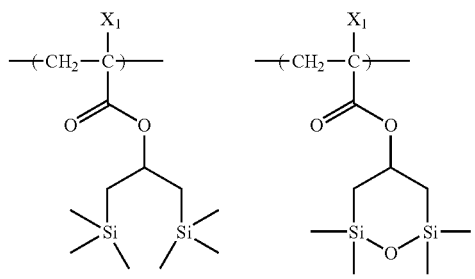

-continued

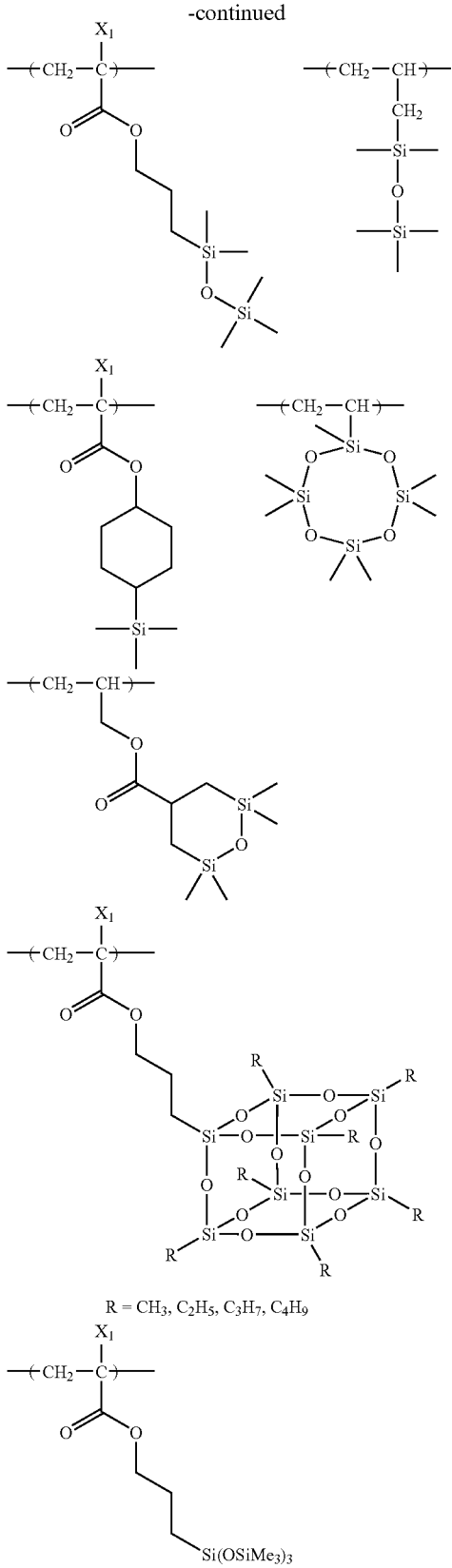

Furthermore, the hydrophobic resin (C) may contain at least one group selected from the group consisting of the following (x) to (z):

(x) an alkali-soluble group,
(y) a group capable of decomposing by the action of an alkali developer to increase the solubility in an alkali developer, and
(z) a group capable of decomposing by the action of an acid.

Examples of the (x) alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups include a fluorinated alcohol group (preferably hexafluoroisopropanol), a sulfonimide group and a bis(carbonyl)methylene group.

As for the repeating unit having (x) an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred.

The content of the repeating unit having (x) an alkali-soluble group is preferably from 1 to 50 mol %, more preferably from 3 to 35 mol %, still more preferably from 5 to 20 mol %, based on all repeating units in the resin.

Specific examples of the repeating unit having (x) an alkali-soluble group are set forth below, but the present invention is not limited thereto.

In the formulae, Rx represents H, $CH_3$, $CF_3$ or $CH_2OH$.

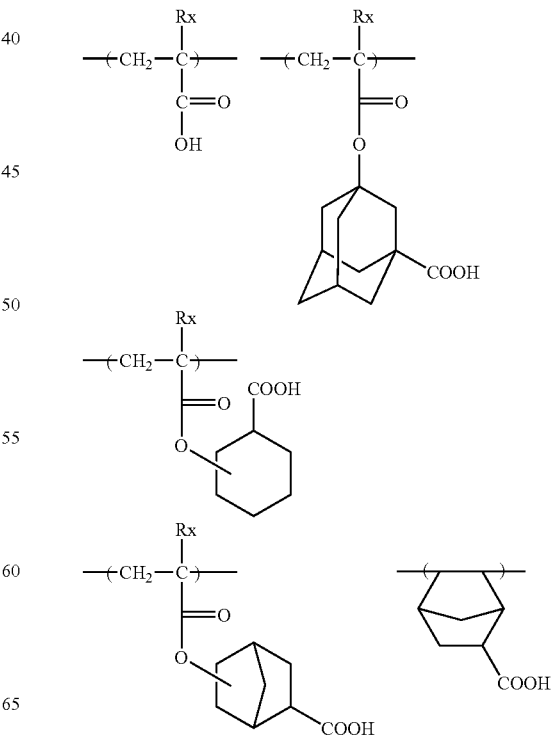

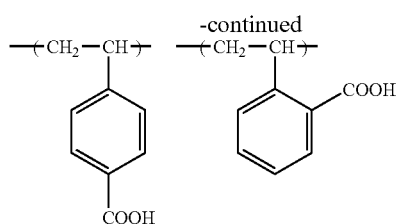
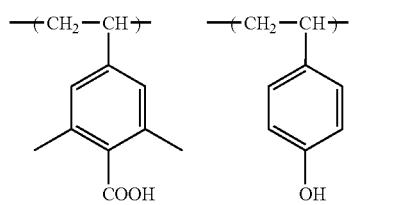
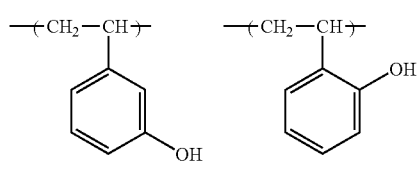
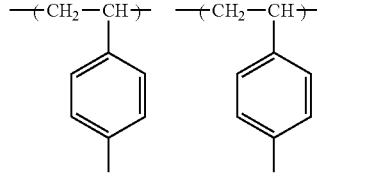
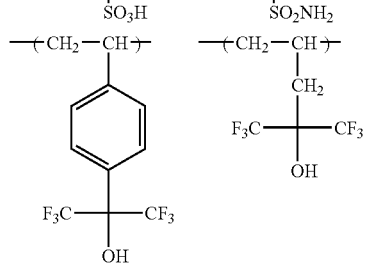
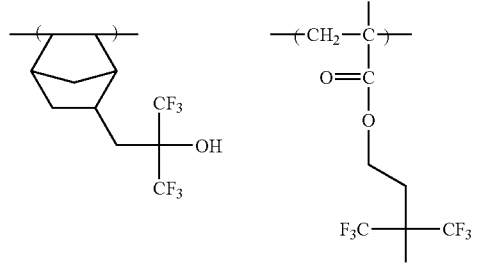
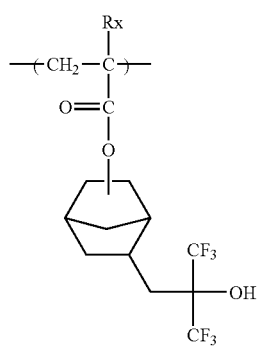
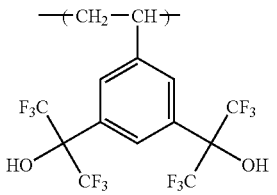
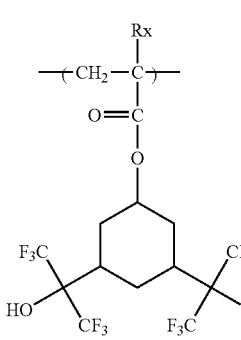
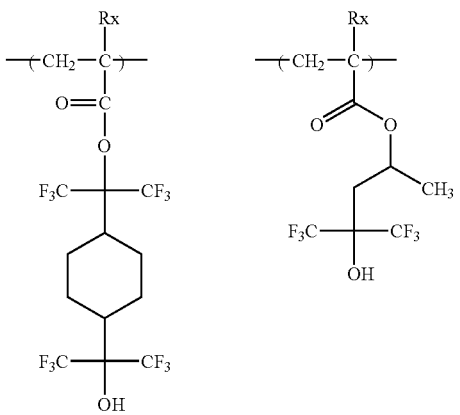
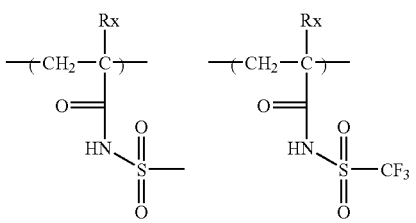
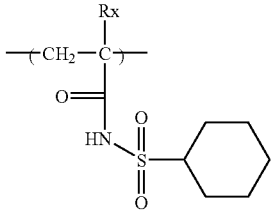
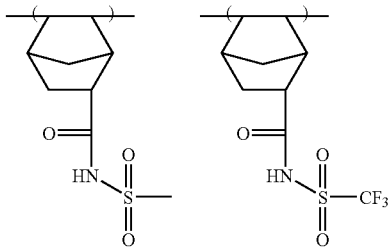

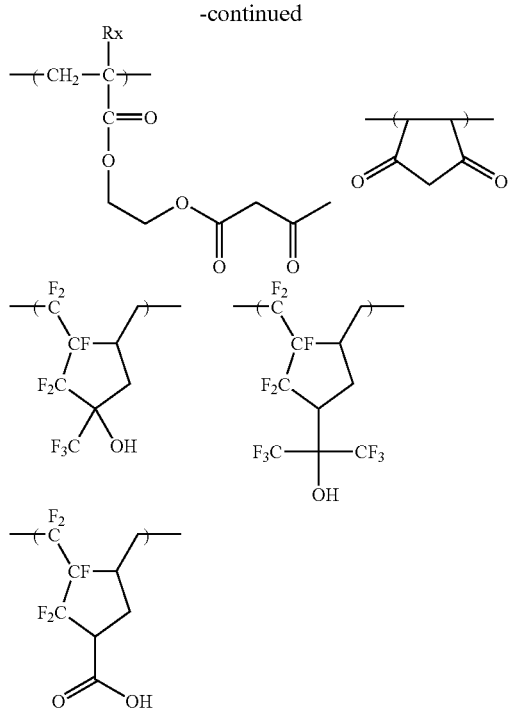

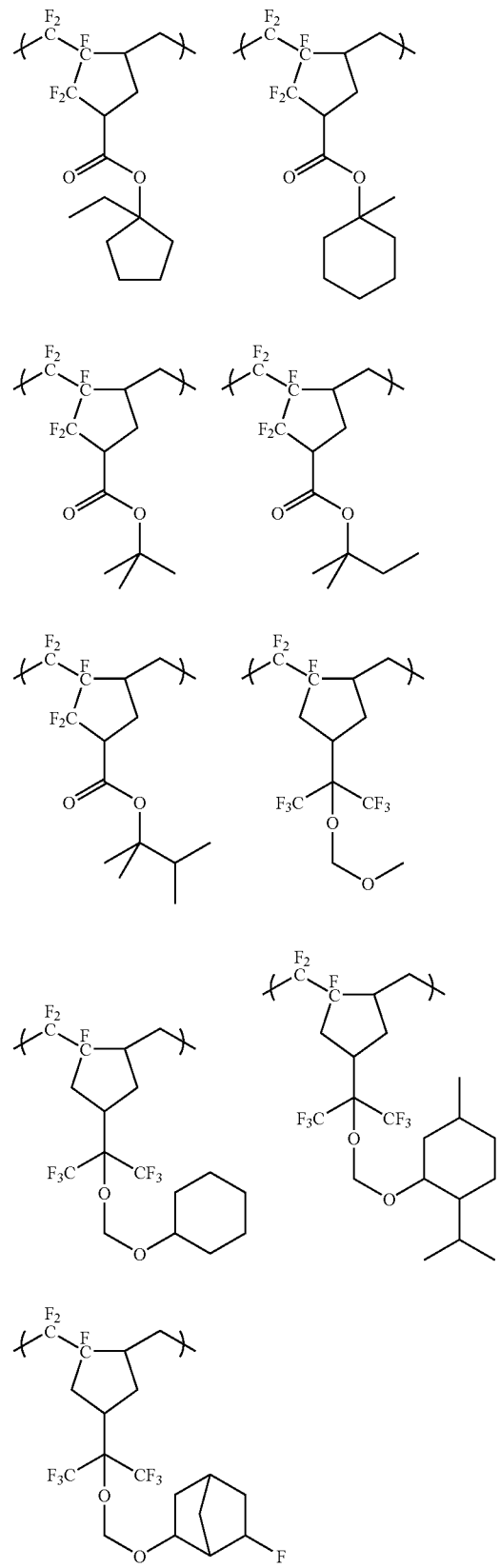

Examples of the (y) group capable of decomposing by the action of an alkali developer to increase the solubility in an alkali developer include a lactone structure-containing group, an acid anhydride group and an acid imide group, with a lactone structure-containing group being preferred.

As for the repeating unit having (y) a group capable of decomposing by the action of an alkali developer to increase the solubility in an alkali developer, both a repeating unit where (y) a group capable of decomposing by the action of an alkali developer to increase the solubility in an alkali developer is bonded to the main chain of the resin, such as repeating unit by an acrylic acid ester or a methacrylic acid ester, and a repeating unit where (y) a group capable of increasing the solubility in an alkali developer is introduced into the polymer chain terminal by using a polymerization initiator or chain transfer agent containing the group at the polymerization, are preferred.

The content of the repeating unit having (y) a group capable of increasing the solubility in an alkali developer is preferably from 1 to 40 mol %, more preferably from 3 to 30 mol %, still more preferably from 5 to 15 mol %, based on all repeating units in the resin.

Specific examples of the repeating unit having (y) a group capable of increasing the solubility in an alkali developer are the same as those of the repeating unit having a lactone structure described for the resin of the component (B).

Examples of the repeating unit having (z) a group capable of decomposing by the action of an acid, contained in the hydrophobic resin (C), include the same repeating units as those of the repeating unit having an acid-decomposable group described for the resin of the component (B) and repeating units shown below. In the hydrophobic resin (C), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin.

The hydrophobic resin (C) may further contain a repeating unit represented by the following formula (IIIC):

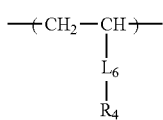

(IIIC)

In formula (IIIC), $R_4$ represents a group having an alkyl group, a cycloalkyl group, an alkenyl group or a cycloalkenyl group.

$L_6$ represents a single bond or a divalent linking group.

In formula (IIIC), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The divalent linking group of $L_6$ is preferably an alkylene group (preferably having a carbon number of 1 to 5) or an oxy group.

In the case where the hydrophobic resin (C) contains a fluorine atom, the fluorine atom content is preferably from 5 to 80 mass %, more preferably from 10 to 80 mass %, based on the molecular weight of the hydrophobic resin (C). Also, the fluorine atom-containing repeating unit preferably occupies from 10 to 100 mass %, more preferably from 30 to 100 mass %, in the hydrophobic resin (C).

In the case where the hydrophobic resin (C) contains a silicon atom, the silicon atom content is preferably from 2 to 50 mass %, more preferably from 2 to 30 mass %, based on the molecular weight of the hydrophobic resin (C). Also, the silicon atom-containing repeating unit preferably occupies from 10 to 100 mass %, more preferably from 20 to 100 mass %, in the hydrophobic resin (C).

The standard polystyrene-equivalent weight average molecular of the hydrophobic resin (C) is preferably from 1,000 to 100,000, more preferably from 1,000 to 50,000, still more preferably from 2,000 to 15,000.

In the hydrophobic resin (C), similarly to the resin of the component (B), it is of course preferred that the content of impurities such as metal is small, but the content of residual monomers or oligomer components is also preferably from 0 to 10 mass %, more preferably from 0 to 5 mass %, still more preferably from 0 to 1 mass %. When these conditions are satisfied, a resist free of in-liquid extraneous substances and change with aging of sensitivity and the like can be obtained. Also, in view of resolution, resist profile, side wall of resist pattern, roughness and the like, the molecular weight distribution (Mw/Mn, also called polydispersity) is preferably from 1 to 5, more preferably from 1 to 3, still more preferably from 1 to 2.

As for the hydrophobic resin (C), various commercially available products may be used or the resin may be synthesized by an ordinary method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane, diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The reaction concentration is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of combining water washing or an appropriate solvent to remove residual monomers or oligomer components; a purification method in a solution sate, such as ultrafiltration of removing by extraction only those having a molecular weight not more than a specific value; a reprecipitation method of adding dropwise the resin solution in a poor solvent to solidify the resin in the poor solvent and thereby remove residual monomers and the like; and a purification method in a solid state, such as washing with a poor solvent of a resin slurry separated by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times.

The solvent used at the operation of precipitation or reprecipitation from the polymer solution (precipitation or reprecipitation solvent) may be sufficient if it is a poor solvent to the polymer, and the solvent may be appropriately selected, for example, from a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system or continuous system.

The precipitated or reprecipitated polymer is usually subjected to commonly employed solid-liquid separation such as filtration or centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Specific examples of the hydrophobic resin (C) are set forth below. Also, the molar ratio of repeating units (corresponding to repeating units from the left), weight average molecular weight and polydispersity of each resin are shown in Tables 1 and 2 below.

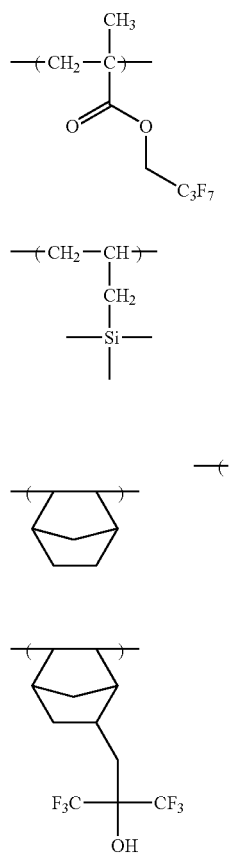

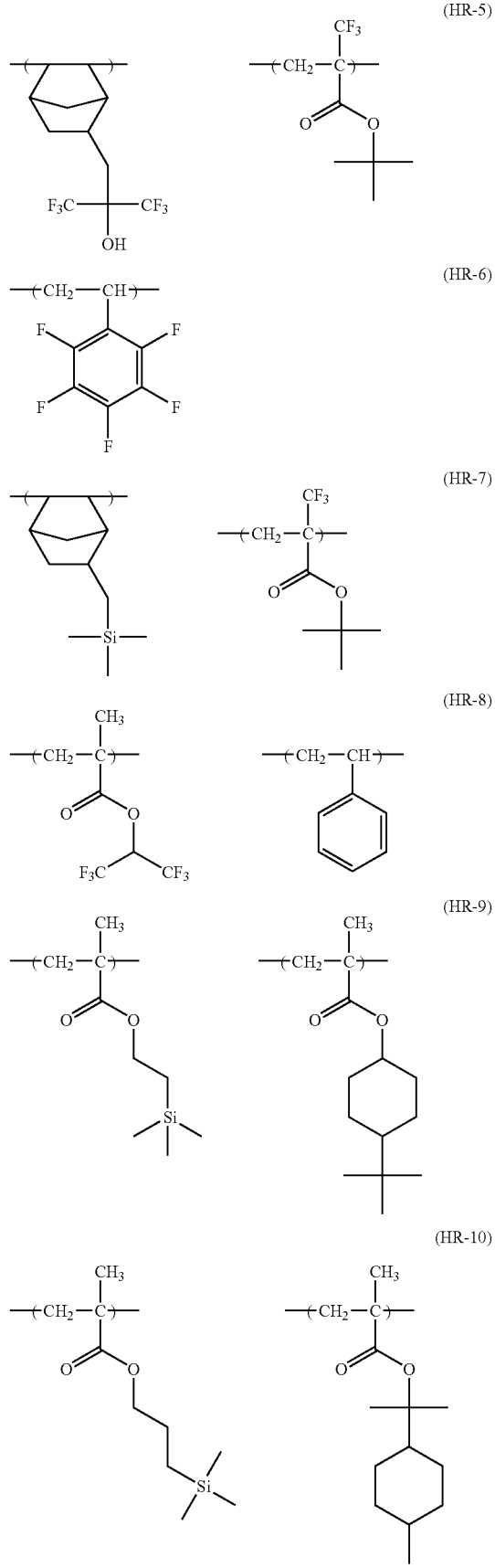

(HR-11)
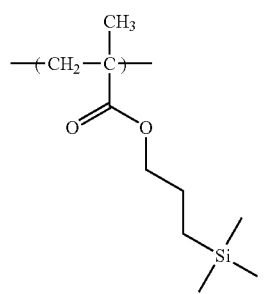
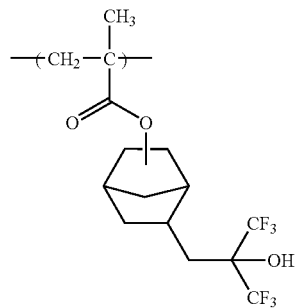
(HR-12)
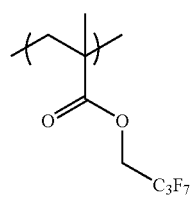
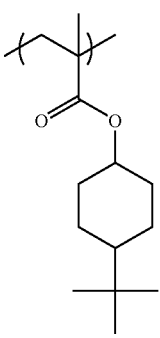
(HR-13)
(HR-14)
(HR-15)
(HR-16)
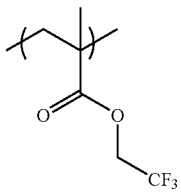
(HR-17)
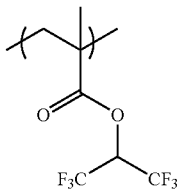
(HR-18)
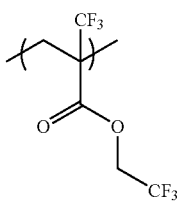
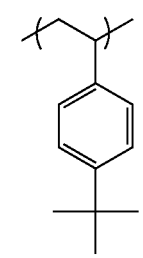
(HR-19)
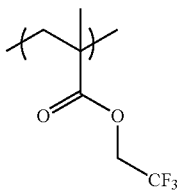
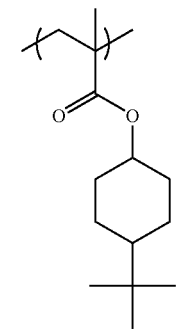
(HR-20)
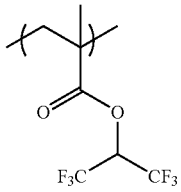
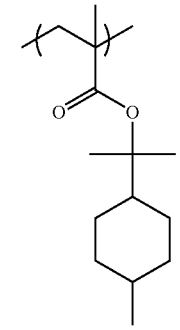
(HR-21)

(HR-22) 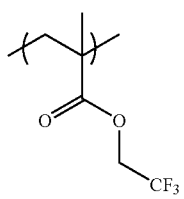 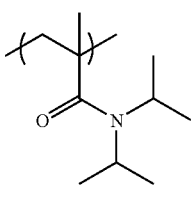
(HR-23) 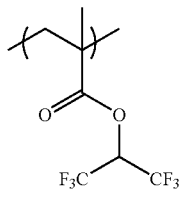 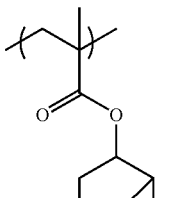
(HR-24) 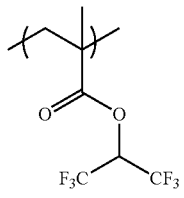 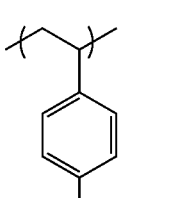
(HR-25) 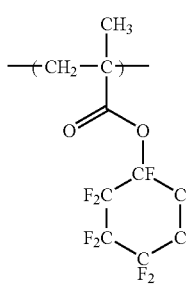 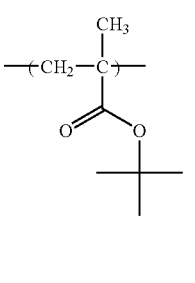
(HR-26) 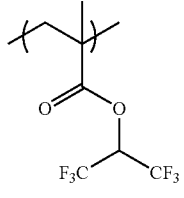 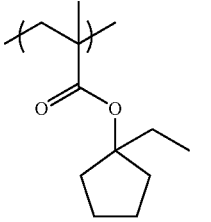
(HR-27) 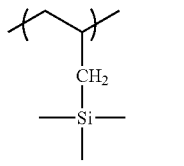 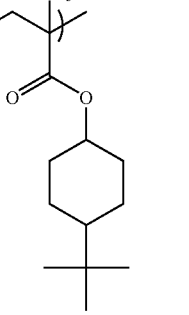
(HR-28) 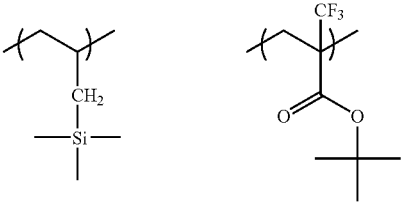
(HR-29) 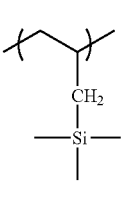 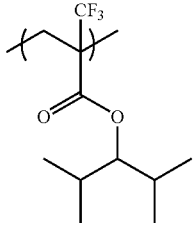
(HR-30) 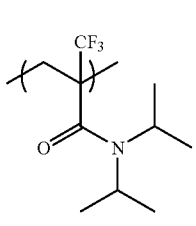
(HR-31) 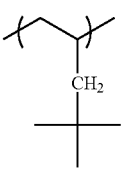 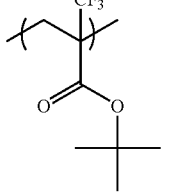
(HR-32) 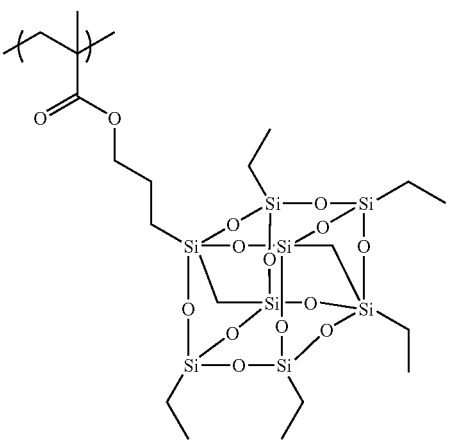
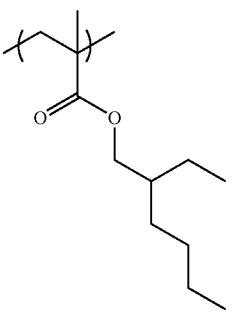

(HR-33)
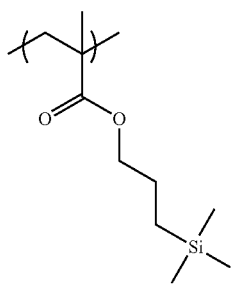 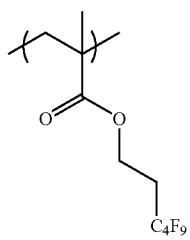
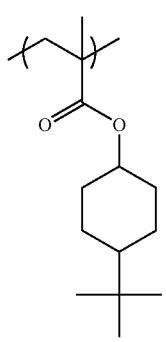
(HR-34)
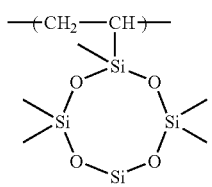 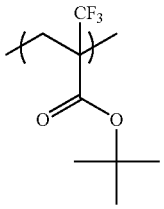
(HR-35)
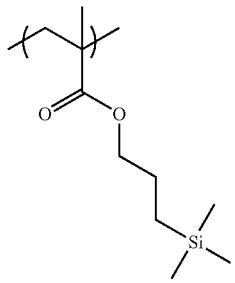 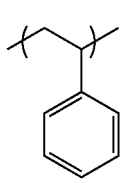
(HR-36)
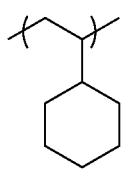 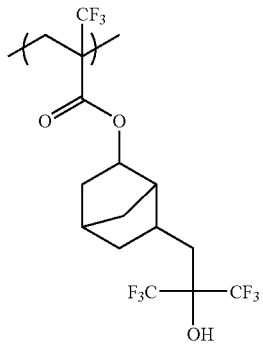
(HR-37)
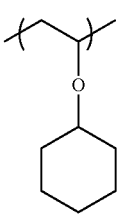 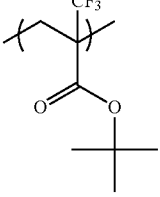
(HR-38)
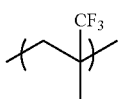 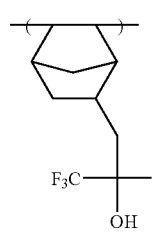
(HR-39)
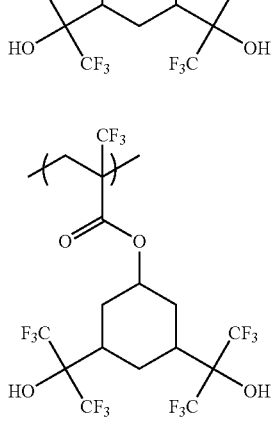 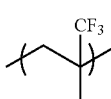 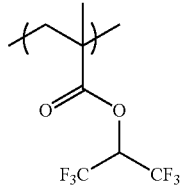
(HR-40)
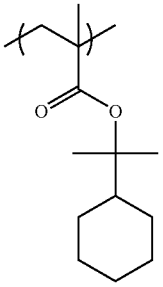 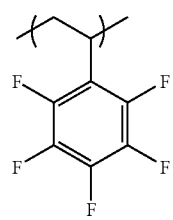
(HR-41)
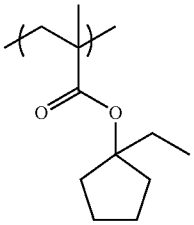 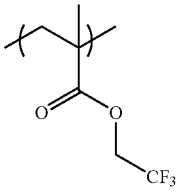
(HR-42)
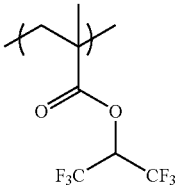

(HR-43)
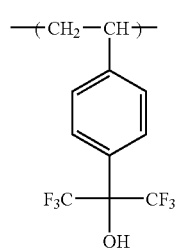 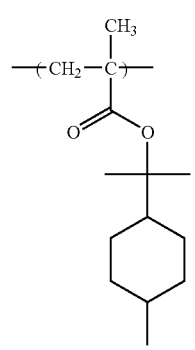
(HR-44)
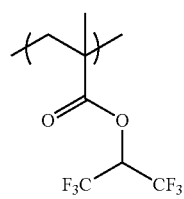 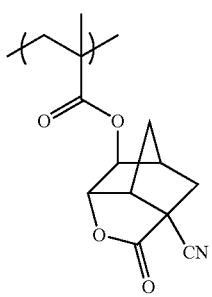
(HR-45)
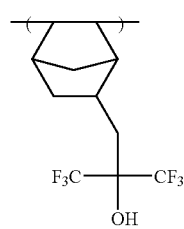 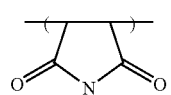
(HR-46)
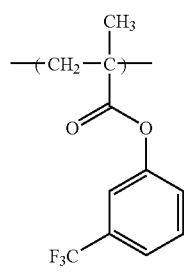 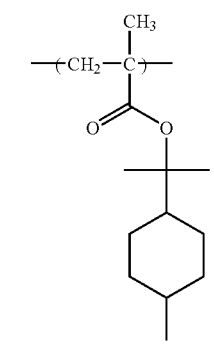
(HR-47)
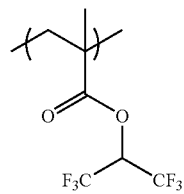 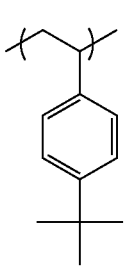 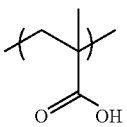
(HR-48)
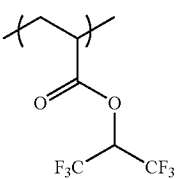 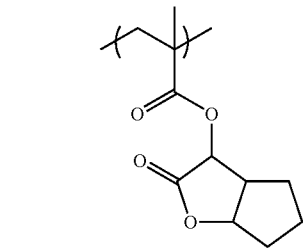
(HR-49)
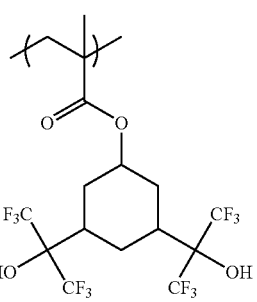
(HR-50)
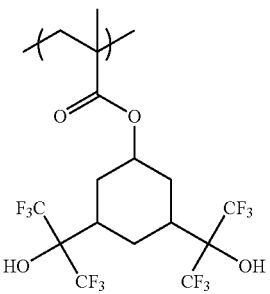 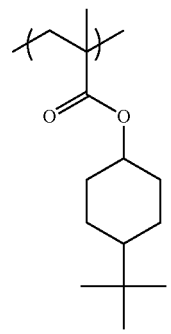
(HR-51)
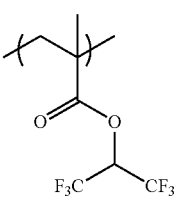 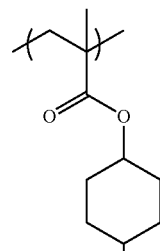 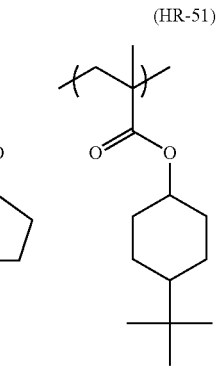
(HR-52)
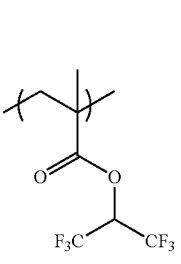 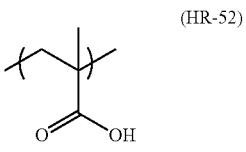

(HR-53)
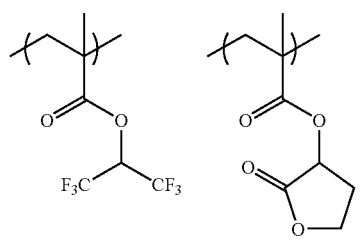
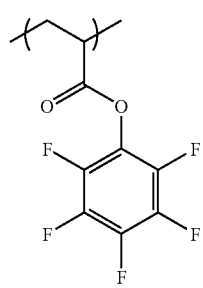
(HR-54)
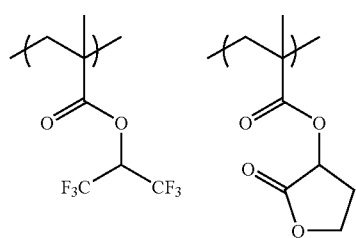
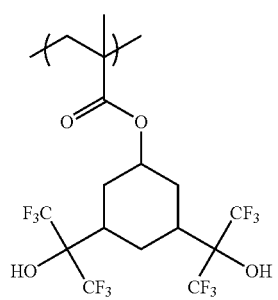
(HR-55)
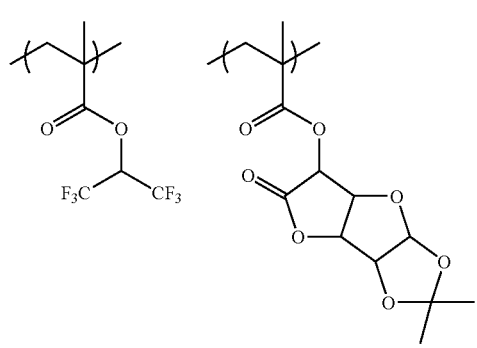
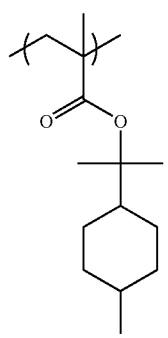
(HR-56)
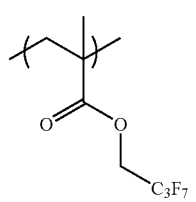
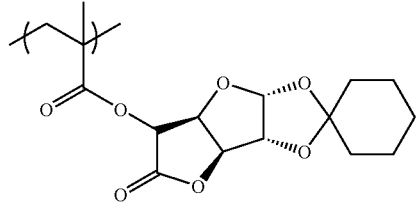
(HR-57)
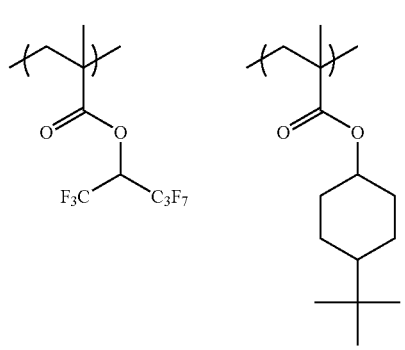
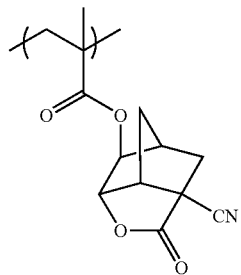
(HR-58)
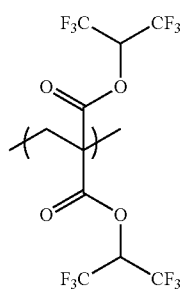 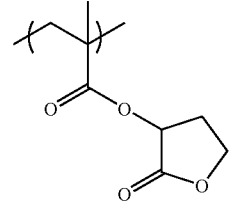

-continued
(HR-59) 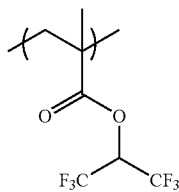 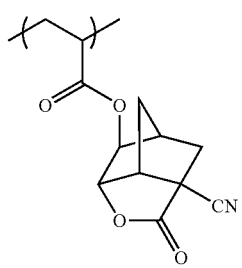
(HR-60) 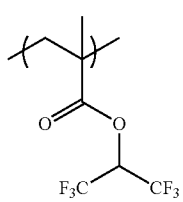 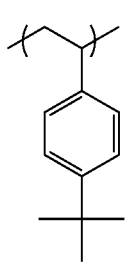
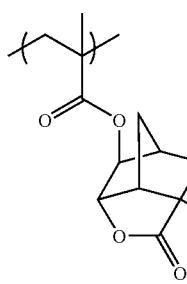 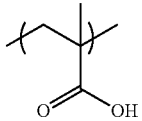
(HR-61) 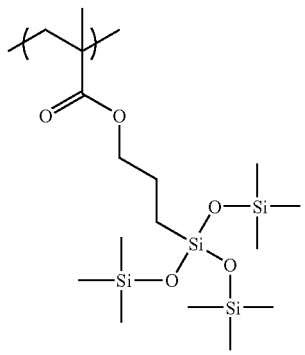
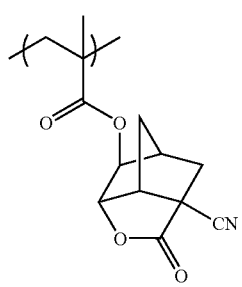
-continued
(HR-62) 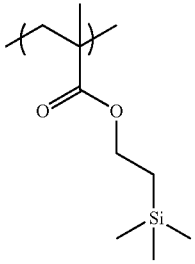 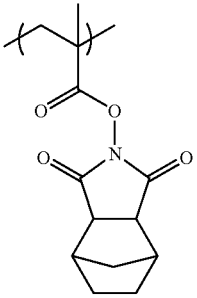
(HR-63) 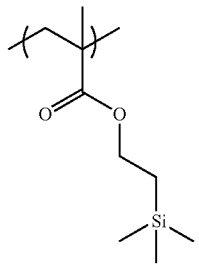 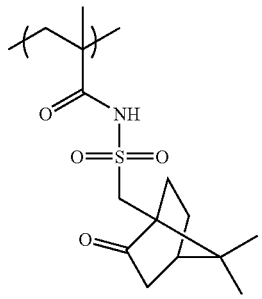
(HR-64) 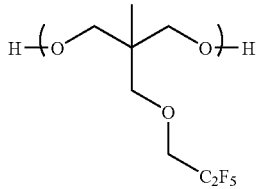
(HR-65) 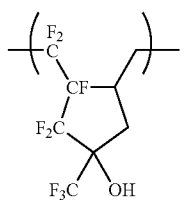
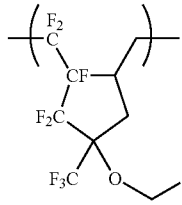
(HR-66) 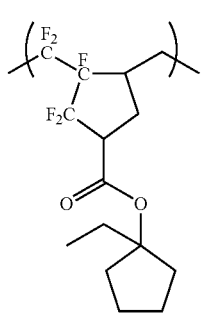

-continued
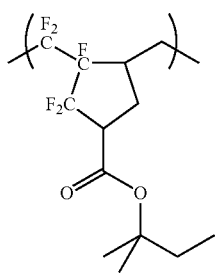
(HR-67)
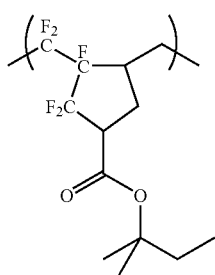
(HR-68)
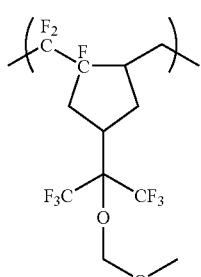
(HR-69)
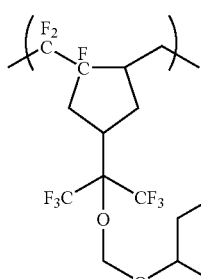
(HR-70)
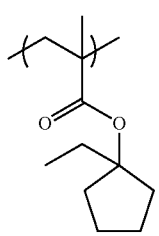
(HR-71)
-continued
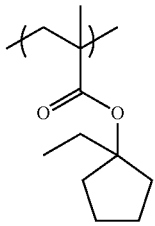
(HR-72)
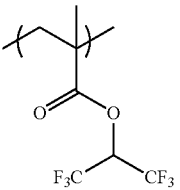
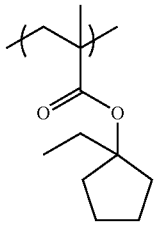
(HR-73)
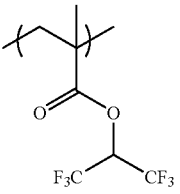
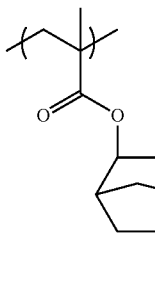
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |

TABLE 1-continued

| Resin | Composition | Mw | Mw/Mn |
|---|---|---|---|
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mn/Mw |
|---|---|---|---|
| HR-66 | 100 | 8000 | 1.4 |
| HR-67 | 100 | 5200 | 1.3 |
| HR-68 | 80/20 | 4500 | 1.5 |
| HR-69 | 100 | 4000 | 1.6 |
| HR-70 | 20/80 | 6400 | 1.4 |
| HR-71 | 60/40 | 5500 | 1.4 |
| HR-72 | 60/40 | 6000 | 1.6 |
| HR-73 | 30/40/30 | 5000 | 1.5 |

[5] Solvent:

Examples of the solvent that can be used at the time of preparing the composition by dissolving the above-described components include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate (PGMEA; 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether (PGME; 1-methoxy-2-propanol), propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent that can be preferably used includes a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent containing no hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent containing no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group to the solvent containing no hydroxyl group is usually from 1/99 to 99/1, preferably from 10/90 to 90/10, more preferably from 20/80 to 60/40. A mixed solvent in which the solvent containing no hydroxyl group is contained in a ratio of 50 mass % or more is particularly preferred in view of coating uniformity.

The solvent is preferably a mixed solvent of two or more kinds of solvents containing propylene glycol monomethyl ether acetate.

[6] Basic Compound

The composition of the present invention may contain a basic compound. The basic compound is preferably a compound having a structure represented by any one of the following formulae (A) to (E):

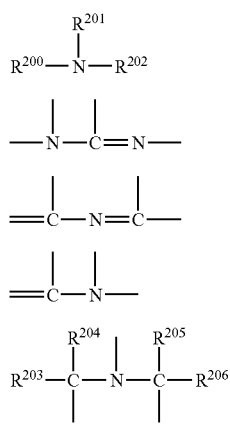

In formulae (A) to (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine with each other to form a ring. Each of $R^{203}$, $R^{204}$, $R^{205}$ and $R^{206}$, which may be the same or different, represents an alkyl group (preferably having a carbon number of 1 to 20).

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include compound where the anion moiety of the compounds having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred. Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. The organic sulfonate includes an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The phenoxy group-containing amine compound and the phenoxy group-containing ammonium salt compound are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

The sulfonic acid ester group in the sulfonic acid ester group-containing amine compound and sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

Such a basic compound is preferably used, in terms of a ratio to the above-described (D) low molecular compound having a group capable of leaving by the action of an acid, in a molar ratio ((D) low molecular compound having a group capable of leaving by the action of an acid/basic compound) of 100/0 to 10/90, more preferably in a molar ratio ((D) low molecular compound having a group capable of leaving by the action of an acid/basic compound) of 100/0 to 30/70, still more preferably in a molar ratio ((D) low molecular compound having a group capable of leaving by the action of an acid/basic compound) of 100/0 to 50/50.

Incidentally, the basic compound as used here does not include (D) a low molecular compound having a group capable of leaving by the action of an acid when this is a basic compound.

[7] Surfactant (E)

The composition of the present invention may further contain a surfactant, and when a surfactant is contained, it is preferred to contain any one of or two or more kinds of fluorine-containing and/or silicon-containing surfactants (a fluorine-containing surfactant, a silicon-containing surfactant and a surfactant containing both a fluorine atom and a silicon atom).

By virtue of incorporating the above-described surfactant into the composition of the present invention, a resist pattern exhibiting good performance in terms of sensitivity, resolution and adherence and less suffering from development defect can be provided when using an exposure light source of 250 nm or less, particularly 220 nm or less.

Examples of the fluorine-containing and/or silicon-containing surfactant include surfactants described in paragraph [0276] of U.S. Patent Application Publication No. 2008/0248425, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

As for the surfactant, other than these known surfactants, a surfactant using a polymer having a fluoro-aliphatic group derived from a fluoro-aliphatic compound that is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, surfactants other than the fluorine-containing and/or silicon-containing surfactant, described in paragraph [0280] of U.S. Patent Application Publication No. 2008/0248425, may also be used.

One of such surfactants may be used alone, or some of them may be used in combination.

The amount of the surfactant used is preferably from 0.0001 to 2 mass %, more preferably from 0.001 to 1 mass %, based on the entire amount of the composition (excluding the solvent).

[8] Onium Carboxylate (F)

The composition of the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear or branched, monocyclic or polycyclic alkylcarboxylate anion having a carbon number of 1 to 30, more preferably the carboxylate anion above whose alkyl group is partially or entirely fluorine-substituted. The alkyl chain may contain an oxygen atom. Thanks to such a construction, the transparency to light at 220 nm or less is ensured, the sensitivity and resolution are enhanced, and the iso/dense bias and exposure margin are improved.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

[9] Other Additives:

The composition of the present invention may further contain, for example, a dye, a plasticizer, a photosensitizer, a light absorber and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid, and a cyclohexanedicarboxylic acid.

[10] Pattern Forming Method:

The composition of the present invention is preferably used in a film thickness of 30 to 250 nm, more preferably from 30 to 200 nm, from the standpoint of enhancing the resolution. Such a film thickness can be obtained by setting the solid content concentration in the composition to an appropriate range, thereby imparting an appropriate viscosity and enhancing the coatability and film-forming property.

The entire solid content concentration in the composition is generally from 1 to 10 mass %, preferably from 1 to 8.0 mass %, more preferably from 1.0 to 6.0 mass %.

The composition of the present invention is used by dissolving the components above in a predetermined organic solvent, preferably in the above-described mixed solvent, filtering the solution, and coating it on a predetermined support as follows. The filter used for filtration is preferably a polytetrafluoroethylene-, polyethylene- or nylon-made filter having a pore size of 0.1 µm or less, more preferably 0.05 µm or less, still more preferably 0.03 µm or less.

For example, the composition is coated on such a substrate (e.g., silicon/silicon dioxide-coated substrate) as used in the production of a precision integrated circuit device, by an appropriate coating method such as spinner or coater and dried to form a resist film.

The resist film is irradiated with an actinic ray or radiation through a predetermined mask, then preferably baked (heated), and subjected to development and rinsing, whereby a good pattern can be obtained.

Examples of the exposure light source include an actinic ray or radiation such as infrared light, visible light, ultraviolet light, far ultraviolet light, X-ray and electron beam, but the exposure light source is preferably far ultraviolet light at a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm), X-ray and electron beam, with ArF excimer laser, $F_2$ excimer laser, EUV (13 nm) and electron beam being preferred.

Incidentally, in the present invention, an electromagnetic wave such as ultraviolet light and X-ray is included in the radiation.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type composed of a light absorber and a polymer material. As for the organic antireflection film, there may be also used a commercially available organic antireflection film such as DUV30 Series and DUV-40 Series produced by Brewer Science, Inc. and AR-2, AR-3 and AR-5 produced by Shipley Co., Ltd.

As for the alkali developer in the development step, a quaternary ammonium salt typified by tetramethylammonium hydroxide is usually used, but other than this compound, an aqueous alkali solution of an inorganic alkali, a primary to tertiary amine, an alcohol amine, a cyclic amine or the like may also be used.

Furthermore, the alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

As for the rinsing solution, pure water is used, and the pure water may be used after adding thereto a surfactant in an appropriate amount.

After the development or rinsing, a treatment of removing the developer or rinsing solution adhering on the pattern by a supercritical fluid may be performed.

The exposure may also be performed by filling a liquid (immersion medium) having a refractive index higher than that of air between the resist film and a lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is intermixed, this incurs distortion of the optical image projected on the resist film. Therefore, the water used is preferably distilled water. Pure water obtained by further filtering the distilled water through an ion exchange filter or the like may also be used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by increasing the refractive index of the immersion liquid. From such a standpoint, an additive for increasing the refractive index may be added to water, or deuterated water ($D_2O$) may be used in place of water.

In order to prevent the resist film from directly contacting with the immersion liquid, a film (hereinafter, sometimes referred to as a "topcoat") sparingly soluble in the immersion liquid may be provided between the resist film formed of the actinic ray-sensitive or radiation-sensitive resin composition of the present invention and the immersion liquid. The functions required of the topcoat are suitability for coating as an overlayer of the resist, transparency to radiation particularly at 193 nm, and sparing solubility in the immersion liquid. The topcoat is preferably unmixable with the resist and uniformly coatable as an overlayer of the resist.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (C) is suitable also as the topcoat. If impurities are dissolved out into the immersion liquid from the topcoat, the optical lens is contaminated. In this viewpoint, the amount of residual monomer components of the polymer contained in the topcoat is preferably smaller.

On peeling off the topcoat, a developer may be used or a releasing agent may be separately used. The releasing agent is preferably a solvent less permeating the resist film. From the standpoint that the peeling step can be performed simultaneously with the development step of the resist film, the topcoat is preferably peelable with an alkali developer and for enabling the peeling with an alkali developer, the topcoat is preferably acidic, but in view of non-intermixing with the resist film, the topcoat may be neutral or alkaline.

With no difference in the refractive index between the topcoat and the immersion liquid, the resolution is enhanced. In the case of using water as the immersion liquid at the exposure with an ArF excimer laser (wavelength: 193 nm), the topcoat for ArF immersion exposure preferably has a refractive index close to the refractive index of the immersion liquid. In view of approximating the refractive index to that of the immersion liquid, the topcoat preferably contains a fluorine atom. Also, considering the transparency and refractive index, the topcoat is preferably a thin film.

The topcoat is preferably unmixable with the resist film and further unmixable with the immersion liquid. From this standpoint, when the immersion liquid is water, the topcoat solvent is preferably a medium that is sparingly soluble in the solvent used for the positive resist composition and insoluble in water. Furthermore, when the immersion liquid is an organic solvent, the topcoat may be water-soluble or water-insoluble.

EXAMPLES

The present invention is described below by referring to Examples, but the present invention should not be construed as being limited thereto.

<Synthesis of Resin>

Synthesis of Resin RA-1:

Under a nitrogen stream, 63.35 g of cyclohexanone was charged into a three-necked flask, and the flask was heated at 80° C. Thereto, a solution prepared by dissolving 12.42 g of Monomer A, 14.01 g of Monomer B, 5.51 g of Monomer C and 1.44 g (5.0 mol % based on monomers) of polymerization initiator V-601 (produced by Wako Pure Chemical Industries, Ltd.) in 117.64 g of cyclohexanone was added dropwise over 6 hours. After the completion of dropwise addition, the mixture was further reacted at 80° C. for 2 hours. The reaction solution was allowed to cool and then added dropwise to a mixed solution of 900 ml-methanol/100 ml-water over 20 minutes, and the precipitated powder was collected by filtration and dried to obtain 18 g of Resin (RA-1). The weight average molecular weight of the resin obtained was 10,700 in terms of standard polystyrene and the polydispersity (Mw/Mn) was 1.81.

Other resins (RA-2 to RA-9) were synthesized in the same manner. The weight average molecular weight was adjusted by changing the amount of the initiator.

(A)
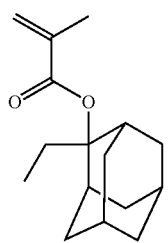
(B)
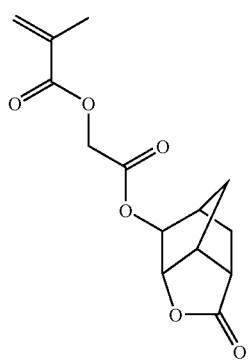
(C)
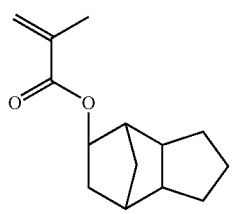
(RA-1)
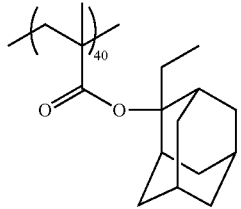
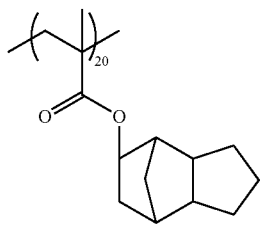
Mw = 10700
Mw/Mn = 1.81
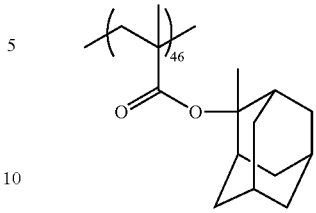
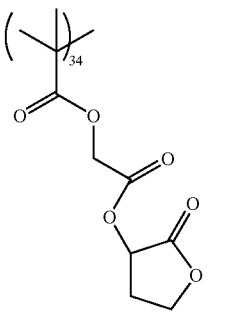 (RA-2)
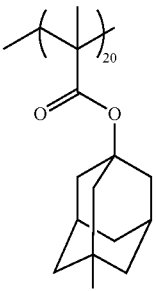
Mw = 9400
Mw/Mn = 1.78
(RA-3)
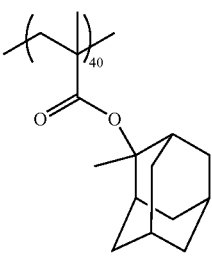
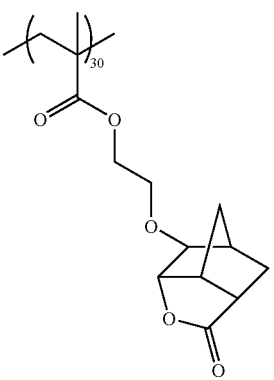
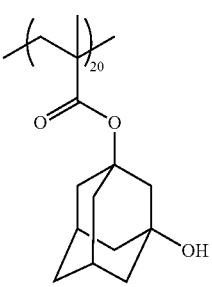
Mw = 13700
Mw/Mn = 1.89

(RA-4)
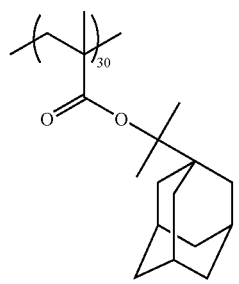 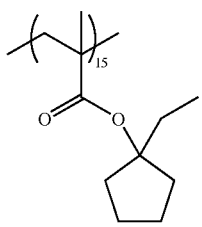
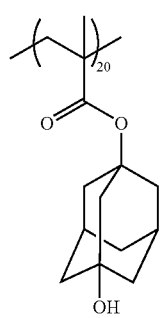 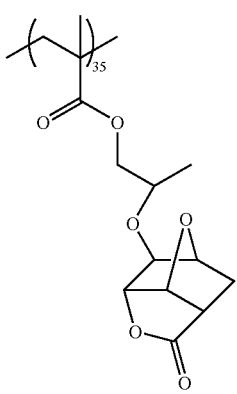
Mw = 7900
Mw/Mn = 1.73
(RA-5)
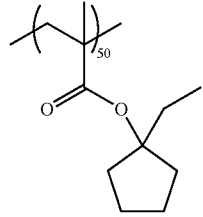 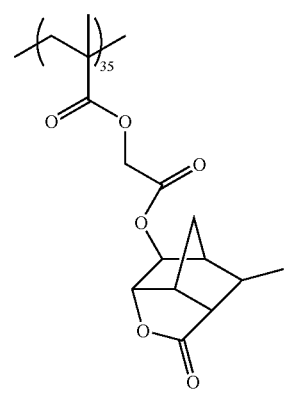
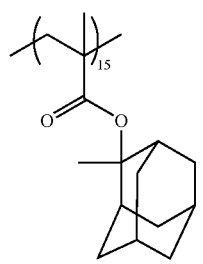
Mw = 8900
Mw/Mn = 1.80
(RA-6)
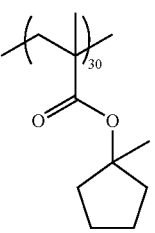 
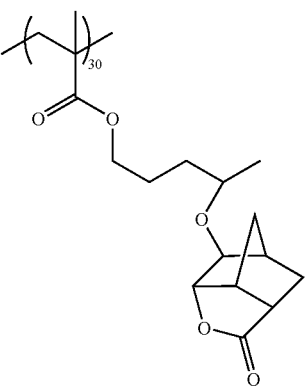 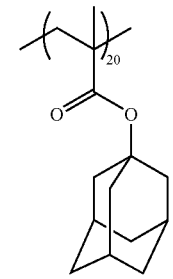
Mw = 10300
Mw/Mn = 1.90
(RA-7)
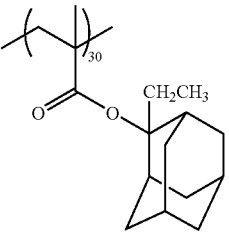 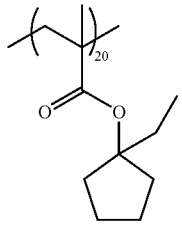
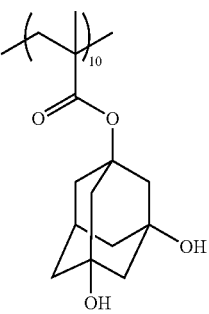

-continued

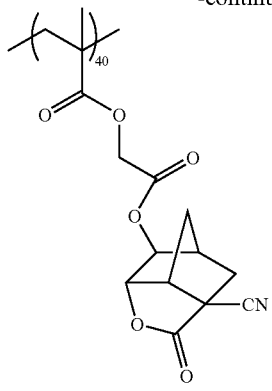

Mw = 9800
Mw/Mn = 1.86

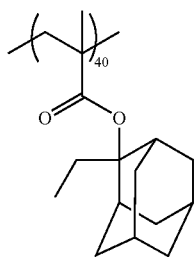

Mw = 9300
Mw/Mn = 1.73

(RA-9)

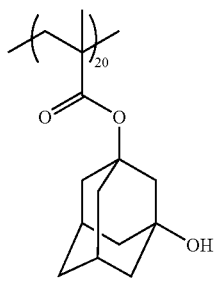

-continued

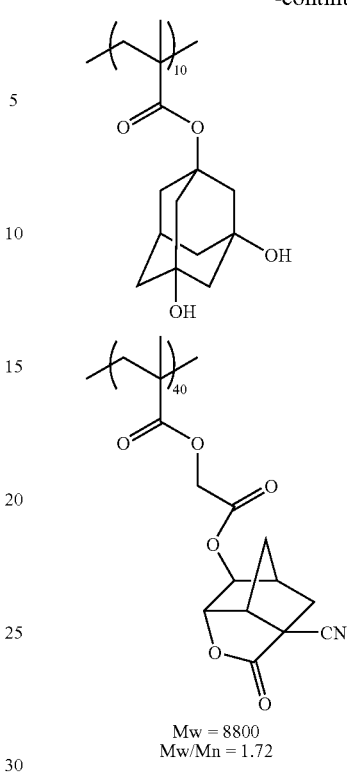

(RA-8)

Mw = 8800
Mw/Mn = 1.72

Here, Resin (RA-8) is a comparative resin not containing a repeating unit represented by formula (3) for use in the present invention.

<Synthesis of Compound D-4>

3 Gram of homoveratrylamine and 7 g of triethylamine were dissolved in 30 ml of tetrahydrofuran, and 16 g of tert-amyl dicarbonate was added slowly under ice cooling. The temperature of the mixed solution was raised to room temperature, and the reaction was allowed to proceed for 6 hours. Subsequently, 100 ml of distilled water was added to the reaction solution, and the resulting solution was extracted with 100 ml of ethyl acetate and concentrated to obtain a crude product. This product was purified by silica gel column chromatography to obtain 2.3 g of Compound D-4.

Other compounds D were synthesized in the same manner by a known method.

Here, D-9 is a comparative compound not having a group capable of leaving by the action of an acid.

Other than above, the denotations in Table 4 below are as follows.

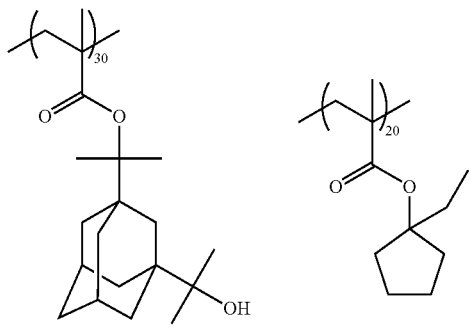

(PAG1)

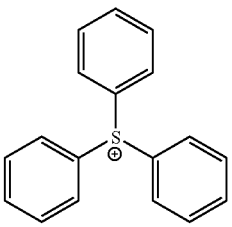 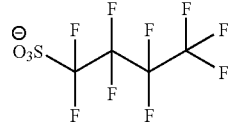

-continued
(PAG2)
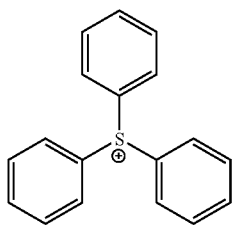
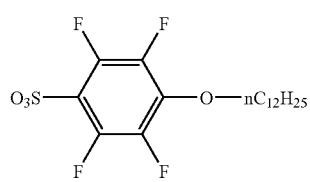
(PAG3)
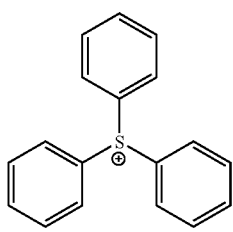
(PAG4)
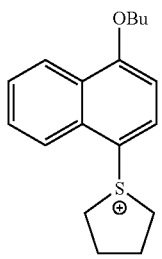
(PAG5)
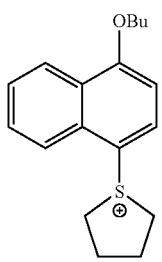
(PAG6)
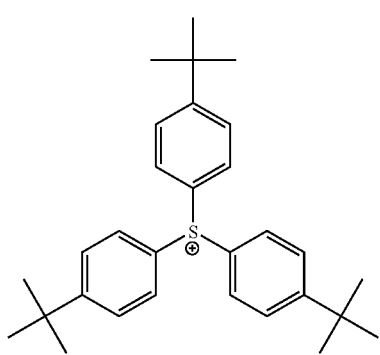
-continued
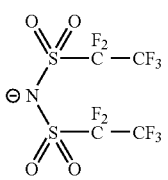
(PAG7)
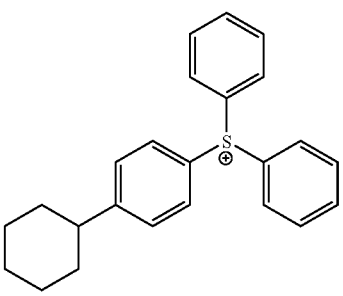 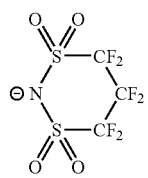
(PAG8)
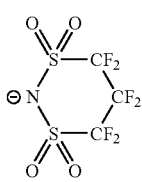 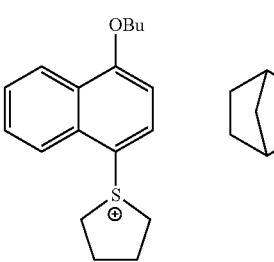
(PAG9)
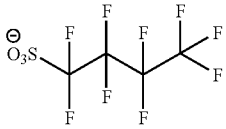
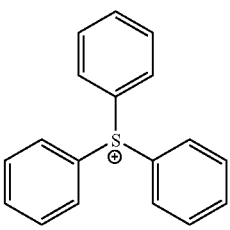
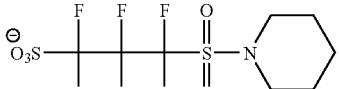
(PAG10)
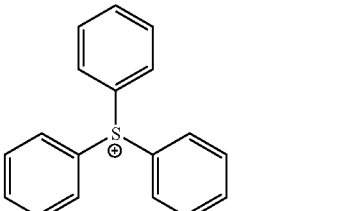
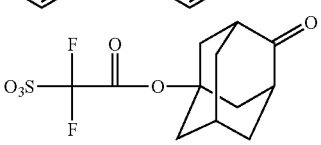

-continued

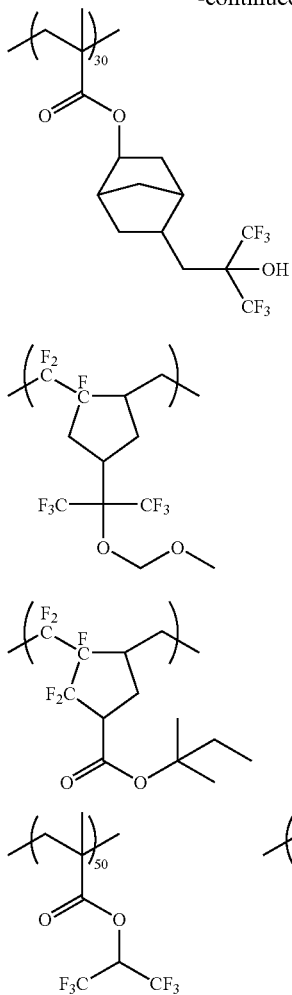

(RB-4)

(RB-5)

(RB-6)

TABLE 3

| | Weight Average Molecular Weight | Polydispersity |
|---|---|---|
| RB-1 | 5500 | 1.4 |
| RB-2 | 6000 | 1.6 |
| RB-3 | 5000 | 1.5 |
| RB-4 | 4000 | 1.6 |
| RB-5 | 5200 | 1.3 |
| RB-6 | 4200 | 1.3 |

[Surfactant]
W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Troysol S-366 (produced by Troy Chemical)
[Solvent]
S1: propylene glycol monomethyl ether acetate (PGMEA)
S2: 2-heptanone
S3: cyclohexanone
S4: γ-butyrolactone
S5: propylene glycol monomethyl ether (PGME)<
<Preparation of Actinic Ray-Sensitive or Radiation-Sensitive Resin Composition>

The components shown in Table 4 below were dissolved in a solvent to prepare a solution having a solid content concentration of 5 mass %, and the obtained solution was filtered through a polyethylene filter having a pore size of 0.03 μm to prepare a composition (positive resist composition). The prepared positive resist composition was evaluated by the following methods, and the results are also shown in Table 4.
<Evaluation of Resist>
(Exposure Condition (1), ArF Dry Exposure)

An organic antireflection film, ARC29A (produced by Nissan Chemical Industries, Ltd.), was coated on a silicon wafer and baked at 205° C. for 60 seconds to form a 78 nm-thick antireflection film. The positive resist composition prepared was coated thereon and baked at 130° C. for 60 seconds to form a 120 nm-thick resist film. The obtained wafer was exposed using an ArF excimer laser scanner (PAS5500/1100, manufactured by ASML, NA: 0.75) through a 6% halftone mask having a 1:1 line-and-space pattern of 75 nm. Thereafter, the wafer was heated at 130° C. for 60 seconds, then developed with an aqueous tetramethylammonium hydroxide solution (2.38 mass %) for 30 seconds, rinsed with pure water and spin-dried to obtain a resist pattern.
[Exposure Latitude]

The exposure dose for reproducing a 1:1 line-and-space mask pattern of 75 nm was defined as an optimal exposure dose, the exposure dose latitude allowing a pattern size of 75 nm±10% when varying the exposure dose was determined, this value was divided by the optimal exposure dose, and the value obtained was expressed in percentage. As the value is larger, the fluctuation of performance due to change in the exposure dose is smaller and the exposure latitude is better.
[Line Edge Roughness]

In the measurement of line edge roughness, an isolated pattern of 75 nm at the optimal exposure dose was observed using a Critical Dimension SEM (S-9260, manufactured by Hitachi Ltd.), and with respect to the range of 5 μm edge in the longitudinal direction of the line pattern, the distance from the reference line where the edge should be present was measured at 50 points. The standard deviation was determined, and 3σ was computed. A smaller value indicates higher performance.
[Development Defect]

Using a defect inspection apparatus, KLA 2360 (trade name), manufactured by KLA Tencor Ltd., measurement was performed in a random mode by setting the pixel size of the defect inspection apparatus to 0.16 μm and the threshold value to 20. Development defects extracted from the difference produced by superposing pixel units with a reference image were detected, and the number of development defects per unit area ($cm^2$) was computed. The sample was rated A when the value was less than 0.5, rated B when from 0.5 to less than 0.8, and rated C when 0.8 or more. A smaller value indicates higher performance.
(Exposure Condition (2), ArF Immersion Exposure)

An organic antireflection film, ARC29A (produced by Nissan Chemical Industries, Ltd.), was coated on a silicon wafer and baked at 205° C. for 60 seconds to form a 98 nm-thick antireflection film. The positive resist composition prepared was coated thereon and baked at 130° C. for 60 seconds to form a 120 nm-thick resist film. The obtained wafer was exposed using an ArF excimer laser immersion scanner (XT1250i, manufactured by ASML, NA: 0.85) through a 6% halftone mask having a 1:1 line-and-space pattern of 65 nm. As for the immersion liquid, ultrapure water was used. Thereafter, the wafer was heated at 130° C. for 60 seconds, developed with an aqueous tetramethylammonium hydroxide solution (2.38 mass %) for 30 seconds, rinsed with pure water and spin-dried to obtain a resist pattern.

[Exposure Latitude]

The exposure dose for reproducing a 1:1 line-and-space mask pattern of 65 nm was defined as an optimal exposure dose, the exposure dose latitude allowing a pattern size of 65 nm±10% when varying the exposure dose was determined, this value was divided by the optimal exposure dose, and the value obtained was expressed in percentage. As the value is larger, the fluctuation of performance due to change in the exposure dose is smaller and the exposure latitude is better.

[Line Edge Roughness]

In the measurement of line edge roughness, an isolated pattern of 65 nm at the optimal exposure was observed using a Critical Dimension SEM (S-9260, manufactured by Hitachi Ltd.), and with respect to the range of 5 μm edge in the longitudinal direction of the line pattern, the distance from the reference line where the edge should be present was measured at 50 points. The standard deviation was determined, and 3σ was computed. A smaller value indicates higher performance.

[Development Defect]

Using a defect inspection apparatus, KLA 2360 (trade name), manufactured by KLA Tencor Ltd., measurement was performed in a random mode by setting the pixel size of the defect inspection apparatus to 0.16 μm and the threshold value to 20. Development defects extracted from the difference produced by superposing pixel units with a reference image were detected, and the number of development defects per unit area ($cm^2$) was computed. The sample was rated A when the value was less than 0.5, rated B when from 0.5 to less than 0.8, and rated C when 0.8 or more. A smaller value indicates higher performance.

TABLE 4

| | Acid Generator (A) | | Acid Generator Use in Combination | | Resin (A) (10 g) | Hydrophobic Resin (C) (amount added) | (Component D) | |
|---|---|---|---|---|---|---|---|---|
| | Kind | Amount Added (g) | Kind | Amount Added (g) | | | Kind | Amount Added (g) |
| Example | | | | | | | | |
| 1 | PAG1 | (0.2) | — | — | RA-1 | — | D-1 | (0.03) |
| 2 | PAG2 | (0.2) | — | — | RA-2 | RB-5 (0.1 g) | D-2 | (0.02) |
| 3 | PAG3 | (0.1) | PAG5 | (0.1) | RA-3 | RB-1 (0.5 g) | D-3/D-9 | (0.02)/(0.02) |
| 4 | PAG10 | (0.2) | — | — | RA-4 | RB-3 (0.6 g) | D-4 | (0.04) |
| 5 | PAG5 | (0.2) | PAG2 | (0.1) | RA-5 | RB-2 (0.3 g) | D-5 | (0.03) |
| 6 | PAG6 | (0.1) | — | — | RA-6 | RB-4 (0.5 g) | D-6 | (0.02) |
| 7 | PAG7 | (0.2) | — | — | RA-1 | — | D-7 | (0.03) |
| 8 | PAG8 | (0.2) | — | — | RA-2 | RB-5 (0.4 g) | D-8/D-1 | (0.02)/(0.01) |
| 9 | PAG9 | (0.2) | — | — | RA-6 | RB-6 (0.05 g) | D-5 | (0.03) |
| 10 | PAG8 | (0.1) | PAG4 | (0.2) | RA-6 | RB-2 (0.3 g) | D-3 | (0.03) |
| 11 | PAG11 | (0.2) | — | — | RA-7 | RB-5 (0.4 g) | D-1 | (0.04) |
| 12 | PAG9 | (0.2) | — | — | RA-6 | RB-5 (0.05 g) | D-10/D-6 | (0.03)/(0.02) |
| 13 | PAG3 | (0.1) | PAG9 | (0.1) | RA-9 | RB-3 (0.4 g) | D-3 | (0.03) |
| Comparative Example | | | | | | | | |
| 1 | PAG5 | (0.2) | — | — | RA-1 | RB-2 (0.3 g) | D-9 | (0.02) |
| 2 | PAG3 | (0.2) | — | — | RA-8 | RB-5 (0.4 g) | D-1 | (0.02) |
| 3 | PAG5 | (0.2) | — | — | RA-8 | RB-1 (0.5 g) | D-9 | (0.02) |

| | Surfactant (100 ppm) | Solvent | | Exposure Condition | Exposure Latitude (%) | Line Edge Roughness (nm) | Development Defect |
|---|---|---|---|---|---|---|---|
| | | Kind | (ratio by mass) | | | | |
| Example | | | | | | | |
| 1 | W-2 | S1/S3 | (60/40) | 1 | 16.0 | 6.2 | A |
| 2 | W-1 | S1/S5 | (70/30) | 2 | 16.8 | 6.3 | A |
| 3 | W-1 | S1/S5 | (80/20) | 2 | 15.9 | 6.9 | A |
| 4 | W-1 | S1/S2 | (80/20) | 2 | 16.3 | 6.5 | A |
| 5 | W-2 | S1/S4 | (95/5) | 2 | 16.2 | 6.5 | A |
| 6 | W-3 | S1/S3 | (60/40) | 2 | 16.8 | 6.8 | A |
| 7 | W-1 | S1/S4 | (95/5) | 1 | 15.8 | 7.0 | A |
| 8 | W-1 | S1/S2 | (80/20) | 2 | 15.9 | 6.4 | A |
| 9 | W-1 | S1/S2 | (80/20) | 2 | 16.1 | 6.2 | A |
| 10 | W-1 | S1/S2 | (80/20) | 2 | 16.0 | 6.3 | A |
| 11 | W-1 | S1/S2 | (80/20) | 2 | 16.8 | 6.2 | A |
| 12 | W-2 | S1/S4 | (95/5) | 2 | 15.8 | 7.1 | A |
| 13 | W-1 | S1/S4 | (95/5) | 2 | 16.9 | 6.1 | A |
| Comparative Example | | | | | | | |
| 1 | W-1 | S1/S3 | (70/30) | 2 | 10.6 | 8.5 | B |
| 2 | W-1 | S1/S3 | (70/30) | 2 | 12.5 | 8.2 | C |
| 3 | W-1 | S1/S3 | (70/30) | 2 | 13.3 | 7.7 | C |

It is seen from the results above that the composition of the present invention has excellent performance.

According to the present invention, an actinic ray-sensitive or radiation-sensitive resin composition exhibiting excellent performance in terms of exposure latitude and line edge roughness even in patterning by immersion exposure when using radiation, particularly ArF excimer laser light, can be provided. The composition of the present invention can be suitably used particularly as a positive chemical-amplification resist composition containing a so-called acid-decomposable resin and a photo-acid generator.

This application is based on Japanese patent application No. JP 2009-008261 filed on Jan. 16, 2009, the entire content of which is hereby incorporated by reference, the same as if set forth at length.

What is claimed is:

1. An actinic ray-sensitive or radiation-sensitive resin composition, comprising:
   (A) a compound capable of generating an acid upon irradiation with an actinic ray or radiation;
   (B) a resin capable of increasing a dissolution rate of the resin (B) in an alkali developer by an action of an acid, the resin (B) containing a repeating unit represented by formula (3); and
   (D) a low molecular compound having a group capable of leaving by an action of an acid:

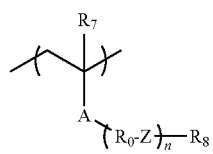
(3)

wherein A represents an ester bond or a group represented by —CONH—;
each $R_0$ independently represents an alkylene group, a cycloalkylene group or a combination thereof, and when a plurality of $R_0$'s are present, the plurality of $R_0$'s are the same or different;
each Z independently represents an ether bond, an ester bond, an amide bond, a urethane bond or a urea bond, and when a plurality of Z's are present, the plurality of Z's are the same or different;
$R_8$ represents a monovalent organic group having a lactone structure;
n is a repetition number of the structure represented by —$R_0$—Z— in the repeating unit represented by formula (3) and represents an integer of 1 to 5; and
$R_7$ represents a hydrogen atom, a halogen atom or an alkyl group;
and further wherein the component (D) is an amine derivative having a group capable of decomposing by the action of an acid on the nitrogen atom.

2. The actinic ray-sensitive or radiation-sensitive resin composition according to claim 1,
wherein (D) the low molecular compound having a group capable of leaving by an action of an acid is a structure represented by formula (A):

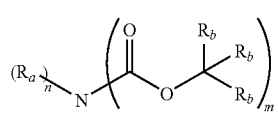
(A)

wherein each Ra independently represents a hydrogen atom, an alkyl group, a cycloalkyl group, an aryl group or an aralkyl group, and when n=2, two Ra's are the same or different and two Ra's may combine with each other to form a divalent heterocyclic hydrocarbon group or a derivative thereof;
each Rb independently represents a hydrogen atom, an alkyl group, a cycloalkyl group, an aryl group or an aralkyl group, provided that in —C(Rb)(Rb)(Rb), when one or more Rb is a hydrogen atom, at least one of the remaining Rb's is a cyclopropyl group or a 1-alkoxyalkyl group;
a plurality of Rb's may combine with each other to form an alicyclic hydrocarbon group, an aromatic hydrocarbon group, a heterocyclic hydrocarbon group or a derivative thereof;
n represents an integer of 0 to 2;
m represents an integer of 1 to 3; and
n+m=3.

3. The actinic ray-sensitive or radiation-sensitive resin composition according to claim 1, which further comprises:
   (C) a hydrophobic resin.

4. The actinic ray-sensitive or radiation-sensitive resin composition according to claim 3,
wherein an amount of the hydrophobic resin (C) is from 0.1 to 10 mass % based on the entire solid content of the actinic ray-sensitive or radiation-sensitive resin composition.

5. The actinic ray-sensitive or radiation-sensitive resin composition according to claim 1,
wherein (A) the compound capable of generating an acid upon irradiation with an actinic ray or radiation is a compound capable of generating an acid represented by formula (I-A), (I-B), (I-C) or (I-D):

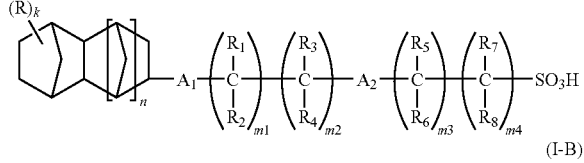
(I-A)

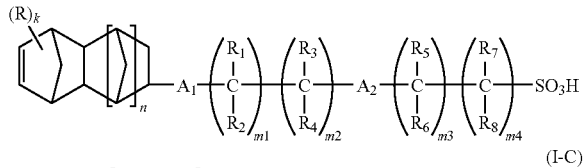
(I-B)

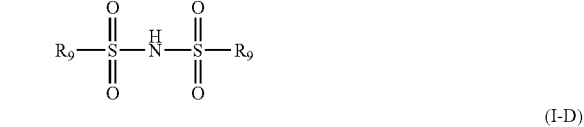
(I-C)

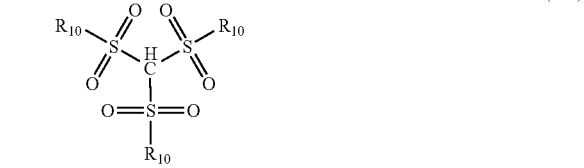
(I-D)

wherein
in formulae (I-A) and (I-B), each of $R_1$ to $R_8$ independently represents a hydrogen atom, an alkyl group, a cycloalkyl group, a halogen atom or a hydroxyl group; each of $A_1$ and $A_2$ represents a divalent linking group or a single bond; R represents a substituent; k represents an integer of 0 to 5; n represents an integer of 0 to 5; each of m1 to m4 independently represents an integer of 0 to 12; and when a plurality of R's are present, two or more R's may combine with each other to form a ring;
in formula (I-C), each $R_9$ independently represents an at least partially fluorinated alkyl group or cycloalkyl group, or two $R_9$'s may combine with each other to form a fluorinated alkylene group; and in formula (I-D), each $R_{10}$ independently represents an at least partially fluorinated alkyl group or cycloalkyl group, or at least two $R_{10}$'s may combine with each other to form a fluorinated alkylene group.

6. The actinic ray-sensitive or radiation-sensitive resin composition according to claim 1,
wherein the repeating unit represented by formula (3) is a repeating unit represented by formula (3-1):

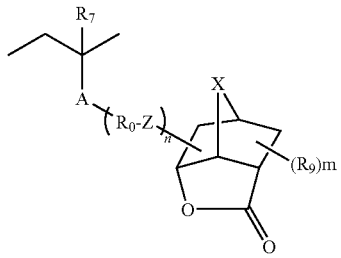

(3-1)

wherein $R_7$, A, $R_0$, Z and n have the same meanings as in formula (3);
$R_9$ represents an alkyl group, a cycloalkyl group, an alkoxycarbonyl group, a cyano group, a hydroxyl group or an alkoxy group, and when a plurality of $R_9$'s are present, the plurality of $R_9$'s are the same or different, and two members thereof may combine with each other to form a ring;
X represents an alkylene group, an oxygen atom or a sulfur atom; and
m represents an integer of 0 to 5.

7. A pattern forming method, comprising:
forming a film by using the actinic ray-sensitive or radiation-sensitive resin composition according to claim 1; and
exposing and developing the film.

8. The pattern forming method according to claim 7,
wherein the exposure is an immersion exposure through an immersion liquid.

9. The pattern forming method according to claim 8,
wherein the film is immersion-exposed through pure water as the immersion liquid.

10. The actinic ray-sensitive or radiation-sensitive resin composition according to claim 1, wherein the resin (B) further contains a repeating unit having a lactone group, other than the repeating unit represented by formula (3).

11. The actinic ray-sensitive or radiation-sensitive resin composition according to claim 1, wherein the resin (B) further contains a repeating unit having a polar group-free alicyclic hydrocarbon structure and not exhibiting acid decomposability.

12. The actinic ray-sensitive or radiation-sensitive resin composition according to claim 3, wherein the hydrophobic resin (C) has (z) a group capable of decomposing by an action of an acid.

13. The actinic ray-sensitive or radiation-sensitive resin composition according to claim 1,
wherein in formula (3), $R_0$ is a methylene group, and Z is an ester bond.

14. The actinic ray-sensitive or radiation-sensitive resin composition according to claim 13,
wherein in formula (3), n is 1.

15. The actinic ray-sensitive or radiation-sensitive resin composition according to claim 1,
wherein in formula (3), $R_8$ is a monovalent organic group containing a cyanolactone structure.

16. The actinic ray-sensitive or radiation-sensitive resin composition according to claim 1, wherein (A) the compound capable of generating an acid upon irradiation with an actinic ray or radiation is a compound represented by the following formula (ZI):

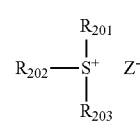

ZI in formula (ZI), each of $R_{201}$, $R_{202}$ and $R_{203}$ independently represents an organic group, two members out of $R_{201}$ to $R_{203}$ may combine to form a ring structure, and the ring may contain an oxygen atom, a sulfur atom, an ester bond, an amide bond or a carbonyl group; and
$Z^-$ represents a non-nucleophilic anion represented by the following formula (Xa):

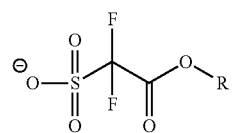

(Xa)

in formula (Xa), R represents a hydrogen atom or an organic group.

17. The actinic ray-sensitive or radiation-sensitive resin composition according to claim 1,
wherein (A) the compound capable of generating an acid upon irradiation with an actinic ray or radiation is a compound represented by the following formula (ZI):

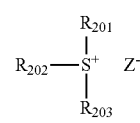

ZI in formula (ZI), each of $R_{201}$, $R_{202}$ and $R_{203}$ independently represents an organic group, two members out of $R_{201}$ to $R_{203}$ combine to form a ring structure, and the ring may contain an oxygen atom, a sulfur atom, an ester bond, an amide bond or a carbonyl group; and
$Z^-$ represents a non-nucleophilic anion.

18. The actinic ray-sensitive or radiation-sensitive resin composition according to claim 1, wherein the resin (B) comprises a pair of acid-decomposable repeating units selected from the group consisting of the following twenty-two pairs of acid-decomposable repeating units:

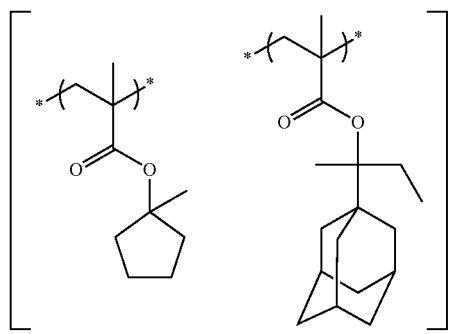

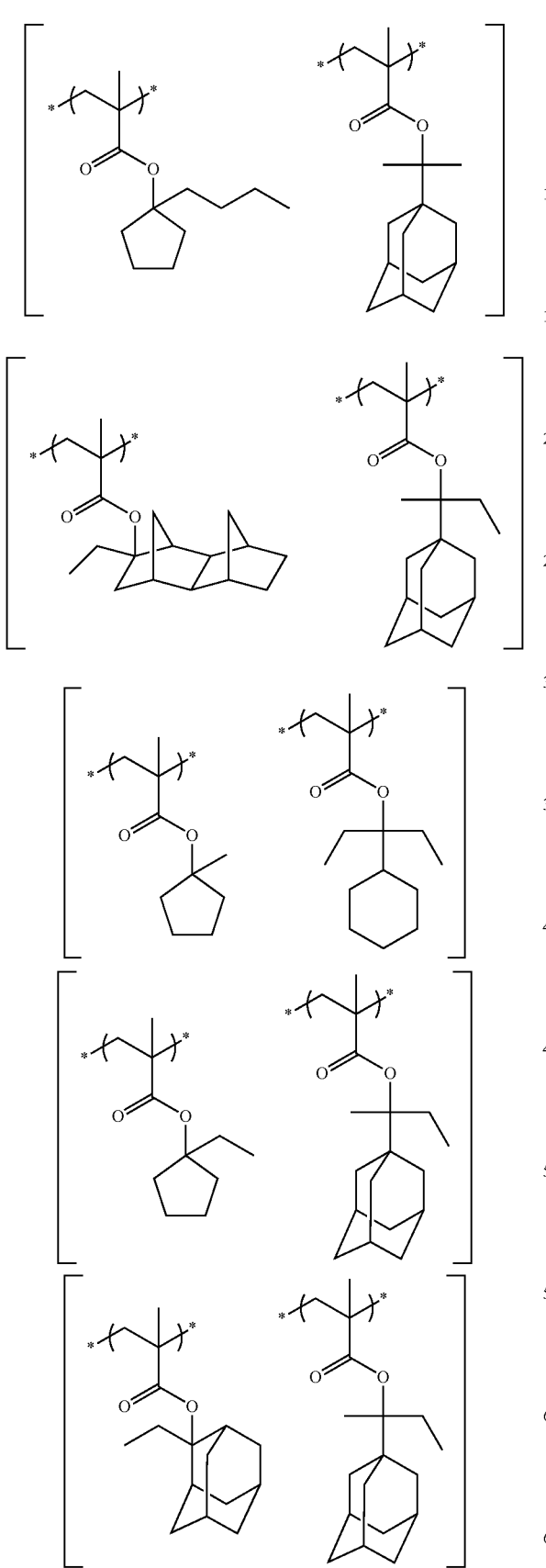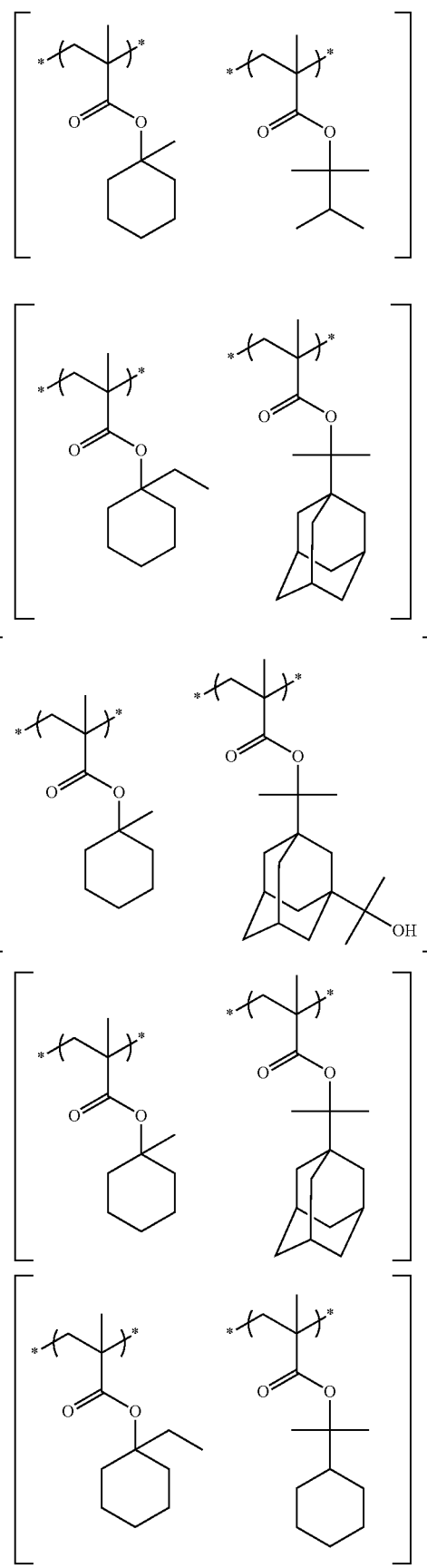

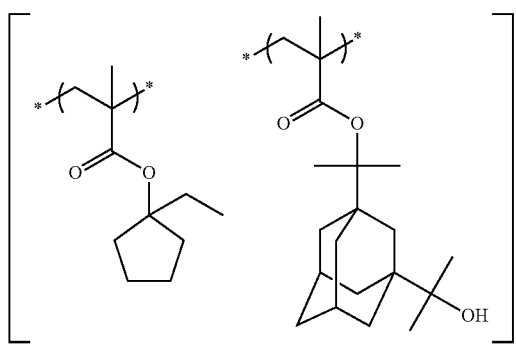
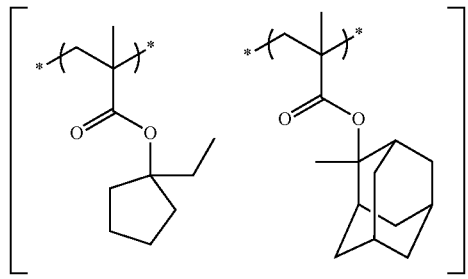
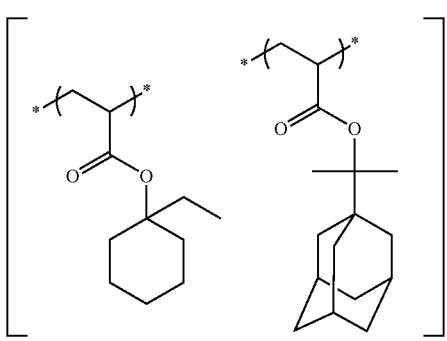
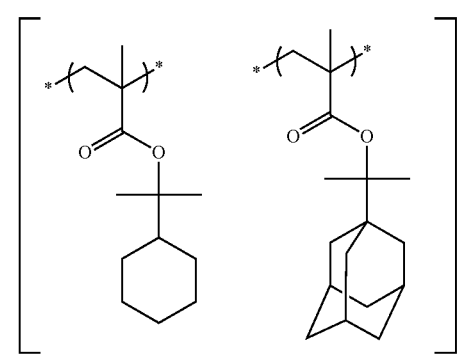
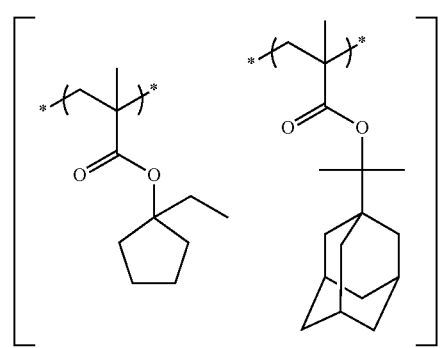
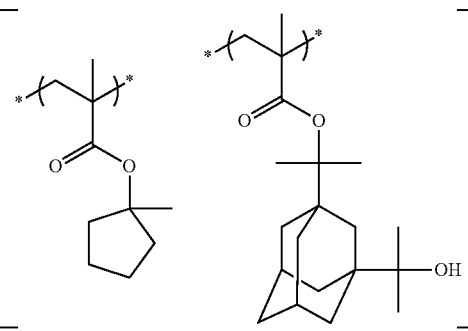
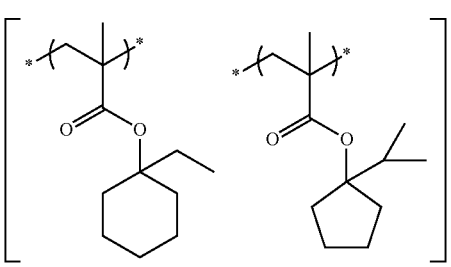
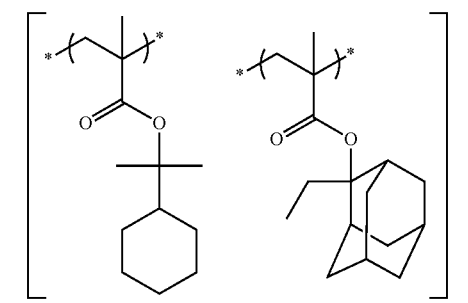
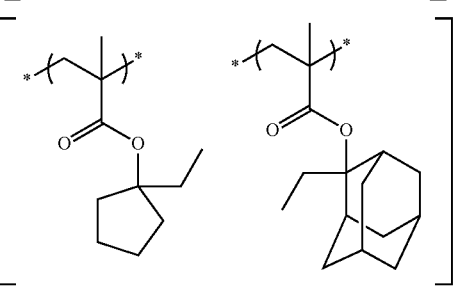
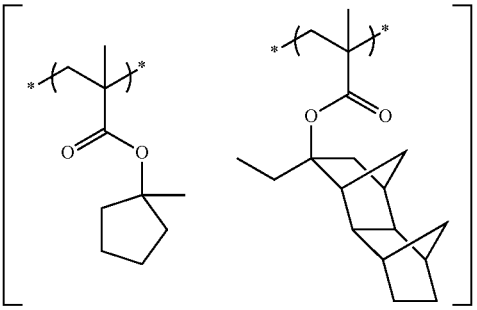

-continued
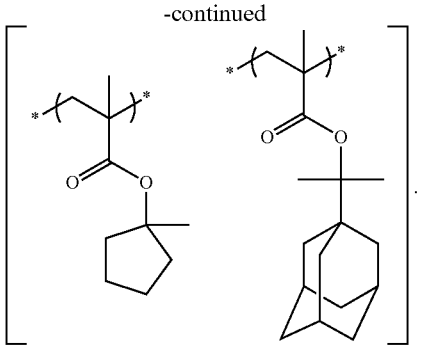
19. The actinic ray-sensitive or radiation-sensitive resin composition according to claim 1, wherein the resin (B) does not contain a fluorine atom.
20. The actinic ray-sensitive or radiation-sensitive resin composition according to claim 18, wherein the resin (B) does not contain a fluorine atom.
* * * * *